US011894456B2

(12) United States Patent
Yamamoto et al.

(10) Patent No.: US 11,894,456 B2
(45) Date of Patent: Feb. 6, 2024

(54) SEMICONDUCTOR DEVICE, BATTERY PROTECTION CIRCUIT, AND POWER MANAGEMENT CIRCUIT

(71) Applicant: Nuvoton Technology Corporation Japan, Kyoto (JP)

(72) Inventors: Kouki Yamamoto, Kyoto (JP); Haruhisa Takata, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/330,053

(22) Filed: Jun. 6, 2023

(65) Prior Publication Data

US 2023/0317841 A1   Oct. 5, 2023

Related U.S. Application Data

(63) Continuation of application No. 18/181,332, filed on Mar. 9, 2023, which is a continuation of application No. PCT/JP2022/014447, filed on Mar. 25, 2022.

(Continued)

(51) Int. Cl.
*H01L 29/78* (2006.01)
*H02J 7/00* (2006.01)
(Continued)

(52) U.S. Cl.
CPC ........ *H01L 29/7802* (2013.01); *H01L 27/088* (2013.01); *H01L 29/41725* (2013.01); *H01L 29/4232* (2013.01); *H02J 7/0029* (2013.01)

(58) Field of Classification Search
CPC ............... H01L 29/7802; H01L 27/088; H01L 29/4232
See application file for complete search history.

(56) References Cited

U.S. PATENT DOCUMENTS 5,682,050 A * 10/1997 Williams ............ H01L 29/7802
327/434
7,800,167 B2 * 9/2010 Kitamura ............ H01L 29/7827
257/329
(Continued)

FOREIGN PATENT DOCUMENTS

EP          0323843 A2    7/1989
JP       H01-179456 A    7/1989
(Continued)

OTHER PUBLICATIONS

International Preliminary Report on Patentability dated Apr. 18, 2023 issued in International Patent Application No. PCT/JP2022/014447, with full English translation.

(Continued)

*Primary Examiner* — Mounir S Amer
*Assistant Examiner* — Alexander Belousov
(74) *Attorney, Agent, or Firm* — Rimon P.C.

(57) ABSTRACT

A face-down mountable chip-size package semiconductor device includes a semiconductor layer and N (N is an integer greater than or equal to three) vertical MOS transistors in the semiconductor layer. Each of the N vertical MOS transistors includes, on an upper surface of the semiconductor layer, a gate pad electrically connected to a gate electrode of the vertical MOS transistor and one or more source pads electrically connected to a source electrode of the vertical MOS transistor. The semiconductor layer includes a semiconductor substrate. The semiconductor substrate functions as a common drain region for the N vertical MOS transistors. For each of the N vertical MOS transistors, a surface area of the vertical MOS transistor in a plan view of the semiconductor layer increases with an increase in a maximum specified current of the vertical MOS transistor.

15 Claims, 54 Drawing Sheets

Related U.S. Application Data

(60) Provisional application No. 63/167,328, filed on Mar. 29, 2021.

(51) Int. Cl.
  H01L 29/423 (2006.01)
  H01L 29/417 (2006.01)
  H01L 27/088 (2006.01)

(56) References Cited

U.S. PATENT DOCUMENTS

| | | | | |
|---|---|---|---|---|
| 7,843,044 B2* | 11/2010 | Takahashi | ............ | H01L 29/7813 257/673 |
| 7,884,454 B2* | 2/2011 | Lu | ................ | H01L 21/823487 257/E23.079 |
| 8,049,315 B2* | 11/2011 | Lu | ................ | H01L 21/823487 257/784 |
| 8,344,519 B2* | 1/2013 | Lu | ..................... | H01L 23/49531 257/734 |
| 8,378,418 B2* | 2/2013 | Kitamura | ............ | H01L 27/0629 257/329 |
| 8,441,065 B2* | 5/2013 | Suzuki | ............ | H01L 21/82345 257/330 |
| 9,270,128 B2* | 2/2016 | Tonomura | ............ | H01L 29/7815 |
| 9,324,625 B2* | 4/2016 | Ahlers | ................ | H01L 23/051 |
| 9,589,948 B2* | 3/2017 | Kitajima | ................ | H03K 17/08 |
| 10,283,981 B2* | 5/2019 | Abe | ..................... | H02J 7/0029 |
| 10,490,659 B2* | 11/2019 | Yanagida | ............. | H01L 27/088 |
| 10,777,475 B2* | 9/2020 | Fukuchi | ................ | H01L 24/96 |
| 10,790,683 B2* | 9/2020 | Mochizuki | ............ | H01L 27/088 |
| 11,171,234 B2* | 11/2021 | Okawa | ................. | H01L 27/088 |
| 11,205,912 B2* | 12/2021 | Osada | ..................... | H01L 27/04 |
| 11,227,925 B2* | 1/2022 | Tang | .................. | H01L 27/0266 |
| 11,282,834 B2* | 3/2022 | Yoshida | ................ | H01L 23/528 |
| 11,394,228 B2* | 7/2022 | Seol | ........................ | H01M 10/44 |
| 11,581,369 B2* | 2/2023 | Leomant | ............ | H01L 21/76877 |
| 11,695,043 B2* | 7/2023 | Kobayashi | ............ | H01L 27/0266 257/334 |
| 11,715,795 B2* | 8/2023 | Okawa | ................. | H01L 27/088 257/330 |
| 2006/0263988 A1* | 11/2006 | Takahashi | ............ | H01L 29/7813 257/E27.06 |
| 2007/0274110 A1* | 11/2007 | Kitamura | ............. | H01M 10/48 363/62 |
| 2009/0008758 A1* | 1/2009 | Lu | ..................... | H01L 23/49575 257/676 |
| 2010/0315751 A1* | 12/2010 | Suzuki | ................ | H01L 29/7835 257/334 |
| 2010/0330398 A1* | 12/2010 | Kitamura | ............ | H01L 29/4238 429/7 |
| 2011/0108998 A1* | 5/2011 | Lu | ..................... | H01L 23/4952 257/E23.141 |
| 2011/0278709 A1* | 11/2011 | Lu | ........................ | H01L 23/58 257/676 |
| 2013/0320454 A1* | 12/2013 | Suzuki | ................ | H01L 29/0692 438/197 |
| 2013/0320915 A1* | 12/2013 | Ahlers | ................ | H01L 29/7802 257/E29.262 |
| 2014/0125289 A1* | 5/2014 | Tonomura | ............. | H01L 27/088 320/134 |
| 2015/0129958 A1* | 5/2015 | Nita | ..................... | H01L 29/4236 257/334 |
| 2015/0287712 A1* | 10/2015 | Kitajima | ............. | H01L 27/0248 327/109 |
| 2016/0064777 A1* | 3/2016 | Suzuki | ................ | H01L 23/3114 257/329 |
| 2016/0254809 A1* | 9/2016 | Mochizuki | ............ | H01M 10/44 320/112 |
| 2017/0194294 A1* | 7/2017 | Yanagida | ............... | H01L 27/088 |
| 2018/0013298 A1* | 1/2018 | Abe | ..................... | H01L 27/0266 |
| 2018/0301554 A1* | 10/2018 | Tang | .................. | H01L 29/4236 |
| 2018/0331005 A1* | 11/2018 | Fukuchi | ............. | H03K 17/6874 |
| 2019/0097439 A1* | 3/2019 | Mochizuki | ............ | H01M 10/44 |
| 2019/0229194 A1* | 7/2019 | Yoshida | ................ | H01L 24/16 |
| 2019/0319126 A1* | 10/2019 | Matsushima | ........ | H01L 21/6835 |
| 2019/0356138 A1* | 11/2019 | Seol | ..................... | H02J 7/0031 |
| 2020/0075762 A1* | 3/2020 | Kobayashi | ............ | H01L 21/3081 |
| 2020/0153264 A1* | 5/2020 | Osada | ..................... | G06N 3/04 |
| 2020/0365729 A1* | 11/2020 | Okawa | ............ | H01L 21/823487 |
| 2020/0395479 A1* | 12/2020 | Fujioka | ................ | H01L 29/7813 |
| 2021/0183948 A1* | 6/2021 | Leomant | ............ | H01L 29/66666 |
| 2021/0233905 A1* | 7/2021 | Yoshida | ............. | H01L 27/0629 |
| 2022/0006309 A1* | 1/2022 | Takahashi | ................ | H01L 27/06 |
| 2022/0029016 A1* | 1/2022 | Okawa | ................ | H01L 29/7808 |
| 2022/0094177 A1* | 3/2022 | Okamoto | ............. | H01M 10/48 |
| 2022/0131392 A1* | 4/2022 | Isa | ........................ | H01M 10/42 |
| 2023/0100524 A1* | 3/2023 | Ikeda | ................. | H01M 50/574 429/7 |
| 2023/0215940 A1* | 7/2023 | Yamamoto | .......... | H01L 29/7802 257/213 |

FOREIGN PATENT DOCUMENTS

| | | |
|---|---|---|
| JP | 2013-247309 A | 12/2013 |
| JP | 2015-095550 A | 5/2015 |
| WO | 2020/129786 A1 | 6/2020 |

OTHER PUBLICATIONS

International Preliminary Report on Patentability dated Apr. 18, 2023 issued in International Patent Application No. PCT/JP2022/014447, with partial English translation.

International Search Report dated Jun. 21, 2022 issued in International Patent Application No. PCT/JP2022/014447, with English translation.

Written Opinion of the International Searching Authority dated Jun. 21, 2022 issued in International Patent Application No. PCT/JP2022/014447, with English translation.

Decision to Grant a Patent dated Mar. 7, 2023 issued in Japanese Patent Application No. 2022-570609, with English translation.

* cited by examiner

| Device | Count |
|---|---|
| Semiconductor device 1 | 2 |
| Semiconductor switching device 9 | 4 |
| Total | 6 |

| Device | Count |
|---|---|
| Semiconductor device 1 | 2 |
| Semiconductor switching device 9 | 4 |
| Total | 6 |

SEMICONDUCTOR DEVICE, BATTERY PROTECTION CIRCUIT, AND POWER MANAGEMENT CIRCUIT

CROSS REFERENCE TO RELATED APPLICATIONS

This is a Continuation of U.S. patent application Ser. No. 18/181,332, filed on Mar. 9, 2023, which is a Continuation of PCT International Application No. PCT/JP2022/014447, filed on Mar. 25, 2022, designating the United States of America, which is based on and claims priority of U.S. Provisional Patent Application No. 63/167,328, filed on Mar. 29, 2021. The entire disclosures of the above-identified applications, including the specifications, drawings, and claims are incorporated herein by reference in their entirety.

FIELD

The present disclosure relates to semiconductor devices, including vertical transistors, as well as battery protection circuits and power management circuits. As used herein, the term "vertical transistor" refers to vertical metal oxide semiconductor field effect transistors (vertical MOSFETs), vertical insulated gate bipolar transistors (vertical IGBTs), vertical bipolar junction transistors (vertical BJTs), etc.

BACKGROUND

A semiconductor device including a plurality of vertical MOS transistors that share a common drain region is conventionally known (see, for example, PTL 1).

CITATION LIST

Patent Literature

PTL 1: Japanese Unexamined Patent Application Publication No. H1-179456

SUMMARY

Technical Problem

In semiconductor devices including a plurality of vertical MOS transistors that share a common drain region, it is preferable to inhibit localized heat generation.

An object of the present disclosure is to therefore provide a semiconductor device, etc., that can inhibit localized heat generation.

Solution to Problem

A semiconductor device according to one aspect of the present disclosure is a semiconductor device of chip-size package type that is face-down mountable, and includes: a semiconductor layer; and N vertical MOS transistors in the semiconductor layer, where N is an integer greater than or equal to three. Each of the N vertical MOS transistors includes, on an upper surface of the semiconductor layer, a gate pad electrically connected to a gate electrode of the vertical MOS transistor and one or more source pads electrically connected to a source electrode of the vertical MOS transistor. The semiconductor layer includes a semiconductor substrate. The semiconductor substrate functions as a common drain region for the N vertical MOS transistors. For each of the N vertical MOS transistors, a surface area of the vertical MOS transistor in a plan view of the semiconductor layer increases with an increase in a maximum specified current of the vertical MOS transistor.

A battery protection circuit according to one aspect of the present disclosure includes: the semiconductor device described above; a first terminal connected to the one or more source pads of a single terminal-connected vertical MOS transistor among the N vertical MOS transistors included in the semiconductor device; and N−1 battery cells each including a first electrode connected to the one or more source pads of a different one of N−1 vertical MOS transistors among the N vertical MOS transistors included in the semiconductor device excluding the single terminal-connected vertical MOS transistor, the first electrode being one of a positive electrode or a negative electrode. Each of the first electrodes included in the N−1 battery cells has a same polarity.

A battery protection circuit according to one aspect of the present disclosure includes: a first semiconductor device that is the semiconductor device described above; a second semiconductor device that is the semiconductor device described above, the N vertical MOS transistors of which total three; N−1 battery cells connected in a series connection; a first terminal connected to the one or more source pads of a first terminal-connected vertical MOS transistor which is a single vertical MOS transistor among the N vertical MOS transistors included in the first semiconductor device, and to the one or more source pads of a second terminal-connected vertical MOS transistor which is a single vertical MOS transistor among the three vertical MOS transistors included in the second semiconductor device; a second terminal connected to negative electrodes of the N−1 battery cells; and a third terminal connected to a positive electrode of a battery cell, among the N−1 battery cells, located at a positive electrode end of the series connection. Each positive electrode of the N−1 battery cells is connected to the one or more source pads of a different one of N−1 vertical MOS transistors among the N vertical MOS transistors included in the first semiconductor device excluding the first terminal-connected vertical MOS transistor. Among the N−1 battery cells, a positive electrode of a first battery cell located at a negative electrode end of the series connection is connected to the one or more source pads of one of two vertical MOS transistors among the three vertical MOS transistors included the second semiconductor device excluding the second terminal-connected vertical MOS transistor, and a negative electrode of a second battery cell located next to the first battery cell in the series connection is connected to the one or more source pads of an other of the two vertical MOS transistors among the three vertical MOS transistors included the second semiconductor device excluding the second terminal-connected vertical MOS transistor. The first battery cell and the second battery cell are connected in series via the second semiconductor device.

A battery protection circuit according to one aspect of the present disclosure includes: a first semiconductor device that is the semiconductor device described above; a second semiconductor device that is the semiconductor device described above, the N vertical MOS transistors of which total three; N battery cells connected in a series connection; a first terminal connected to the one or more source pads of a first terminal-connected vertical MOS transistor which is a single vertical MOS transistor among the N vertical MOS transistors included in the first semiconductor device, and to the one or more source pads of a second terminal-connected vertical MOS transistor which is a single vertical MOS transistor among the three vertical MOS transistors included in the second semiconductor device; a second terminal connected to negative electrodes of the N battery cells; and a third terminal connected to a positive electrode of a battery cell, among the N battery cells, located at a positive electrode end of the series connection. Each positive electrode of N−1 battery cells among the N battery cells excluding a first battery cell located at a negative electrode end of the series connection is connected to the one or more source pads of a different one of N−1 vertical MOS transistors among the N vertical MOS transistors included in the first semiconductor device excluding the first terminal-connected vertical MOS transistor. Among the N battery cells, a positive electrode of the first battery cell located at the negative electrode end of the series connection is connected to the one or more source pads of one of two vertical MOS transistors among the three vertical MOS transistors included the second semiconductor device excluding the second terminal-connected vertical MOS transistor, and a negative electrode of a second battery cell, among the N battery cells, located next to the first battery cell in the series connection is connected to the one or more source pads of an other of the two vertical MOS transistors among the three vertical MOS transistors included the second semiconductor device excluding the second terminal-connected vertical MOS transistor. The first battery cell and the second battery cell are connected in series via the second semiconductor device.

A battery protection circuit according to one aspect of the present disclosure includes: a first semiconductor device that is the semiconductor device described above, the N vertical MOS transistors of which total three, the at least one specific vertical MOS transistor of which totals one; a second semiconductor device that is the semiconductor device described above, the N vertical MOS transistors of which total three, the at least one specific vertical MOS transistor of which totals one; a first terminal connected to the single source pad of the one specific vertical MOS transistor included in the first semiconductor device; a second terminal connected to the one or more source pads of one of two vertical MOS transistors among the three vertical MOS transistors included in the first semiconductor device excluding the one specific vertical MOS transistor; a third terminal connected to the one or more source pads of an other of the two vertical MOS transistors among the three vertical MOS transistors included in the first semiconductor device excluding the one specific vertical MOS transistor; a fourth terminal connected to the single source pad of the one specific vertical MOS transistor included in the second semiconductor device; a fifth terminal connected to the one or more source pads of one of two vertical MOS transistors among the three vertical MOS transistors included in the second semiconductor device excluding the one specific vertical MOS transistor; and a sixth terminal connected to the one or more source pads of an other of the two vertical MOS transistors among the three vertical MOS transistors included in the second semiconductor device excluding the one specific vertical MOS transistor. The third terminal is for connecting to one or more positive electrodes of one or more battery cells. The sixth terminal is for connecting to one or more negative electrodes of the one or more battery cells. The first terminal, the second terminal, the fourth terminal, and the fifth terminal are for connecting to a power management circuit. Through the second terminal and the fifth terminal, the power management circuit applies charging current to the one or more battery cells when charging, and receives discharging current from the one or more battery cells when discharging.

A battery protection circuit according to one aspect of the present disclosure includes: the semiconductor device described above, the N vertical MOS transistors of which total three, the at least one specific vertical MOS transistor of which totals one; a first terminal connected to the single source pad of the one specific vertical MOS transistor included in the semiconductor device and to the one or more source pads of one of two vertical MOS transistors among the three vertical MOS transistors included in the semiconductor device excluding the one specific vertical MOS transistor; a second terminal connected to the one or more source pads of an other of the two vertical MOS transistors among the three vertical MOS transistors included in the semiconductor device excluding the one specific vertical MOS transistor; a third terminal; and a fourth terminal. The first terminal is for connecting to one or more positive electrodes of one or more battery cells. The third terminal is for connecting to one or more negative electrodes of the one or more battery cells. The second terminal and the fourth terminal are for connecting to a power management circuit. Through the second terminal and the fourth terminal, the power management circuit applies charging current to the one or more battery cells when charging, and receives discharging current from the one or more battery cells when discharging.

A battery protection circuit according to one aspect of the present disclosure includes: a first semiconductor device that is the semiconductor device described above, the N vertical MOS transistors of which total X+Y, where X is an integer greater than or equal to one and Y is an integer greater than or equal to two; a second semiconductor device that is the semiconductor device described above, the N vertical MOS transistors of which total 1+Y; X first terminals each connected to the one or more source pads of a different one of X vertical MOS transistors among the X+Y vertical MOS transistors included in the first semiconductor device; Y second terminals each connected to the one or more source pads of a different one of Y vertical MOS transistors among the X+Y vertical MOS transistors included in the first semiconductor device excluding the X vertical MOS transistors; a third terminal connected to the one or more source pads of a single vertical MOS transistor among the 1+Y vertical MOS transistors included in the second semiconductor device; and Y fourth terminals each connected to the one or more source pads of a different one of Y vertical MOS transistors among the 1+Y vertical MOS transistors included in the second semiconductor device excluding the single vertical MOS transistor. The X first terminals are for connecting to respective positive electrodes of X battery cells. The third terminal is for connecting to one or more negative electrodes of the X battery cells. The Y second terminals and the Y fourth terminals are for connecting to respective Y power management circuits. Through one of the Y second terminals and one of the Y fourth terminals, each of the Y power management circuits applies charging current to at least one battery cell among the X battery cells when charging, and receives discharging current from the at least one battery cell among the X battery cells when discharging.

A power management circuit according to one aspect of the present disclosure includes: the semiconductor device described above, the N vertical MOS transistors of which total X+Y, where X is an integer greater than or equal to one and Y is an integer greater than or equal to two; X terminals each connected to the one or more source pads of a different one of X vertical MOS transistors among the X+Y vertical MOS transistors included in the semiconductor device; and Y circuits each connected to the one or more source pads of a different one of Y vertical MOS transistors among the X+Y vertical MOS transistors included in the semiconductor device excluding the X vertical MOS transistors. The X terminals are for connecting to respective X external circuits. Each of the Y circuits has a separate power supply.

A semiconductor device according to one aspect of the present disclosure is a semiconductor device of chip-size package type that is face-down mountable, and includes: a semiconductor layer; and N vertical transistors in the semiconductor layer, where N is an integer greater than or equal to three. Each of the N vertical transistors includes, on an upper surface of the semiconductor layer, a control pad electrically connected to a control electrode that controls conduction of the vertical transistor and one or more external connection pads electrically connected to an external connection electrode through which the vertical transistor receives current from outside or outputs current outside. The semiconductor layer includes a semiconductor substrate. The semiconductor substrate includes one main surface on which the N vertical transistors are formed and an other main surface facing away from the one main surface, and the semiconductor device further includes a common electrode common to the N vertical transistors on the other main surface side of the semiconductor substrate. For each of the N vertical transistors, a surface area of the vertical transistor in a plan view of the semiconductor layer increases with an increase in a maximum specified current of the vertical transistor.

Advantageous Effects

The semiconductor device, etc., according to one aspect of the present disclosure makes it possible to provide a semiconductor device, etc., capable of inhibiting localized heat generation.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
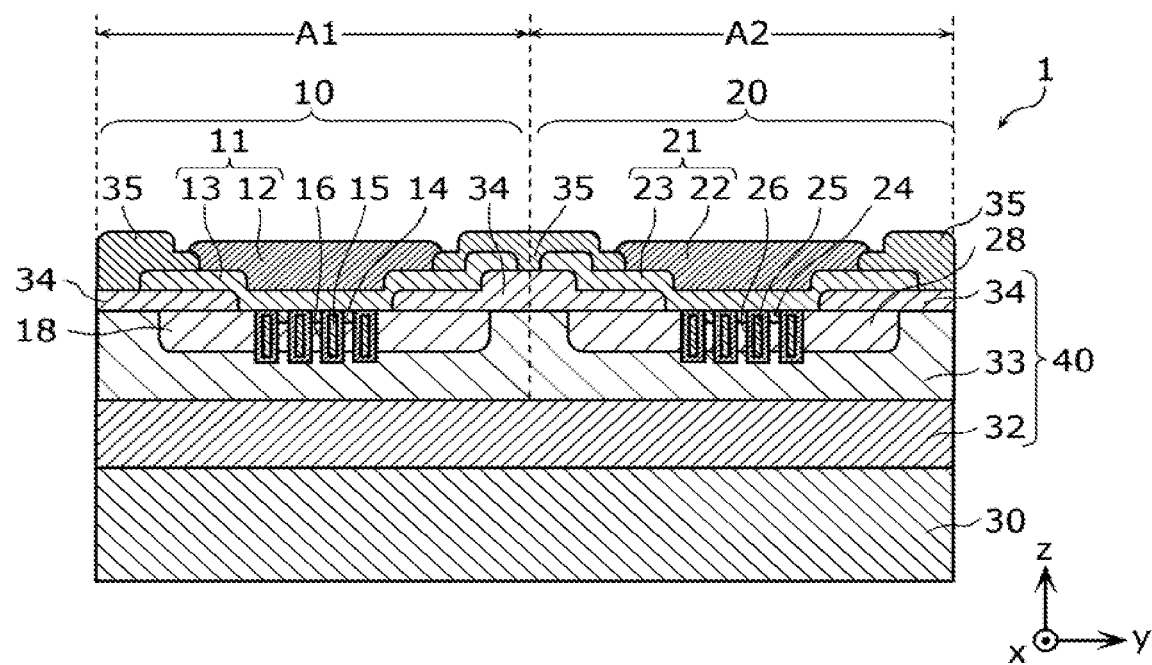
FIG. 1 is a cross-sectional view illustrating one example of the structure of a semiconductor device according to Embodiment 1.

Circumstances Leading to One Aspect of the Present Disclosure

The inventors are developing semiconductor devices that include a plurality of vertical MOS transistors that share a common drain region and have mutually different maximum specified currents.

In this development, the inventors noticed that when the respective maximum specified currents are applied to the plurality of vertical MOS transistors whose maximum specified currents are mutually different, if their conduction resistance are equal, the localized heat generation in the region of a vertical MOS transistor with a higher maximum specified current is greater than the localized heat generation in the region of a vertical MOS transistor with a lower maximum specified current. The inventors confirmed that this causes an undesirable phenomenon of localized heat generation in the semiconductor device.

In view of this, the inventors conducted a series of experiments and examinations to realize a semiconductor device that includes a plurality of vertical MOS transistors with a common drain region and can inhibit localized heat generation.

In general, the amount of heat generated by a transistor, whose conduction resistance is R [$\Omega$], when current I [A] flows through the transistor is proportional to $R \times I^2$.

The inventors have therefore discovered that in order to inhibit localized heat generation in a semiconductor device including a plurality of vertical MOS transistors that share a common drain region, it is effective to reduce the conduction resistance of each vertical MOS transistor in accordance with its maximum specified current, more so the larger the maximum specified current is.

Based on this knowledge, the inventors conducted a series of further examinations. As a result, the inventors arrived at the semiconductor device and the like according to the following present disclosure.

A semiconductor device according to one aspect of the present disclosure is a semiconductor device of chip-size package type that is face-down mountable, and includes: a semiconductor layer; and N vertical metal oxide semiconductor (MOS) transistors in the semiconductor layer, where N is an integer greater than or equal to three. Each of the N vertical MOS transistors includes, on an upper surface of the semiconductor layer, a gate pad electrically connected to a gate electrode of the vertical MOS transistor and one or more source pads electrically connected to a source electrode of the vertical MOS transistor. The semiconductor layer includes a semiconductor substrate. The semiconductor substrate functions as a common drain region for the N vertical MOS transistors. For each of the N vertical MOS transistors, a surface area of the vertical MOS transistor in a plan view of the semiconductor layer increases with an increase in a maximum specified current of the vertical MOS transistor.

According to the semiconductor device configured as described above, the greater the maximum specified current of the vertical MOS transistor is, the greater the surface area is in a plan view of the semiconductor layer.

In general, the conduction resistance of the vertical MOS transistor is inversely proportional to the surface area in a plan view of the semiconductor layer. Accordingly, in the semiconductor device configured as described above, the greater the maximum specified current of the vertical MOS transistor is, the less the conduction resistance of the vertical MOS transistor is.

Thus, according to the semiconductor device configured as described above, it possible to provide a semiconductor device that can inhibit localized heat generation.

For each of the N vertical MOS transistors, the surface area of the vertical MOS transistor in a plan view of the semiconductor layer may be proportional to the square of the maximum specified current of the vertical MOS transistor.

For each of the N vertical MOS transistors, the conduction resistance when the maximum specified current flows may be inversely proportional to the square of the maximum specified current of the vertical MOS transistor.

One of the N vertical MOS transistors may be a specific vertical MOS transistor whose maximum specified current is equal to the sum of maximum specified currents of K vertical MOS transistors among the N vertical MOS transistors, where K is an integer greater than or equal to two and less than or equal to N−1.

The N vertical MOS transistors may include at least one specific vertical MOS transistor the one or more source pads of which consist of a single source pad, and the gate pad and the single source pad included in each of the at least one specific vertical MOS transistor may be circular in a plan view of the semiconductor layer, and among the gate pad and the one or more source pads included in each of the N vertical MOS transistors, there may be no gate pad or source pad that is significantly smaller in surface area than either of the gate pad or the single source pad included in each of the at least one specific vertical MOS transistor.

The semiconductor device may be rectangular in a plan view of the semiconductor layer, and in each of one or more current paths defined by specifications, a first inlet/outlet vertical MOS transistor, among the N vertical MOS transistors, that is located at an inlet or an outlet of the current path and a second inlet/outlet vertical MOS transistor, among the N vertical MOS transistors, that is located at the outlet or the inlet of the current path may be adjacent to each other in a plan view of the semiconductor layer.

The semiconductor device may have the shape of a non-square rectangle in a plan view of the semiconductor layer, and in a plan view of the semiconductor layer, in each of the one or more current paths, a boundary line between the first inlet/outlet vertical MOS transistor and the second inlet/outlet vertical MOS transistor may be parallel to a longer side of the semiconductor device.

In a plan view of the semiconductor layer, in each of the one or more current paths, a boundary line between the first inlet/outlet vertical MOS transistor and the second inlet/outlet vertical MOS transistor may not be parallel to any of four sides of the semiconductor device.

In a plan view of the semiconductor layer, in each of the one or more current paths, a boundary line between the first inlet/outlet vertical MOS transistor and the second inlet/outlet vertical MOS transistor may consist of alternately connected (i) one or more line segments parallel to a first side among four sides of the semiconductor device and (ii) one or more line segments parallel to a second side among the four sides that is orthogonal to the first side.

In a first current path defined by specifications, a first inlet/outlet vertical MOS transistor, among the N vertical MOS transistors, that is located at an inlet or an outlet of the first current path and a second inlet/outlet vertical MOS transistor, among the N vertical MOS transistors, that is located at the outlet or the inlet of the first current path may be adjacent to each other in a plan view of the semiconductor layer, in a second current path defined by the specifications, the first inlet/outlet vertical MOS transistor, among the N vertical MOS transistors, that is located at an inlet or an outlet of the second current path and a third inlet/outlet vertical MOS transistor, among the N vertical MOS transistors, that is located at the outlet or the inlet of the second current path may be adjacent to each other in a plan view of the semiconductor layer, in a third current path defined by the specifications, the second inlet/outlet vertical MOS transistor, among the N vertical MOS transistors, that is located at an inlet or an outlet of the third current path and the third inlet/outlet vertical MOS transistor, among the N vertical MOS transistors, that is located at the outlet or the inlet of the third current path may be adjacent to each other in a plan view of the semiconductor layer, and the gate pad of the third inlet/outlet vertical MOS transistor may be located on an extension of a boundary line between the first inlet/outlet vertical MOS transistor and the second inlet/outlet vertical MOS transistor.

In a first current path defined by specifications, a first inlet/outlet vertical MOS transistor, among the N vertical MOS transistors, that is located at an inlet or an outlet of the first current path and a second inlet/outlet vertical MOS transistor, among the N vertical MOS transistors, that is located at the outlet or the inlet of the first current path may be adjacent to each other in a plan view of the semiconductor layer, in a second current path defined by the specifications, the second inlet/outlet vertical MOS transistor, among the N vertical MOS transistors, that is located at an inlet or an outlet of the second current path and a third inlet/outlet vertical MOS transistor, among the N vertical MOS transistors, that is located at the outlet or the inlet of the second current path may be adjacent to each other in a plan view of the semiconductor layer, a current path defined by the first inlet/outlet vertical MOS transistor and the third inlet/outlet vertical MOS transistor may not correspond to any of current paths defined by the specifications, the first inlet/outlet vertical MOS transistor and the third inlet/outlet vertical MOS transistor may be adjacent to each other in a plan view of the semiconductor layer, and the gate pad of the third inlet/outlet vertical MOS transistor may be located nearer to a boundary line between the first inlet/outlet vertical MOS transistor and the third inlet/outlet vertical MOS transistor than to a boundary line between the second inlet/outlet vertical MOS transistor and the third inlet/outlet vertical MOS transistor.

The semiconductor device may further include a drain pad on an upper surface of the semiconductor layer and electrically connected to the semiconductor substrate.

A battery protection circuit according to one aspect of the present disclosure includes: the semiconductor device described above; a first terminal connected to the one or more source pads of a single terminal-connected vertical MOS transistor among the N vertical MOS transistors included in the semiconductor device; and N−1 battery cells each including a first electrode connected to the one or more source pads of a different one of N−1 vertical MOS transistors among the N vertical MOS transistors included in the semiconductor device excluding the single terminal-connected vertical MOS transistor, the first electrode being one of a positive electrode or a negative electrode. Each of the first electrodes included in the N−1 battery cells has a same polarity.

According to the battery protection circuit configured as described above, it is possible to provide a battery protection circuit including a first semiconductor device that can inhibit localized heat generation.

A battery protection circuit according to one aspect of the present disclosure includes: a first semiconductor device that is the semiconductor device described above; a second semiconductor device that is the semiconductor device described above, the N vertical MOS transistors of which total three; N−1 battery cells connected in a series connection; a first terminal connected to the one or more source pads of a first terminal-connected vertical MOS transistor which is a single vertical MOS transistor among the N vertical MOS transistors included in the first semiconductor device, and to the one or more source pads of a second terminal-connected vertical MOS transistor which is a single vertical MOS transistor among the three vertical MOS transistors included in the second semiconductor device; a second terminal connected to negative electrodes of the N−1 battery cells; and a third terminal connected to a positive electrode of a battery cell, among the N−1 battery cells, located at a positive electrode end of the series connection. Each positive electrode of the N−1 battery cells is connected to the one or more source pads of a different one of N−1 vertical MOS transistors among the N vertical MOS transistors included in the first semiconductor device excluding the first terminal-connected vertical MOS transistor. Among the N−1 battery cells, a positive electrode of a first battery cell located at a negative electrode end of the series connection is connected to the one or more source pads of one of two vertical MOS transistors among the three vertical MOS transistors included the second semiconductor device excluding the second terminal-connected vertical MOS transistor, and a negative electrode of a second battery cell located next to the first battery cell in the series connection is connected to the one or more source pads of an other of the two vertical MOS transistors among the three vertical MOS transistors included the second semiconductor device excluding the second terminal-connected vertical MOS transistor. The first battery cell and the second battery cell are connected in series via the second semiconductor device.

According to the battery protection circuit configured as described above, it is possible to provide a battery protection circuit including a first semiconductor device and a second semiconductor device that can inhibit localized heat generation.

A battery protection circuit according to one aspect of the present disclosure includes: a first semiconductor device that is the semiconductor device described above; a second semiconductor device that is the semiconductor device described above, the N vertical MOS transistors of which total three; N battery cells connected in a series connection; a first terminal connected to the one or more source pads of a first terminal-connected vertical MOS transistor which is a single vertical MOS transistor among the N vertical MOS transistors included in the first semiconductor device, and to the one or more source pads of a second terminal-connected vertical MOS transistor which is a single vertical MOS transistor among the three vertical MOS transistors included in the second semiconductor device; a second terminal connected to negative electrodes of the N battery cells; and a third terminal connected to a positive electrode of a battery cell, among the N battery cells, located at a positive electrode end of the series connection. Each positive electrode of N−1 battery cells among the N battery cells excluding a first battery cell located at a negative electrode end of the series connection is connected to the one or more source pads of a different one of N−1 vertical MOS transistors among the N vertical MOS transistors included in the first semiconductor device excluding the first terminal-connected vertical MOS transistor. Among the N battery cells, a positive electrode of the first battery cell located at the negative electrode end of the series connection is connected to the one or more source pads of one of two vertical MOS transistors among the three vertical MOS transistors included the second semiconductor device excluding the second terminal-connected vertical MOS transistor, and a negative electrode of a second battery cell, among the N battery cells, located next to the first battery cell in the series connection is connected to the one or more source pads of an other of the two vertical MOS transistors among the three vertical MOS transistors included the second semiconductor device excluding the second terminal-connected vertical MOS transistor. The first battery cell and the second battery cell are connected in series via the second semiconductor device.

According to the battery protection circuit configured as described above, it is possible to provide a battery protection circuit including a first semiconductor device and a second semiconductor device that can inhibit localized heat generation.

A battery protection circuit according to one aspect of the present disclosure includes: a first semiconductor device that is the semiconductor device described above, the N vertical MOS transistors of which total three, the at least one specific vertical MOS transistor of which totals one; a second semiconductor device that is the semiconductor device described above, the N vertical MOS transistors of which total three, the at least one specific vertical MOS transistor of which totals one; a first terminal connected to the single source pad of the one specific vertical MOS transistor included in the first semiconductor device; a second terminal connected to the one or more source pads of one of two vertical MOS transistors among the three vertical MOS transistors included in the first semiconductor device excluding the one specific vertical MOS transistor; a third terminal connected to the one or more source pads of an other of the two vertical MOS transistors among the three vertical MOS transistors included in the first semiconductor device excluding the one specific vertical MOS transistor; a fourth terminal connected to the single source pad of the one specific vertical MOS transistor included in the second semiconductor device; a fifth terminal connected to the one or more source pads of one of two vertical MOS transistors among the three vertical MOS transistors included in the second semiconductor device excluding the one specific vertical MOS transistor; and a sixth terminal connected to the one or more source pads of an other of the two vertical MOS transistors among the three vertical MOS transistors included in the second semiconductor device excluding the one specific vertical MOS transistor. The third terminal is for connecting to one or more positive electrodes of one or more battery cells. The sixth terminal is for connecting to one or more negative electrodes of the one or more battery cells. The first terminal, the second terminal, the fourth terminal, and the fifth terminal are for connecting to a power management circuit. Through the second terminal and the fifth terminal, the power management circuit applies charging current to the one or more battery cells when charging, and receives discharging current from the one or more battery cells when discharging.

According to the battery protection circuit configured as described above, it is possible to provide a battery protection circuit including a first semiconductor device and a second semiconductor device that can inhibit localized heat generation.

A battery protection circuit according to one aspect of the present disclosure includes: the semiconductor device described above, the N vertical MOS transistors of which total three, the at least one specific vertical MOS transistor of which totals one; a first terminal connected to the single source pad of the one specific vertical MOS transistor included in the semiconductor device and to the one or more source pads of one of two vertical MOS transistors among the three vertical MOS transistors included in the semiconductor device excluding the one specific vertical MOS transistor; a second terminal connected to the one or more source pads of an other of the two vertical MOS transistors among the three vertical MOS transistors included in the semiconductor device excluding the one specific vertical MOS transistor; a third terminal; and a fourth terminal. The first terminal is for connecting to one or more positive electrodes of one or more battery cells. The third terminal is for connecting to one or more negative electrodes of the one or more battery cells. The second terminal and the fourth terminal are for connecting to a power management circuit. Through the second terminal and the fourth terminal, the power management circuit applies charging current to the one or more battery cells when charging, and receives discharging current from the one or more battery cells when discharging.

According to the battery protection circuit configured as described above, it is possible to provide a battery protection circuit including a first semiconductor device that can inhibit localized heat generation.

A battery protection circuit according to one aspect of the present disclosure includes: a first semiconductor device that is the semiconductor device described above, the N vertical MOS transistors of which total X+Y, where X is an integer greater than or equal to one and Y is an integer greater than or equal to two; a second semiconductor device that is the semiconductor device described above, the N vertical MOS transistors of which total 1+Y; X first terminals each connected to the one or more source pads of a different one of X vertical MOS transistors among the X+Y vertical MOS transistors included in the first semiconductor device; Y second terminals each connected to the one or more source pads of a different one of Y vertical MOS transistors among the X+Y vertical MOS transistors included in the first semiconductor device excluding the X vertical MOS transistors; a third terminal connected to the one or more source pads of a single vertical MOS transistor among the 1+Y vertical MOS transistors included in the second semiconductor device; and Y fourth terminals each connected to the one or more source pads of a different one of Y vertical MOS transistors among the 1+Y vertical MOS transistors included in the second semiconductor device excluding the single vertical MOS transistor. The X first terminals are for connecting to respective positive electrodes of X battery cells. The third terminal is for connecting to one or more negative electrodes of the X battery cells. The Y second terminals and the Y fourth terminals are for connecting to respective Y power management circuits. Through one of the Y second terminals and one of the Y fourth terminals, each of the Y power management circuits applies charging current to at least one battery cell among the X battery cells when charging, and receives discharging current from the at least one battery cell among the X battery cells when discharging.

According to the battery protection circuit configured as described above, it is possible to provide a battery protection circuit including a first semiconductor device and a second semiconductor device that can inhibit localized heat generation.

A power management circuit according to one aspect of the present disclosure includes: the semiconductor device described above, the N vertical MOS transistors of which total X+Y, where X is an integer greater than or equal to one and Y is an integer greater than or equal to two; X terminals each connected to the one or more source pads of a different one of X vertical MOS transistors among the X+Y vertical MOS transistors included in the semiconductor device; and Y circuits each connected to the one or more source pads of a different one of Y vertical MOS transistors among the X+Y vertical MOS transistors included in the semiconductor device excluding the X vertical MOS transistors. The X terminals are for connecting to respective X external circuits. Each of the Y circuits has a separate power supply.

According to the power management circuit configured as described above, it is possible to provide a power management circuit including a first semiconductor device that can inhibit localized heat generation.

A semiconductor device according to one aspect of the present disclosure is a semiconductor device of chip-size package type that is face-down mountable, and includes: a semiconductor layer; and N vertical transistors in the semiconductor layer, where N is an integer greater than or equal to three. Each of the N vertical transistors includes, on an upper surface of the semiconductor layer, a control pad electrically connected to a control electrode that controls conduction of the vertical transistor and one or more external connection pads electrically connected to an external connection electrode through which the vertical transistor receives current from outside or outputs current outside. The semiconductor layer includes a semiconductor substrate. The semiconductor substrate includes one main surface on which the N vertical transistors are formed and an other main surface facing away from the one main surface, and the semiconductor device further includes a common electrode common to the N vertical transistors on the other main surface side of the semiconductor substrate. For each of the N vertical transistors, a surface area of the vertical transistor in a plan view of the semiconductor layer increases with an increase in a maximum specified current of the vertical transistor.

According to the semiconductor device configured as described above, the greater the maximum specified current of the vertical transistor is, the greater the surface area is in a plan view of the semiconductor layer.

In general, the conduction resistance of the vertical transistor is inversely proportional to the surface area in a plan view of the semiconductor layer. Accordingly, in the semiconductor device configured as described above, the greater the maximum specified current of the vertical transistor is, the less the conduction resistance of the vertical transistor is.

Thus, according to the semiconductor device configured as described above, it possible to provide a semiconductor device that can inhibit localized heat generation.

For each of the N vertical transistors, the surface area of the vertical transistor in a plan view of the semiconductor layer may be proportional to the square of the maximum specified current of the vertical transistor.

For each of the N vertical transistors, the conduction resistance when the maximum specified current flows may be inversely proportional to the square of the maximum specified current of the vertical transistor.

The semiconductor device may further include a common terminal that is on an upper surface side of the semiconductor layer and electrically connected to the common electrode.

Each of the one or more external connection pads included in each of the N vertical transistors may be an external output terminal through which current from the N vertical transistors is output outside the N vertical transistors, and the common terminal may be an external input terminal through which outside current is input into the N vertical transistors.

Hereinafter, a specific example of the semiconductor device, etc., according to one aspect of the present disclosure will be described with reference to the drawings. Each of the following embodiments shows a specific example of the present disclosure. The numerical values, shapes, elements, the arrangement and connection of the elements, the steps, and the order of the steps, etc., indicated in the following embodiments are mere examples, and therefore do not intend to limit the present disclosure. The figures are schematic diagrams and are not necessarily precise illustrations. Elements that are essentially the same share like reference signs in the figures, and duplicate description is omitted or simplified.

Embodiment 1

1-1. Semiconductor Device Structure

Hereinafter, the structure of the semiconductor device according to Embodiment 1 will be described. The semiconductor device according to Embodiment 1 is a face-down mountable chip-size package (CSP) semiconductor device in which N (N is an integer greater than or equal to three) vertical metal oxide semiconductor (MOS) transistors are formed. These N vertical MOS transistors are trench metal oxide semiconductor field effect transistors (MOSFETs).

In the present disclosure, a vertical MOS transistor is used as one example of a vertical transistor, but the vertical transistor need not be limited to a vertical MOS transistor. For example, the vertical transistor may be a BJT or an IGBT. If the vertical transistor is a BJT, in the present disclosure, the term "source" may be replaced with "emitter", the term "drain" may be replaced with "collector", and the term "body" may be replaced with "base". Additionally, in the present disclosure, the term "gate electrode", which controls conduction, may be replaced with "base electrode". Similarly, if the vertical transistor is an IGBT, in the present disclosure, the term "source" may be replaced with "emitter", the term "drain" may be replaced with "collector".

Figure 2:
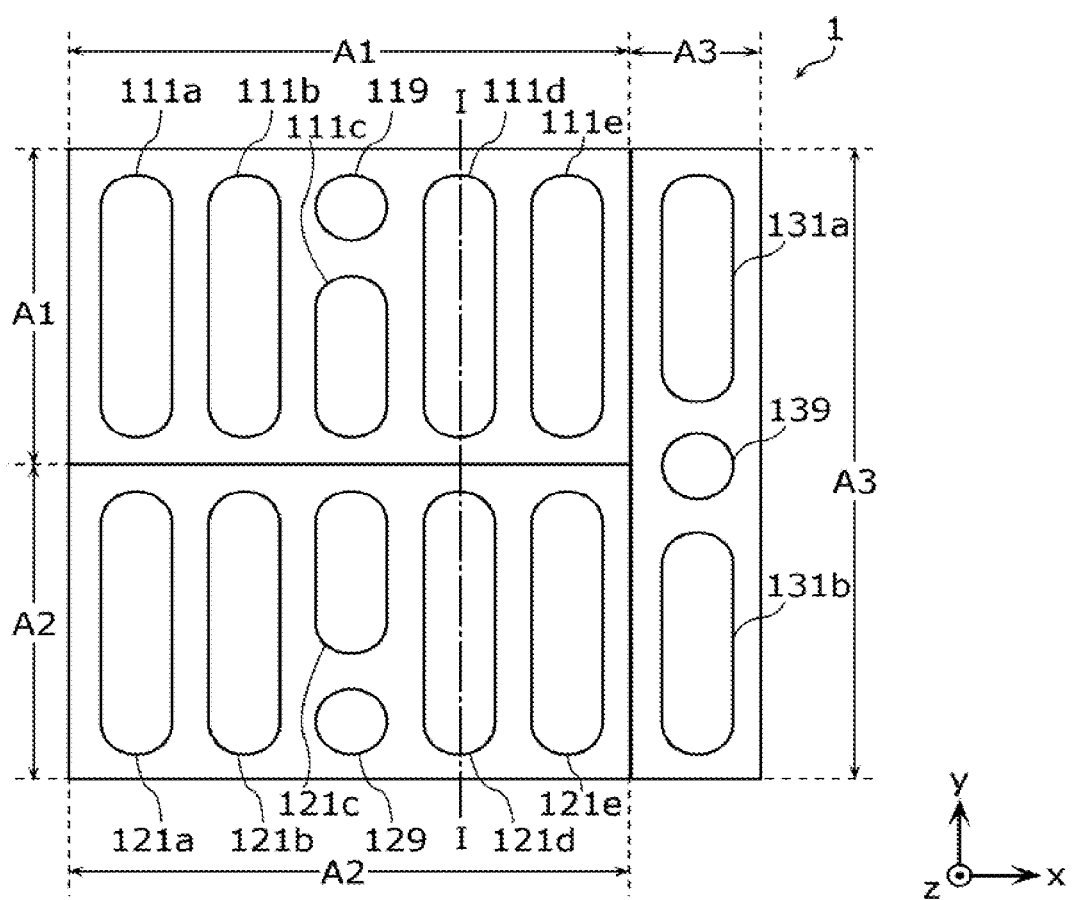
FIG. 2 is a plan view illustrating one example of the structure of the semiconductor device according to Embodiment 1.
Figure 3:
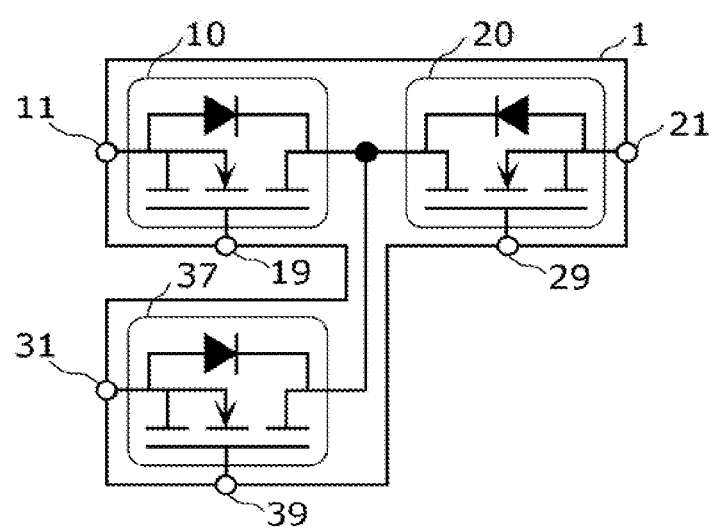
FIG. 3 is a circuit diagram illustrating one example of the circuit configuration of the semiconductor device according to Embodiment 1.

FIG. 1 is a cross-sectional view illustrating one example of the structure of semiconductor device 1 according to Embodiment 1. FIG. 2 is a plan view illustrating one example of the structure of semiconductor device 1. FIG. 1 illustrates a cross section taken at line I-I illustrated in FIG. 2. FIG. 3 is a circuit diagram illustrating one example of the circuit configuration of semiconductor device 1.

For illustrative purposes, FIG. 1 through FIG. 3 illustrate semiconductor device 1 in a case where N is three, and descriptions referencing FIG. 1 through FIG. 3 describe N as three, but semiconductor device 1 is not necessarily limited to a case where N is three; it is sufficient so long as N is greater than or equal to three.

As illustrated in FIG. 1 through FIG. 3, semiconductor device 1 includes semiconductor layer 40, metal layer 30, protective layer 35, first vertical MOS transistor 10 (hereinafter also referred to as transistor 10) formed in region A1 inside semiconductor layer 40, second vertical MOS transistor 20 (hereinafter also referred to as transistor 20) formed in region A2 inside semiconductor layer 40, and third vertical MOS transistor 37 (hereinafter also referred to as transistor 37) formed in region A3 inside semiconductor layer 40.

Although not illustrated in FIG. 1, in the present specification, the region inside semiconductor layer 40 where the $N^{th}$ vertical transistor is formed is also referred to as region AN.

For illustrative purposes, FIG. 1 illustrates semiconductor device 1 in a case where semiconductor device 1 and semiconductor layer 40 are rectangular in a plan view of semiconductor layer 40, but semiconductor device 1 is not limited to a configuration in which semiconductor device 1 and semiconductor layer 40 are rectangular in a plan view of semiconductor layer 40.

Semiconductor layer 40 is formed by stacking semiconductor substrate 32, low-concentration impurity layer 33, and oxide film 34.

Semiconductor substrate 32 is disposed on the lower surface side of semiconductor layer 40 and comprises silicon containing impurities of a first conductivity type.

Low-concentration impurity layer 33 is disposed on the upper surface side of semiconductor layer 40, is formed in contact with semiconductor substrate 32, and contains impurities of the first conductivity type at a concentration lower than the concentration of impurities of the first conductivity type in semiconductor substrate 32. For example, low-concentration impurity layer 33 may be formed on semiconductor substrate 32 via epitaxial growth.

Oxide film 34 is disposed on the upper surface of semiconductor layer 40 and is formed in contact with low-concentration impurity layer 33.

Protective layer 35 is formed in contact with the upper surface of semiconductor layer 40 and covers at least part of the upper surface of semiconductor layer 40.

Metal layer 30 is formed in contact with the lower surface of semiconductor substrate 32 and may comprise silver, copper, nickel, or an alloy thereof, or a metal material with good electrical conductivity that enables functionality as an electrode. Metal layer 30 may contain trace amounts of non-metallic elements introduced as impurities in the manufacturing process of metal material.

As illustrated in FIG. 2, transistor 10 includes, on the upper surface of semiconductor layer 40 in region A1 in a plan view of semiconductor layer 40, one or more (five in this example) first source pads 111 (first source pads 111a, 111b, 111c, 111d, and 111e in this example), and first gate pad 119, which are bonded to the mounting substrate via a bonding material during the face-down mounting. Transistor 20 includes, on the upper surface of semiconductor layer 40 in region A2 in a plan view of semiconductor layer 40, one or more (five in this example) second source pads 121 (second source pads 121a, 121b, 121c, 121d, and 121e in this example), and second gate pad 129, which are bonded to the mounting substrate via a bonding material during the face-down mounting. Transistor 37 includes, on the upper surface of semiconductor layer 40 in region A3 in a plan view of semiconductor layer 40, one or more (two in this example) third source pads 131 (third source pads 131a and 131b in this example), and third gate pad 139, which are bonded to the mounting substrate via a bonding material during the face-down mounting.

Each first source pad 111, each second source pad 121, and each third source pad 131 has the shape of a non-square rectangle, an oval, or a circle in a plan view of semiconductor layer 40. Note that in the present specification, shapes of the ends of the non-square rectangle and shapes of the ends of the oval are not limited to angled (in the case of a non-square rectangle) or semicircular (in the case of an oval), and may also be polygonal. First gate pad 119, second gate pad 129, and third gate pad 139 are circular in a plan view of semiconductor layer 40.

The number and shape of the one or more first source pads 111, the one or more second source pads 121, and the one or more third source pads 131 are not necessarily limited to the respective examples illustrated in FIG. 2.

As illustrated in FIG. 1 and FIG. 2, first body region 18 containing impurities of a second conductivity type different from the first conductivity type is formed in first region A1 of low-concentration impurity layer 33. First source region 14 containing impurities of the first conductivity type, first gate conductor 15, and first gate insulating film 16 are formed in first body region 18. First source electrode 11 is composed of portions 12 and 13, and portion 12 is connected to first source region 14 and first body region 18 via portion 13. First gate conductor 15 is electrically connected to first gate pad 119.

Portion 12 of first source electrode 11 is a layer that is bonded to solder during reflow in the face-down mounting process. In one non-limiting example, portion 12 may comprise a metal material including one or more of nickel, titanium, tungsten, and palladium. The surface of portion 12 may be plated with, for instance, gold.

Portion 13 of first source electrode 11 is a layer connecting portion 12 and semiconductor layer 40. In one non-limiting example, portion 13 may comprise a metal material including one or more of aluminum, copper, gold, and silver.

Second body region 28 containing impurities of the second conductivity type is formed in second region A2 of low-concentration impurity layer 33. Second source region 24 containing impurities of the first conductivity type, second gate conductor 25, and second gate insulating film 26 are formed in second body region 28. Second source electrode 21 is composed of portions 22 and 23, and portion 22 is connected to second source region 24 and second body region 28 via portion 23. Second gate conductor 25 is electrically connected to second gate pad 129.

Portion 22 of second source electrode 21 is a layer that is bonded to solder during reflow in the face-down mounting process. In one non-limiting example, portion 22 may comprise a metal material including one or more of nickel, titanium, tungsten, and palladium. The surface of portion 22 may be plated with, for instance, gold.

Portion 23 of second source electrode 21 is a layer connecting portion 22 and semiconductor layer 40. In one non-limiting example, portion 23 may comprise a metal material including one or more of aluminum, copper, gold, and silver.

A third body region (not illustrated in the drawings) containing impurities of the second conductivity type is formed in third region A3 of low-concentration impurity layer 33, just like first region A1 of low-concentration impurity layer 33 and second region A2 of low-concentration impurity layer 33. The third source region (not illustrated in the drawings) containing impurities of the first conductivity type, the third gate conductor (not illustrated in the drawings), and the third gate insulating film (not illustrated in the drawings) are formed in the third body region. Third source electrode 31 (not illustrated in FIG. 1 and FIG. 2; see FIG. 3) is composed of a first portion (not illustrated in the drawings) and a second portion (not illustrated in the drawings), and the first portion is connected to the third source region (not illustrated in the drawings) and the third body region via the second portion. The third gate conductor is electrically connected to third gate pad 139.

The first portion of third source electrode 31 is a layer that is bonded to solder during reflow in the face-down mounting process. In one non-limiting example, the first portion may comprise a metal material including one or more of nickel, titanium, tungsten, and palladium. The surface of the first portion may be plated with, for instance, gold.

The second portion of third source electrode 31 is a layer connecting the first portion and semiconductor layer 40. In one non-limiting example, the second portion may comprise a metal material including one or more of aluminum, copper, gold, and silver.

With the configurations of transistors 10, 20, and 37 described above, low-concentration impurity layer 33 and semiconductor substrate 32 function as a common drain region serving as the first drain region of transistor 10, the second drain region of transistor 20, and the third drain region of transistor 37. In other words, semiconductor substrate 32 functions as a common drain region for N (three in this example) vertical MOS transistors.

As illustrated in FIG. 1, first body region 18 is covered with oxide film 34 having an opening, and portion 13 of first source electrode 11, which is connected to first source region 14 via the opening in oxide film 34, is provided. Oxide film 34 and portion 13 of the first source electrode are covered with protective layer 35 having an opening, and portion 12, which is connected to portion 13 of the first source electrode via the opening in protective layer 35, is provided.

Second body region 28 is covered with oxide film 34 having an opening, and portion 23 of second source electrode 21, which is connected to second source region 24 via the opening in oxide film 34, is provided. Oxide film 34 and portion 23 of the second source electrode are covered with protective layer 35 having an opening, and portion 22, which is connected to portion 23 of the second source electrode via the opening in protective layer 35, is provided.

Just like first body region 18 and second body region 28, the third body region is covered with oxide film 34 having an opening, and the second portion of third source electrode 31, which is connected to the third source region via the opening in oxide film 34, is provided. Oxide film 34 and the second portion of the third source electrode are covered with protective layer 35 having an opening, and the first portion, which is connected to the second portion of the third source electrode via the opening in protective layer 35, is provided.

Accordingly, the one or more first source pads 111, the one or more second source pads 121, and the one or more third source pads 131 refer to regions where first source electrode 11, second source electrode 21, and third source electrode 31, respectively, are partially exposed on the upper surface of semiconductor device 1, and are also referred to as terminals. Similarly, first gate pad 119, second gate pad 129, and third gate pad 139 refer to regions where first gate electrode 19 (not illustrated in FIG. 1 or FIG. 2; see FIG. 3), second gate electrode 29 (not illustrated in FIG. 1 or FIG. 2; see FIG. 3), and third gate electrode 39 (not illustrated in FIG. 1 or FIG. 2; see FIG. 3), respectively, are partially exposed on the upper surface of semiconductor device 1, and are also referred to as terminals.

In semiconductor device 1, for example, the first conductivity type may be n-type and the second conductivity type may be p-type, first source region 14, second source region 24, the third source region, semiconductor substrate 32, and low-concentration impurity layer 33 may be n-type semiconductors, and first body region 18, second body region 28, and the third body region may be p-type semiconductors.

Alternatively, in semiconductor device 1, for example, the first conductivity type may be p-type and the second conductivity type may be n-type, first source region 14, second source region 24, the third source region, semiconductor substrate 32, and low-concentration impurity layer 33 may be p-type semiconductors, and first body region 18, second body region 28, and the third body region may be n-type semiconductors.

In the following description, the conduction operation of semiconductor device 1 will be explained assuming that transistor 10, transistor 20, and transistor 37 (i.e., all of the N vertical MOS transistors) are n-channel transistors where the first conductivity type is n-type and the second conductivity type is p-type.

In semiconductor device 1, when a high voltage is applied to first source electrode 11, a low voltage is applied to second source electrode 21, and a voltage higher than or equal to a threshold is applied to second gate electrode 29 with the voltage of second source electrode 21 serving as a reference, a conducting channel is formed in the vicinity of second gate insulating film 26 in second body region 28. As a result, a main current flows along a path from first source electrode 11 to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 and to second source electrode 21, thereby placing the path in a conducting state. Note that as illustrated in FIG. 3, the interface between first body region 18 and low-concentration impurity layer 33 in this main current path includes a P-N junction and serves as a body diode.

Similarly, in semiconductor device 1, when a high voltage is applied to second source electrode 21, a low voltage is applied to first source electrode 11, and a voltage higher than or equal to a threshold is applied to first gate electrode 19 with the voltage of first source electrode 11 serving as a reference, a conducting channel is formed in the vicinity of first gate insulating film 16 in first body region 18. As a result, a main current flows along a path from second source electrode 21 to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 and to first source electrode 11, thereby placing the path in a conducting state. Note that as illustrated in FIG. 3, the interface between second body region 28 and low-concentration impurity layer 33 in this main current path includes a P-N junction and serves as a body diode.

Similarly, in semiconductor device 1, when a high voltage is applied to first source electrode 11, a low voltage is applied to third source electrode 31, and a voltage higher than or equal to a threshold is applied to third gate electrode 39 with the voltage of third source electrode 31 serving as a reference, a main current flows along a path from first source electrode 11 to third source electrode 31, thereby placing the path in a conducting state.

Similarly, in semiconductor device 1, when a high voltage is applied to third source electrode 31, a low voltage is applied to first source electrode 11, and a voltage higher than or equal to a threshold is applied to first gate electrode 19 with the voltage of first source electrode 11 serving as a reference, a main current flows along a path from third source electrode 31 to first source electrode 11, thereby placing the path in a conducting state.

Similarly, in semiconductor device 1, when a high voltage is applied to second source electrode 21, a low voltage is applied to third source electrode 31, and a voltage higher than or equal to a threshold is applied to third gate electrode 39 with the voltage of third source electrode 31 serving as a reference, a main current flows along a path from second source electrode 21 to third source electrode 31, thereby placing the path in a conducting state.

Similarly, in semiconductor device 1, when a high voltage is applied to third source electrode 31, a low voltage is applied to second source electrode 21, and a voltage higher than or equal to a threshold is applied to second gate electrode 29 with the voltage of second source electrode 21 serving as a reference, a main current flows along a path from third source electrode 31 to second source electrode 21, thereby placing the path in a conducting state.

Similarly, in semiconductor device 1, when a high voltage is applied to first source electrode 11 and second source electrode 21, a low voltage is applied to third source electrode 31, and a voltage higher than or equal to a threshold is applied to third gate electrode 39 with the voltage of third source electrode 31 serving as a reference, a main current flows along a path from first source electrode 11 and second source electrode 21 to third source electrode 31, thereby placing the path in a conducting state.

Similarly, in semiconductor device 1, when a high voltage is applied to third source electrode 31, a low voltage is applied to first source electrode 11 and second source electrode 21, a voltage higher than or equal to a threshold is applied to first gate electrode 19 with the voltage of first source electrode 11 serving as a reference, and a voltage higher than or equal to a threshold is applied to second gate electrode 29 with the voltage of second source electrode 21 serving as a reference, a main current flows along a path from third source electrode 31 to first source electrode 11 and second source electrode 21, thereby placing the path in a conducting state.

Similarly, in semiconductor device 1, when a high voltage is applied to second source electrode 21 and third source electrode 31, a low voltage is applied to first source electrode 11, and a voltage higher than or equal to a threshold is applied to first gate electrode 19 with the voltage of first source electrode 11 serving as a reference, a main current flows along a path from second source electrode 21 and third source electrode 31 to first source electrode 11, thereby placing the path in a conducting state.

Similarly, in semiconductor device 1, when a high voltage is applied to first source electrode 11, a low voltage is applied to second source electrode 21 and third source electrode 31, a voltage higher than or equal to a threshold is applied to second gate electrode 29 with the voltage of second source electrode 21 serving as a reference, and a voltage higher than or equal to a threshold is applied to third gate electrode 39 with the voltage of third source electrode 31 serving as a reference, a main current flows along a path from first source electrode 11 to second source electrode 21 and third source electrode 31, thereby placing the path in a conducting state.

Similarly, in semiconductor device 1, when a high voltage is applied to third source electrode 31 and first source electrode 11, a low voltage is applied to second source electrode 21, and a voltage higher than or equal to a threshold is applied to second gate electrode 29 with the voltage of second source electrode 21 serving as a reference, a main current flows along a path from third source electrode 31 and first source electrode 11 to second source electrode 21, thereby placing the path in a conducting state.

Similarly, in semiconductor device 1, when a high voltage is applied to second source electrode 21, a low voltage is applied to third source electrode 31 and first source electrode 11, a voltage higher than or equal to a threshold is applied to third gate electrode 39 with the voltage of third source electrode 31 serving as a reference, and a voltage higher than or equal to a threshold is applied to first gate electrode 19 with the voltage of first source electrode 11 serving as a reference, a main current flows along a path from second source electrode 21 to third source electrode 31 and first source electrode 11, thereby placing the path in a conducting state.

1-2. Relationship Between Maximum Specified Current and Transistor Surface Area in Plan View Each of the N vertical MOS transistors (here, three, namely first vertical MOS transistor 10, second vertical MOS transistor 20, and third vertical MOS transistor 37) has a maximum specified current. Here, "specified" refers to a product specification of the transistor, and the maximum specified current usually refers to the value stated in the product specifications for the transistor. The value stated in the specifications may be the maximum rated current or a current equivalent to 50% of the maximum rated current. 50% of the maximum rated current usually is stated in the product specifications as the current value used in evaluating conduction resistance. In this sense, the maximum specified current is not limited to 50% of the maximum rated current, and may be taken to be the current value used in evaluating conduction resistance that is stated in the product specifications. The conduction resistance stated in the product specifications may be what is known as the "on-resistance".

For each of the N vertical MOS transistors, the surface area thereof in a plan view of semiconductor layer 40 increases with an increase in the maximum specified current thereof.

Note that in the present specification, in a plan view of semiconductor layer 40, all of the elements composing the $N^{th}$ vertical MOS transistor are defined as provided in the $N^{th}$ region AN. Stated differently, the surface area of the $N^{th}$ vertical MOS transistor may be regarded as the surface area of the $N^{th}$ region AN. Note that according to the above definition, semiconductor device 1 including N vertical MOS transistors is divided into N regions in a plan view of semiconductor layer 40, and there is no part that does not belong to any region.

The surface area of the $N^{th}$ vertical MOS transistor is defined by the boundary with another adjacent vertical MOS transistor. For example, when first vertical MOS transistor 10 and second vertical MOS transistor 20 are adjacent to each other, in a plan view of semiconductor layer 40, the boundary may be regarded as a virtual line tracing the center position of the gap between portion 13 of first source electrode 11 and portion 23 of second source electrode 21, may be regarded as an equi-potential ring (EQR), which is a metal line that is sometimes provided in the center position and does not have the function of conducting current, and may be regarded as the gap itself, albeit with a finite width. Even when the boundary is regarded as the gap itself, it can be recognized by the naked eye or under low magnification as a line in appearance.

The surface area of the $N^{th}$ vertical MOS transistor in a plan view of semiconductor layer 40 may be the surface area of the active region of the $N^{th}$ vertical MOS transistor. The active region of a vertical MOS transistor is the region of the body region of the vertical MOS transistor where the main current flows when the vertical MOS transistor is in a conducting state.

Here, for each vertical MOS transistor, the active region approximately matches the extent of the body region in a plan view of semiconductor layer 40. In a plan view of semiconductor layer 40, for each vertical MOS transistor, the extent of the body region approximately matches the extent of the region where the vertical MOS transistor is formed (i.e., region A1 if the vertical MOS transistor is transistor 10, region A2 if the vertical MOS transistor is transistor 20, and region A3 if the vertical MOS transistor is transistor 37). Accordingly, for each vertical MOS transistor, in a plan view of semiconductor layer 40, the surface area of the active region approximately matches the extent of the region where the vertical MOS transistor is formed.

Hereinafter, the maximum specified current of first vertical MOS transistor 10 may be denoted as I1, the maximum specified current of second vertical MOS transistor 20 may be denoted as I2, . . . , and the maximum specified current of the $N^{th}$ vertical MOS transistor may be denoted as IN. Hereinafter, the surface area of first vertical MOS transistor 10 in a plan view of semiconductor layer 40 may be denoted as S1, the surface area of second vertical MOS transistor 20 in a plan view of semiconductor layer 40 may be denoted as S2, . . . , and the surface area of the $N^{th}$ vertical MOS transistor in a plan view of semiconductor layer 40 may be denoted as SN. Hereinafter, the conduction resistance when maximum specified current I1 flows through first vertical MOS transistor 10 may be denoted as R1, the conduction resistance when maximum specified current I2 flows through second vertical MOS transistor 20 may be denoted as R2, . . . , and the conduction resistance when maximum specified current IN flows through the $N^{th}$ vertical MOS transistor may be denoted as RN.

In the present disclosure, the surface areas of the N vertical MOS transistors in a plan view of semiconductor layer 40 are proportional to the squares of the maximum specified currents of the N vertical MOS transistors. In other words, $S1:S2: \ldots :SN=I1^2:I2^2: \ldots :IN^2$.

In general, the surface area of a vertical MOS transistor in a plan view of semiconductor layer 40 is inversely proportional to the conduction resistance of the vertical MOS transistor. Accordingly, the conduction resistances of the N vertical MOS transistors are inversely proportional to the squares of the maximum specified currents of the N vertical MOS transistors. In other words, $1/R1:1/R2: \ldots :1/RN=I1^2:I2^2: \ldots :IN^2$.

The amount of heat generated in each vertical MOS transistor is determined by its power loss $P=R \times I^2$.

As described above, with semiconductor device 1 configured as described above, the conduction resistances of the N vertical MOS transistors are inversely proportional to the squares of the maximum specified currents of the N vertical MOS transistors.

Therefore, in semiconductor device 1 configured as described above, an equal amount of heat is generated by each vertical MOS transistor when the maximum specified currents are applied to the respective vertical MOS transistors.

Thus, semiconductor device 1 configured as described above can inhibit localized heat generation.

Semiconductor device 1 configured as described above has the advantage that, when the intended use does not require current paths that need to carry large currents, the size of the semiconductor device itself can be reduced since appropriately sized vertical MOS transistors rather than oversized vertical MOS transistors can be provided on the current paths.

Note that conduction resistance is usually measured as the conduction resistance in a certain current path, defined by the specifications, from one of the N vertical MOS transistors located at the inlet or the outlet of the current path (i.e., one of the "inlet/outlet" vertical MOS transistors) to another of the N vertical MOS transistors located at the outlet or the inlet of the current path (i.e., the other of the "inlet/outlet" vertical MOS transistors). For this reason, when looking at a single vertical MOS transistor, e.g., the $N^{th}$ vertical MOS transistor described above, assuming the necessary product specifications of the $N^{th}$ vertical MOS transistor are available, when focusing on a current path where the $N^{th}$ vertical MOS transistor is one of the inlet/outlet vertical MOS transistors, conduction resistance RN when maximum specified current IN flows can be calculated by dividing the conduction resistance of said current path when maximum specified current IN flows through the $N^{th}$ vertical MOS transistor, proportionally to the surface area of the other inlet/outlet vertical MOS transistor of said current path, with the sum of the surface areas of the $N^{th}$ vertical MOS transistor and the other inlet/outlet vertical MOS transistor as the denominator. For example, if the current path between the first vertical MOS transistor (surface area S1, maximum specified current I1, conduction resistance R1) and the second vertical MOS transistor (surface area S2, maximum specified current I2>I1, conduction resistance R2) is defined by the specifications, and the conduction resistance of said current path when current I1 flows between the first and second vertical MOS transistors is R12, then $R1=R12 \times S2/(S1+S2)$.

1-3. Preferred Semiconductor Device Geometry

In each of one or more current paths defined by the specifications, a first inlet/outlet vertical MOS transistor among the N vertical MOS transistors that is located at the inlet or the outlet of the current path and a second inlet/outlet vertical MOS transistor among the N vertical MOS transistors that is located at the outlet or the inlet of the current path are preferably adjacent to each other in a plan view of semiconductor layer 40.

This inhibits a vertical MOS transistor interposed between the first inlet/outlet vertical MOS transistor and the second inlet/outlet vertical MOS transistor from generating more heat than when the maximum specified current is flowing as a result of current flowing in the current path between the first inlet/outlet vertical MOS transistor and the second inlet/outlet vertical MOS transistor at the same time the maximum specified current flows through the interposing vertical MOS transistor.

Figure 4A:
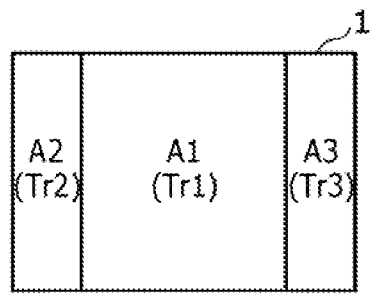
FIG. 4A is a plan view of the semiconductor device according to Embodiment 1.
Figure 4B:
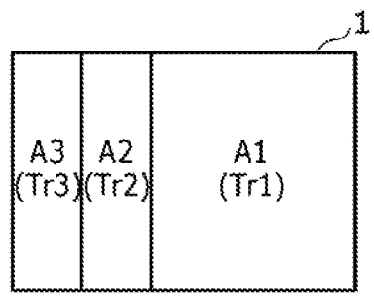
FIG. 4B is a plan view of the semiconductor device according to Embodiment 1.

FIG. 4A and FIG. 4B are plan views of examples of geometries of semiconductor device 1 where N is three and the current paths defined by the specifications are (1) the current path flowing between the first vertical MOS transistor (Tr1) and the second vertical MOS transistor (Tr2) and (2) the current path flowing between the first vertical MOS transistor (Tr1) and the third vertical MOS transistor (Tr3), and (3) the current path between the second vertical MOS transistor (Tr2) and the third vertical MOS transistor (Tr3) is a current path not defined by the specifications.

According to the geometry of semiconductor device 1 illustrated in FIG. 4A, Tr1 and Tr2, which are located at the inlet and the outlet of one current path defined by the specifications, are adjacent to each other, and Tr1 and Tr3, which are located at the inlet and the outlet of the other current path defined by the specifications, are adjacent to each other.

In contrast, according to the geometry of semiconductor device 1 illustrated in FIG. 4B, although Tr1 and Tr2, which are located at the inlet and the outlet of one current path defined by the specifications, are adjacent to each other, Tr1 and Tr3, which are located at the inlet and the outlet of the other current path defined by the specifications, are not adjacent to each other. In a plan view of semiconductor layer 40, Tr2 is located on the current path between Tr1 and Tr3.

This causes the current path between Tr1 and Tr2 and the current path between Tr1 and Tr3 to overlap, whereby the maximum specified current also flows through Tr3 at the same time the maximum specified current flows through Tr2, which causes Tr2 to generate more heat than when only the maximum specified current of Tr2 flows through Tr2.

Therefore, the geometry of semiconductor device 1 illustrated in FIG. 4A can be said to be preferable to the geometry of semiconductor device 1 illustrated in FIG. 4B.

Note that a current path defined by the specifications is a current path whose conduction resistance (on-resistance) is indicated in the product specifications of the relevant transistor. One or more current paths and the maximum specified currents of the inlet/outlet vertical MOS transistors of each of the current paths are designed according to application, and stated in the product specifications, rather than any combination of N vertical MOS transistors being freely used as a current path.

In the present specification, the first vertical MOS transistor may hereinafter be denoted as Tr1, the second vertical MOS transistor may hereinafter be denoted as Tr2, . . . , and the $N^{th}$ vertical MOS transistor may hereinafter be denoted as TrN.

When semiconductor device 1 has the shape of a non-square rectangle in a plan view of semiconductor layer 40, in each of the one or more current paths defined by the specifications, the boundary line in a plan view of semiconductor layer 40 between the first inlet/outlet vertical MOS transistor located at the inlet or the outlet of the current path and the second inlet/outlet vertical MOS transistor located at the outlet or the inlet of the current path is preferably parallel to the longer side of semiconductor device 1 rather than to the shorter side of semiconductor device 1.

This allows a relatively wide area for current to flow between the first and second inlet/outlet vertical MOS transistors. Stated differently, the conduction resistance of the current path defined by the first and second inlet/outlet vertical MOS transistors can be made relatively low.

Figure 5:
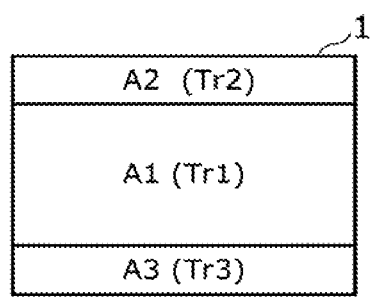
FIG. 5 is a plan view of the semiconductor device according to Embodiment 1.

Similar to FIG. 4A and FIG. 4B, FIG. 5 is a plan view of one example of a geometry of semiconductor device 1 where N is three and the current paths defined by the specifications are (1) the current path flowing between the first vertical MOS transistor (Tr1) and the second vertical MOS transistor (Tr2) and (2) the current path flowing between the first vertical MOS transistor (Tr1) and the third vertical MOS transistor (Tr3), and (3) the current path between the second vertical MOS transistor (Tr2) and the third vertical MOS transistor (Tr3) is a current path not defined by the specifications.

According to the geometry of semiconductor device 1 illustrated in FIG. 5, the boundary line between Tr1 and Tr2 and the boundary line between Tr1 and Tr3 are parallel to the longer side of semiconductor device 1 in a plan view of semiconductor layer 40.

In contrast, according to the geometry of semiconductor device 1 illustrated in FIG. 4A, the boundary line between Tr1 and Tr2 and the boundary line between Tr1 and Tr3 are parallel to the shorter side of semiconductor device 1 in a plan view of semiconductor layer 40.

Thus, in a plan view of semiconductor layer 40, the boundary line between Tr1 and Tr2 in the geometry of semiconductor device 1 illustrated in FIG. 5 is longer than the boundary line between Tr1 and Tr2 in the geometry of semiconductor device 1 illustrated in FIG. 4A, and the boundary line between Tr1 and Tr3 in the geometry of semiconductor device 1 illustrated in FIG. 5 is longer than the boundary line between Tr1 and Tr3 in the geometry of semiconductor device 1 illustrated in FIG. 4A.

Therefore, the geometry of semiconductor device 1 illustrated in FIG. 5 can be said to be preferable to the geometry of semiconductor device 1 illustrated in FIG. 4A.

In each of the one or more current paths defined by the specifications, the boundary line in a plan view of semiconductor layer 40 between the first inlet/outlet vertical MOS transistor located at the inlet or the outlet of the current path and the second inlet/outlet vertical MOS transistor located at the outlet or the inlet of the current path is preferably not parallel to any of the four sides of semiconductor device 1 rather than being parallel to any of the four sides of semiconductor device 1.

This allows a relatively wide area for current to flow between the first and second inlet/outlet vertical MOS transistors. Stated differently, the conduction resistance of the current path defined by the first and second inlet/outlet vertical MOS transistors can be made relatively low.

Similar to FIG. 4A, FIG. 4B, and FIG. 5, FIG. 6 is a plan view of one example of a geometry of semiconductor device 1 where N is three and the current paths defined by the specifications are (1) the current path flowing between the first vertical MOS transistor (Tr1) and the second vertical MOS transistor (Tr2) and (2) the current path flowing between the first vertical MOS transistor (Tr1) and the third vertical MOS transistor (Tr3), and (3) the current path between the second vertical MOS transistor (Tr2) and the third vertical MOS transistor (Tr3) is a current path not defined by the specifications.

Figure 6:
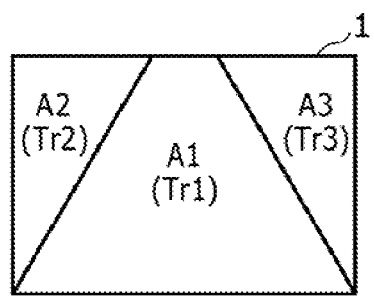
FIG. 6 is a plan view of the semiconductor device according to Embodiment 1.

According to the geometry of semiconductor device 1 illustrated in FIG. 6, the boundary line between Tr1 and Tr2 and the boundary line between Tr1 and Tr3 are not parallel to any of the four sides of semiconductor device 1 in a plan view of semiconductor layer 40. Stated differently, the boundary line between Tr1 and Tr2 and the boundary line between Tr1 and Tr3 are oblique to each of the four sides of semiconductor device 1.

In contrast, according to the geometry of semiconductor device 1 illustrated in FIG. 4A, the boundary line between Tr1 and Tr2 and the boundary line between Tr1 and Tr3 are parallel to any of the four sides of semiconductor device 1 in a plan view of semiconductor layer 40.

Thus, in a plan view of semiconductor layer 40, the boundary line between Tr1 and Tr2 in the geometry of semiconductor device 1 illustrated in FIG. 6 is longer than the boundary line between Tr1 and Tr2 in the geometry of semiconductor device 1 illustrated in FIG. 4A, and the boundary line between Tr1 and Tr3 in the geometry of semiconductor device 1 illustrated in FIG. 6 is longer than the boundary line between Tr1 and Tr3 in the geometry of semiconductor device 1 illustrated in FIG. 4A.

Therefore, the geometry of semiconductor device 1 illustrated in FIG. 6 can be said to be preferable to the geometry of semiconductor device 1 illustrated in FIG. 4A.

Figure 7A:
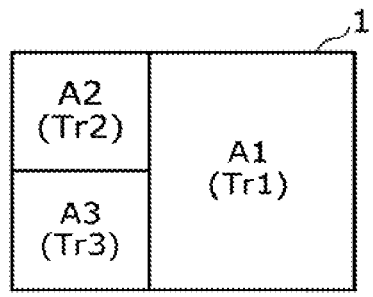
FIG. 7A is a plan view of the semiconductor device according to Embodiment 1.
Figure 7B:
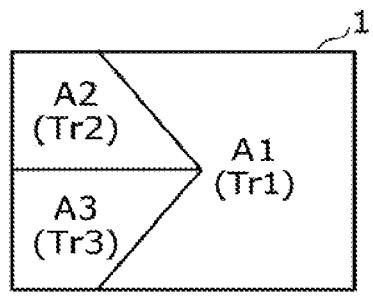
FIG. 7B is a plan view of the semiconductor device according to Embodiment 1.

FIG. 7A and FIG. 7B are plan views of examples of geometries of semiconductor device 1 where N is three and the current paths defined by the specifications are (1) the current path flowing between the first vertical MOS transistor (Tr1) and the second vertical MOS transistor (Tr2), (2) the current path flowing between the first vertical MOS transistor (Tr1) and the third vertical MOS transistor (Tr3), and (3) the current path between the second vertical MOS transistor (Tr2) and the third vertical MOS transistor (Tr3).

According to the geometry of semiconductor device 1 illustrated in FIG. 7A, the boundary line between Tr1 and Tr2, the boundary line between Tr1 and Tr3, and the boundary line between Tr2 and Tr3 are parallel to any of the four sides of semiconductor device 1 in a plan view of semiconductor layer 40.

In contrast, according to the geometry of semiconductor device 1 illustrated in FIG. 7B, the boundary line between Tr1 and Tr2 and the boundary line between Tr1 and Tr3 are not parallel to any of the four sides of semiconductor device 1 in a plan view of semiconductor layer 40. Stated differently, the boundary line between Tr1 and Tr2 and the boundary line between Tr1 and Tr3 are oblique to each of the four sides of semiconductor device 1.

Thus, in a plan view of semiconductor layer 40, the boundary line between Tr1 and Tr2 in the geometry of semiconductor device 1 illustrated in FIG. 7B is longer than the boundary line between Tr1 and Tr2 in the geometry of semiconductor device 1 illustrated in FIG. 7A, and the boundary line between Tr1 and Tr3 in the geometry of semiconductor device 1 illustrated in FIG. 7B is longer than the boundary line between Tr1 and Tr3 in the geometry of semiconductor device 1 illustrated in FIG. 7A. Furthermore, the boundary line between Tr2 and Tr3 in the geometry of semiconductor device 1 illustrated in FIG. 7B is longer than the boundary line between Tr2 and Tr3 in the geometry of semiconductor device 1 illustrated in FIG. 7A.

Therefore, the geometry of semiconductor device 1 illustrated in FIG. 7B can be said to be preferable to the geometry of semiconductor device 1 illustrated in FIG. 7A.

In a plan view of semiconductor layer 40, in each of the one or more current paths defined by the specifications, the boundary line between the first inlet/outlet vertical MOS transistor located at the inlet or the outlet of the current path and the second inlet/outlet vertical MOS transistor located at the outlet or the inlet of the current path preferably consists of alternately connected one or more line segments parallel to a first of the four sides of semiconductor device 1 and one or more line segments parallel to a second of the four sides of semiconductor 1 that is orthogonal to the first side rather than consisting of a single line segment parallel to any of the four sides of semiconductor device 1.

This allows a wide area for current to flow between the first and second inlet/outlet vertical MOS transistors. Stated differently, the conduction resistance of the current path defined by the first and second inlet/outlet vertical MOS transistors can be low.

Similar to FIG. 4A, FIG. 4B, FIG. 5, and FIG. 6, FIG. 8 is a plan view of one example of a geometry of semiconductor device 1 where N is three and the current paths defined by the specifications are (1) the current path flowing between the first vertical MOS transistor (Tr1) and the second vertical MOS transistor (Tr2) and (2) the current path flowing between the first vertical MOS transistor (Tr1) and the third vertical MOS transistor (Tr3), and (3) the current path between the second vertical MOS transistor (Tr2) and the third vertical MOS transistor (Tr3) is a current path not defined by the specifications.

Figure 8:
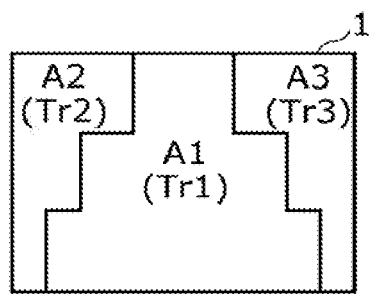
FIG. 8 is a plan view of the semiconductor device according to Embodiment 1.

According to the geometry of semiconductor device 1 illustrated in FIG. 8, in a plan view of semiconductor layer 40, the boundary line between Tr1 and Tr2 and the boundary line between Tr1 and Tr3 consist of alternately connected one or more line segments parallel to a first of the four sides of semiconductor device 1 and one or more line segments parallel to a second of the four sides of semiconductor 1 that is orthogonal to the first side. In other words, these boundary lines are step-shaped in a plan view of semiconductor layer 40.

In contrast, according to the geometry of semiconductor device 1 illustrated in FIG. 4A, the boundary line between Tr1 and Tr2 and the boundary line between Tr1 and Tr3 each consist of a single line segment parallel to any of the four sides of semiconductor device 1 in a plan view of semiconductor layer 40.

Thus, in a plan view of semiconductor layer 40, the boundary line between Tr1 and Tr2 in the geometry of semiconductor device 1 illustrated in FIG. 8 is longer than the boundary line between Tr1 and Tr2 in the geometry of semiconductor device 1 illustrated in FIG. 4A, and the boundary line between Tr1 and Tr3 in the geometry of semiconductor device 1 illustrated in FIG. 8 is longer than the boundary line between Tr1 and Tr3 in the geometry of semiconductor device 1 illustrated in FIG. 4A.

Therefore, the geometry of semiconductor device 1 illustrated in FIG. 8 can be said to be preferable to the geometry of semiconductor device 1 illustrated in FIG. 4A.

Figure 9:
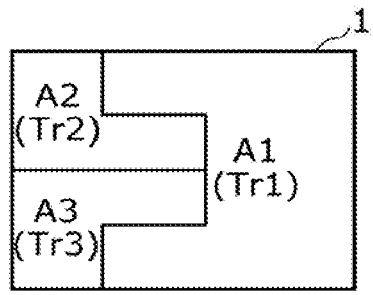
FIG. 9 is a plan view of the semiconductor device according to Embodiment 1.

Just like FIG. 7A and FIG. 7B, FIG. 9 is a plan view of one example of a geometry of semiconductor device 1 where N is three and the current paths defined by the specifications are (1) the current path flowing between the first vertical MOS transistor (Tr1) and the second vertical MOS transistor (Tr2), (2) the current path flowing between the first vertical MOS transistor (Tr1) and the third vertical MOS transistor (Tr3), and (3) the current path between the second vertical MOS transistor (Tr2) and the third vertical MOS transistor (Tr3).

According to the geometry of semiconductor device 1 illustrated in FIG. 9, in a plan view of semiconductor layer 40, the boundary line between Tr1 and Tr2 and the boundary line between Tr1 and Tr3 consist of alternately connected one or more line segments parallel to a first of the four sides of semiconductor device 1 and one or more line segments parallel to a second of the four sides of semiconductor 1 that is orthogonal to the first side. In other words, these boundary lines are step-shaped in a plan view of semiconductor layer 40.

In contrast, according to the geometry of semiconductor device 1 illustrated in FIG. 7A, the boundary line between Tr1 and Tr2 and the boundary line between Tr1 and Tr3 each consist of a single line segment parallel to any of the four sides of semiconductor device 1 in a plan view of semiconductor layer 40.

Thus, in a plan view of semiconductor layer 40, the boundary line between Tr1 and Tr2 in the geometry of semiconductor device 1 illustrated in FIG. 9 is longer than the boundary line between Tr1 and Tr2 in the geometry of semiconductor device 1 illustrated in FIG. 7A, and the boundary line between Tr1 and Tr3 in the geometry of semiconductor device 1 illustrated in FIG. 9 is longer than the boundary line between Tr1 and Tr3 in the geometry of semiconductor device 1 illustrated in FIG. 7A. Furthermore, the boundary line between Tr2 and Tr3 in the geometry of semiconductor device 1 illustrated in FIG. 9 is longer than the boundary line between Tr2 and Tr3 in the geometry of semiconductor device 1 illustrated in FIG. 7A.

Therefore, the geometry of semiconductor device 1 illustrated in FIG. 9 can be said to be preferable to the geometry of semiconductor device 1 illustrated in FIG. 7A.

1-4. Specific Examples of Semiconductor Device Geometry

Hereinafter, specific examples of the geometry of semiconductor device 1 will be given with reference to the drawings.

In the following figures, XA (where X is a number) refers to the maximum specified current [A] of the vertical MOS transistor positioned in that location.

FIG. 10A, FIG. 10B, FIG. 10C, and FIG. 10D are plan views of semiconductor device 1 where N is three.

The surface area of first vertical MOS transistor 10 in a plan view of semiconductor layer 40 is denoted as S1, the surface area of second vertical MOS transistor 20 in a plan view of semiconductor layer 40 is denoted as S2, . . . , and the surface area of the $N^{th}$ vertical MOS transistor in a plan view of semiconductor layer 40 is denoted as SN.

Figure 10A:
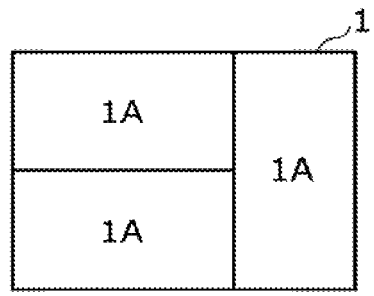
FIG. 10A is a plan view of the semiconductor device according to Embodiment 1.

FIG. 10A is one example of a case in which I1=I2=I3. In this example, I1=1 [A], I2=1 [A], and I3=1 [A]. Accordingly, S1:S2:S3=$1^2$:$1^2$:$1^2$.

Figure 10B:
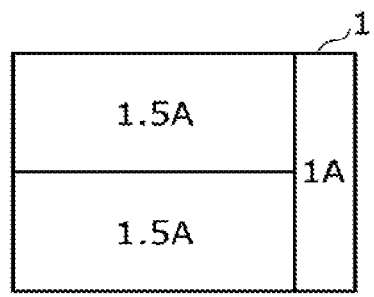
FIG. 10B is a plan view of the semiconductor device according to Embodiment 1.

FIG. 10B is one example of a case in which I1=I2>I3. In this example, I1=1.5 [A], I2=1.5 [A], and I3=1 [A]. Accordingly, S1:S2:S3=$1.5^2$:$1.5^2$:$1^2$.

Figure 10C:
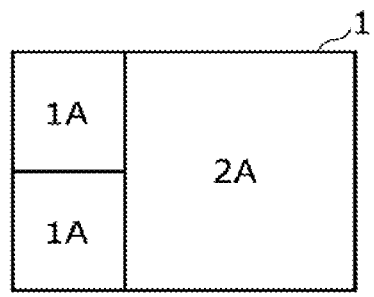
FIG. 10C is a plan view of the semiconductor device according to Embodiment 1.

FIG. 10C is one example of a case in which I1>I2=I3. In this example, I1=2 [A], I2=1 [A], and I3=1 [A]. Accordingly, S1:S2:S3=$2^2$:$1^2$:$1^2$.

Figure 10D:
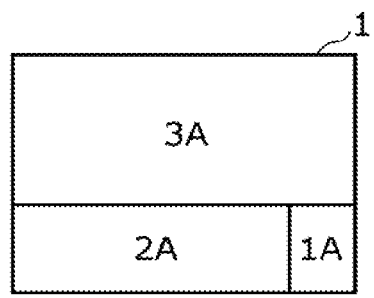
FIG. 10D is a plan view of the semiconductor device according to Embodiment 1.

FIG. 10D is one example of a case in which I1>I2>I3. In this example, I1=3 [A], I2=2 [A], and I3=1 [A]. Accordingly, S1:S2:S3=$3^2$:$2^2$:$1^2$.

FIG. 11A, FIG. 11B, FIG. 11C, FIG. 11D, FIG. 11E, FIG. 11F, FIG. 11G, FIG. 11H, FIG. 11I, and FIG. 11J are plan views of semiconductor device 1 where N is four.

Figure 11A:
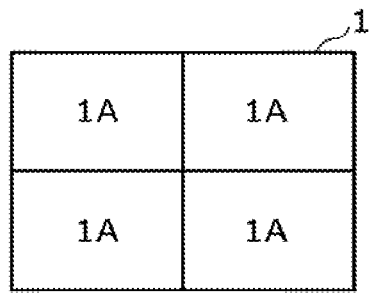
FIG. 11A is a plan view of the semiconductor device according to Embodiment 1.
Figure 11B:
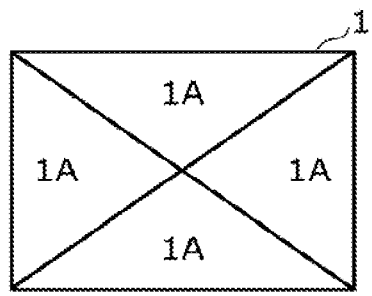
FIG. 11B is a plan view of the semiconductor device according to Embodiment 1.

FIG. 11A and FIG. 11B are examples of a case in which I1=I2=I3=I4. In these examples, I1=1 [A], I2=1 [A], I3=1 [A], and I4=1 [A]. Accordingly, S1:S2:S3:S4=$1^2$:$1^2$:$1^2$:$1^2$.

Figure 11C:
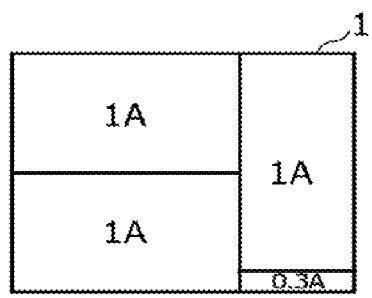
FIG. 11C is a plan view of the semiconductor device according to Embodiment 1.
Figure 11D:
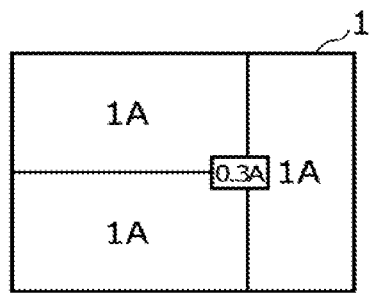
FIG. 11D is a plan view of the semiconductor device according to Embodiment 1.

FIG. 11C and FIG. 11D are examples of a case in which I1=I2=I3>I4. In these examples, I1=1 [A], I2=1 [A], I3=1 [A], and I4=0.3 [A]. Accordingly, S1:S2:S3:S4=$1^2$:$1^2$:$1^2$:$0.3^2$.

Figure 11E:
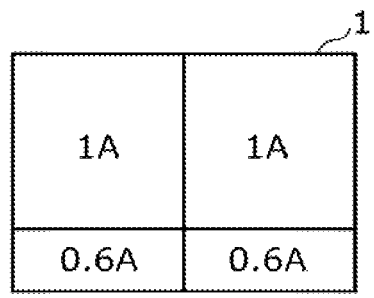
FIG. 11E is a plan view of the semiconductor device according to Embodiment 1.

FIG. 11E is one example of a case in which I1=I2>I3=I4. In this example, I1=1 [A], I2=1 [A], I3=0.6 [A], and I4=0.6 [A]. Accordingly, S1:S2:S3:S4=$1^2$:$1^2$:$0.6^2$:$0.6^2$.

Figure 11F:
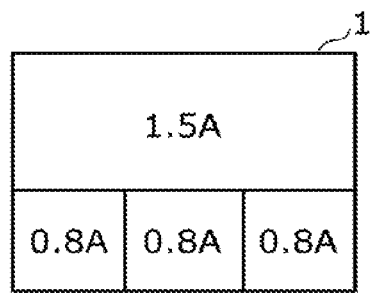
FIG. 11F is a plan view of the semiconductor device according to Embodiment 1.

FIG. 11F is one example of a case in which I1>I2=I3=I4 and I1≠I2+I3+I4. In this example, I1=1.5 [A], I2=0.8 [A], I3=0.8 [A], and I4=0.8 [A]. Accordingly, S1:S2:S3:S4=$1.5^2$:$0.8^2$:$0.8^2$:$0.8^2$.

Figure 11G:
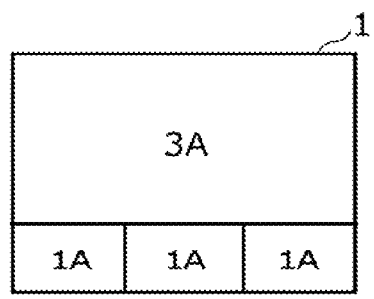
FIG. 11G is a plan view of the semiconductor device according to Embodiment 1.

FIG. 11G is one example of a case in which I1>I2=I3=I4 and I1=I2+I3+I4. In this example, I1=3 [A], I2=1 [A], I3=1 [A], and I4=1 [A]. Accordingly, S1:S2:S3:S4=$3^2$:$1^2$:$1^2$:$1^2$.

Figure 11H:
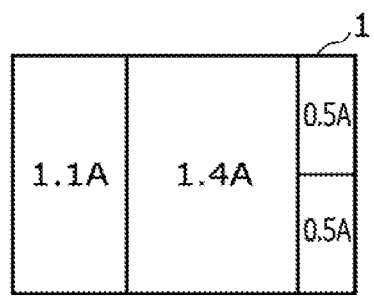
FIG. 11H is a plan view of the semiconductor device according to Embodiment 1.

FIG. 11H is one example of a case in which I1>I2>I3=I4. In this example, I1=1.4 [A], I2=1.1 [A], I3=0.5 [A], and I4=0.5 [A]. Accordingly, S1:S2:S3:S4=$1.4^2$:$1.1^2$:$0.5^2$:$0.5^2$.

Figure 11I:
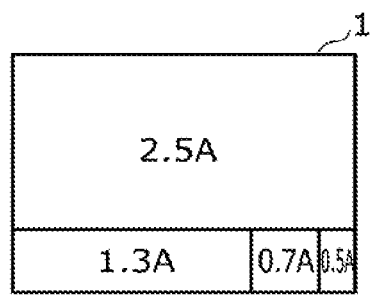
FIG. 11I is a plan view of the semiconductor device according to Embodiment 1.

FIG. 11I is one example of a case in which I1>I2>I3>I4 and I1=I2+I3+I4. In this example, I1=2.5 [A], I2=1.3 [A], I3=0.7 [A], and I4=0.5 [A]. Accordingly, S1:S2:S3:S4=$2.5^2$:$1.3^2$:$0.7^2$:$0.5^2$.

Figure 11J:
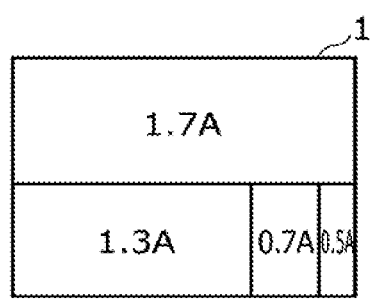
FIG. 11J is a plan view of the semiconductor device according to Embodiment 1.

FIG. 11J is one example of a case in which I1>I2>I3>I4 and I1≠I2+I3+I4. In this example, I1=1.7 [A], I2=1.3 [A], I3=0.7 [A], and I4=0.5 [A]. Accordingly, S1:S2:S3:S4=$1.7^2$:$1.32^.0$:$0.7^2$:$0.5^2$.

Hereinafter, semiconductor device 1 in which the maximum specified currents of N vertical MOS transistors meet a specific condition will be described. For convenience, this semiconductor device 1 is also referred to as a first specific semiconductor device.

The first specific semiconductor device refers to semiconductor device 1 in which one of the N vertical MOS transistors is a specific vertical MOS transistor that satisfies the following condition: the maximum specified current is equal to the sum of the maximum specified currents of K (K is an integer greater than or equal to two and less than or equal to N−1) vertical MOS transistors among the N vertical MOS transistors.

Such a first specific semiconductor device is suitable in cases where the current flowing to the specific vertical MOS transistor becomes the maximum specified current of that specific vertical MOS transistor when the maximum specified currents of the K vertical MOS transistors are applied to the respective current paths between the specific vertical MOS transistor and the K vertical MOS transistors.

Specific examples of the geometry of the first specific semiconductor device where N is 4 are illustrated in, for example, FIG. 11G and FIG. 11I.

Hereinafter, semiconductor device 1 in which the maximum specified current of N vertical MOS transistors and the number and geometry of the source pads meet specific conditions will be described. For convenience, this semiconductor device 1 is also referred to as a second specific semiconductor device.

The second specific semiconductor device refers to semiconductor device 1 in which at least one of the N vertical MOS transistors is a specific vertical MOS transistor that satisfies the following conditions: (i) the at least one specific vertical MOS transistor includes a single source pad; (ii) the gate pad and the source pad included in the at least one specific vertical MOS transistor are circular in a plan view of semiconductor layer 40; and (iii) there is no gate pad or source pad included in the N vertical MOS transistors that is significantly smaller in surface area than the gate pad and the source pad of the at least one specific vertical MOS transistor.

Such a second specific semiconductor device is suitable in cases where the specific vertical MOS transistor is used as a transistor for monitoring the voltage of the common drain region of the N vertical MOS transistors. This is because it is sufficient if the specific vertical MOS transistor includes the minimum number of source pads required (i.e., one) and the one source pad is of minimum size, since the specific vertical MOS transistor does not need to carry a large current and only needs to carry a small current. This is also because the region for the source pads of other vertical MOS transistors is maximized due to the specific vertical MOS transistor including a single, minimum-size source pad.

Figure 12:
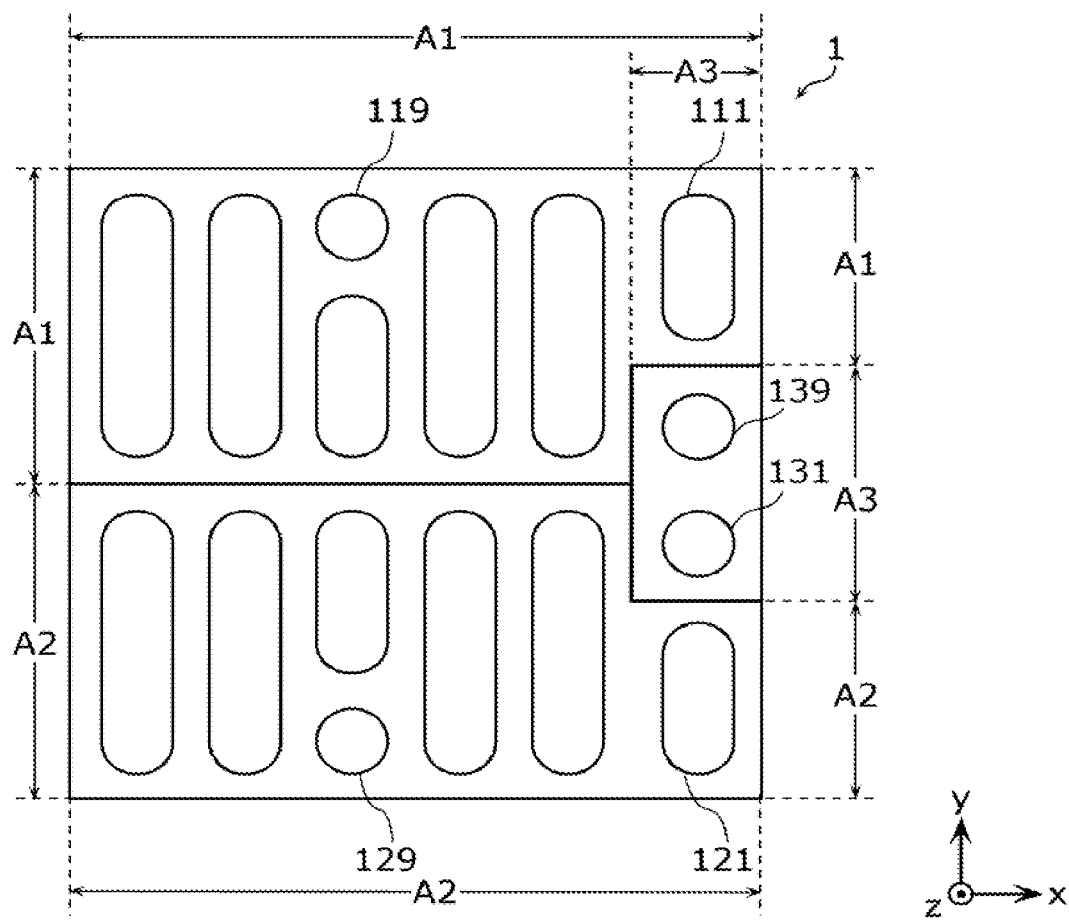
FIG. 12 is a plan view of the semiconductor device according to Embodiment 1.

FIG. 12 is a plan view illustrating one example of the configuration of the source pads of the second specific semiconductor device.

FIG. 12 illustrates an example where N is three and there is a single specific vertical MOS transistor. In this example, the third vertical MOS transistor formed in region A3 is the specific vertical MOS transistor, and the first vertical MOS transistor formed in region A1 and the second vertical MOS transistor formed in region A2 are vertical MOS transistors that are not specific vertical MOS transistors.

As illustrated in FIG. 12, the third vertical MOS transistor, which is the specific vertical MOS transistor, includes only one source pad, namely third source pad 131, and in a plan view of semiconductor layer 40, there is no source pad or gate pad included in the three vertical MOS transistors that is significantly smaller in surface area than either of third source pad 131 or third gate pad 139 of the third vertical MOS transistor, which is the specific vertical MOS transistor.

Hereinafter, specific examples of the geometry of the second specific semiconductor device will be given with reference to the drawings.

Figure 13A:
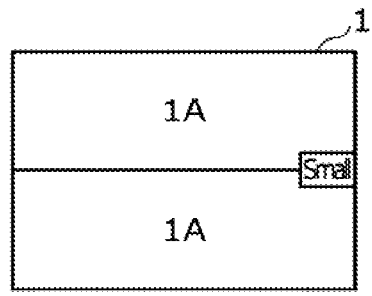
FIG. 13A is a plan view of the semiconductor device according to Embodiment 1.
Figure 13B:
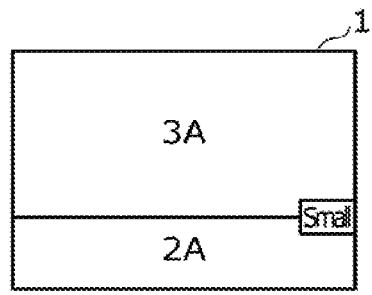
FIG. 13B is a plan view of the semiconductor device according to Embodiment 1.

FIG. 13A and FIG. 13B are plan views of semiconductor device 1 where N is three and semiconductor device 1 includes a single specific vertical MOS transistor, namely the third vertical MOS transistor.

FIG. 13A is one example of a case in which I1=I2. In this example, I1=1 [A], I2=1 [A], and I3<<1 [A].

FIG. 13B is one example of a case in which I1>I2. In this example, I1=3 [A], I2=2 [A], and I3<<1 [A].

Figure 14A:
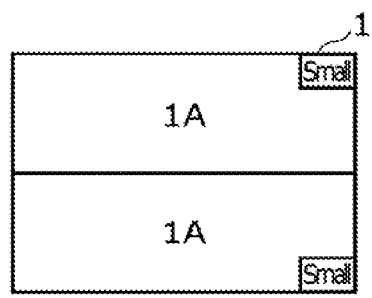
FIG. 14A is a plan view of the semiconductor device according to Embodiment 1.
Figure 14B:
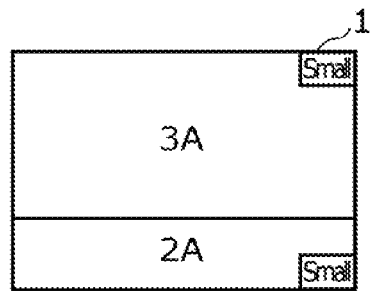
FIG. 14B is a plan view of the semiconductor device according to Embodiment 1.

FIG. 14A and FIG. 14B are plan views of semiconductor device 1 where N is four and semiconductor device 1 includes two specific vertical MOS transistors, namely the third vertical MOS transistor and the fourth vertical MOS transistor.

FIG. 14A is one example of a case in which I1=I2. In this example, I1=1 [A], I2=1 [A], I3<<1 [A], and I4<<1 [A].

FIG. 14B is one example of a case in which I1>I2. In this example, I1=3 [A], I2=2 [A], I3<<1 [A], and I4<<1 [A].

Hereinafter, preferred positioning of the gate pads in semiconductor device 1 will be described.

When (1) among the N vertical MOS transistors, in a first current path defined by the specifications, a first inlet/outlet vertical MOS transistor located at the inlet or the outlet of the first current path and a second inlet/outlet vertical MOS transistor located at the outlet or the inlet of the first current path are adjacent to each another in a plan view of semiconductor layer 40, (2) among the N vertical MOS transistors, in a second current path defined by the specifications, the first inlet/outlet vertical MOS transistor located at the inlet or the outlet of the second current path and a third inlet/outlet vertical MOS transistor located at the outlet or the inlet of the second current path are adjacent to each other in a plan view of semiconductor layer 40, and (3) among the N vertical MOS transistors, in a third current path defined by the specifications, the second inlet/outlet vertical MOS transistor located at the inlet or the outlet of the third current path and the third inlet/outlet vertical MOS transistor located at the outlet or the inlet of the third current path are adjacent to each other in a plan view of semiconductor layer 40, the gate pad of the third inlet/outlet vertical MOS transistor is preferably located on an extension of the boundary line between the first inlet/outlet vertical MOS transistor and the second inlet/outlet vertical MOS transistor.

Figure 15:
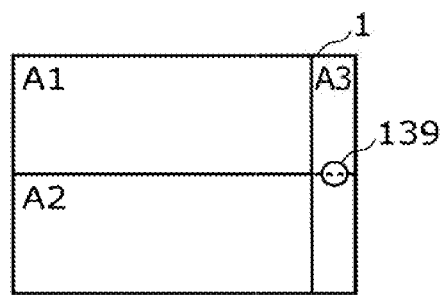
FIG. 15 is a plan view of the semiconductor device according to Embodiment 1.

FIG. 15 is a plan view of semiconductor device 1 where N is three and gate pad 139 of the third inlet/outlet vertical MOS transistor is disposed in the above-described preferred location.

As illustrated in FIG. 15, gate pad 139 of the third inlet/outlet vertical MOS transistor, which is the third vertical MOS transistor, is located on an extension of the boundary line between the first inlet/outlet vertical MOS transistor and the second inlet/outlet vertical MOS transistor in a plan view of semiconductor layer 40.

Disposing gate pad 139 of the third inlet/outlet vertical MOS transistor in this location makes it possible to maximize the region for disposing source pad 131 of the third inlet/outlet vertical MOS transistor in third region A3 on the second and third current paths in a plan view of semiconductor layer 40, which in turn makes it possible to inhibit the resistance value of the second and third current paths.

Here, if the maximum specified current of the third inlet/outlet vertical MOS transistor is smaller than the maximum specified current of the first inlet/outlet vertical MOS transistor and smaller than the maximum specified current of the second inlet/outlet vertical MOS transistor, the gate pad of the first inlet/outlet vertical MOS transistor is preferably not disposed near the boundary between the first inlet/outlet vertical MOS transistor and the third inlet/outlet vertical MOS transistor, and the gate pad of the second inlet/outlet vertical MOS transistor is preferably not disposed near the boundary between the second inlet/outlet vertical MOS transistor and the third inlet/outlet vertical MOS transistor.

Figure 16:
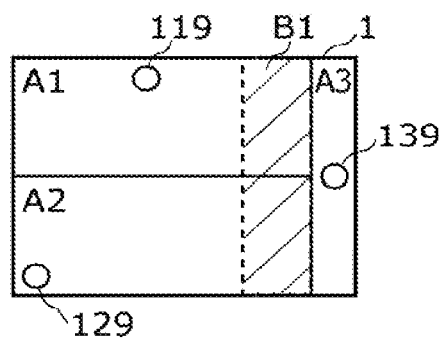
FIG. 16 is a plan view of the semiconductor device according to Embodiment 1.

FIG. 16 is a plan view of semiconductor device 1 illustrated in FIG. 15, showing a region in which disposing gate pad 119 of the first inlet/outlet vertical MOS transistor and gate pad 129 of the second inlet/outlet vertical MOS transistor is not preferable when the maximum specified current of the third inlet/outlet vertical MOS transistor is smaller than the maximum specified current of the first inlet/outlet vertical MOS transistor and smaller than the maximum specified current of the second inlet/outlet vertical MOS transistor.

In FIG. 16, region B1 is the region in which disposing gate pad 119 of the first inlet/outlet vertical MOS transistor and gate pad 129 of the second inlet/outlet vertical MOS transistor is not preferable.

Note that when the width of the first inlet/outlet vertical MOS transistor in a direction orthogonal to the boundary line between the first inlet/outlet vertical MOS transistor and the second inlet/outlet vertical MOS transistor is larger than twice the diameter of gate pad 119 of the first inlet/outlet vertical MOS transistor in a plan view of semiconductor layer 40, gate pad 119 of the first inlet/outlet vertical MOS transistor is additionally preferably not disposed near the boundary between the first inlet/outlet vertical MOS transistor and the second inlet/outlet vertical MOS transistor.

By not disposing gate pad 119 of the first inlet/outlet vertical MOS transistor in the above-described location, gate pad 119 can be inhibited from interfering with the current that flows in first current path, which makes it possible to inhibit the resistance value of the first current path.

Similarly, when the width of the second inlet/outlet vertical MOS transistor in a direction orthogonal to the boundary line between the first inlet/outlet vertical MOS transistor and the second inlet/outlet vertical MOS transistor is larger than twice the diameter of gate pad 129 of the second inlet/outlet vertical MOS transistor in a plan view of semiconductor layer 40, gate pad 129 of the second inlet/outlet vertical MOS transistor is additionally preferably not disposed near the boundary between the first inlet/outlet vertical MOS transistor and the second inlet/outlet vertical MOS transistor.

By not disposing gate pad 129 of the second inlet/outlet vertical MOS transistor in the above-described location, gate pad 129 can be inhibited from interfering with the current that flows in first current path, which makes it possible to inhibit the resistance value of the first current path.

Figure 17:
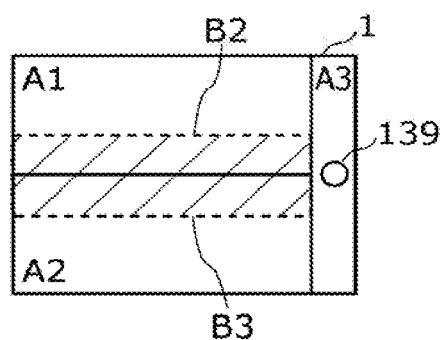
FIG. 17 is a plan view of the semiconductor device according to Embodiment 1.

FIG. 17 is a plan view of semiconductor device 1 illustrated in FIG. 15, showing a region in which disposing gate pad 119 of the first inlet/outlet vertical MOS transistor and gate pad 129 of the second inlet/outlet vertical MOS transistor is not preferable when (i) the width of the first inlet/outlet vertical MOS transistor in a direction orthogonal to the boundary line between the first inlet/outlet vertical MOS transistor and the second inlet/outlet vertical MOS transistor is larger than twice the diameter of gate pad 119 of the first inlet/outlet vertical MOS transistor in a plan view of semiconductor layer 40, and (ii) the width of the second inlet/outlet vertical MOS transistor in a direction orthogonal to the boundary line between the first inlet/outlet vertical MOS transistor and the second inlet/outlet vertical MOS transistor is larger than twice the diameter of gate pad 129 of the second inlet/outlet vertical MOS transistor in a plan view of semiconductor layer 40.

In FIG. 17, region B2 is the region in which disposing gate pad 119 of the first inlet/outlet vertical MOS transistor is not preferable, and region B3 is the region in which disposing gate pad 129 of the second inlet/outlet vertical MOS transistor is not preferable.

When (1) among the N vertical MOS transistors, in a first current path defined by the specifications, a first inlet/outlet vertical MOS transistor located at the inlet or the outlet of the first current path and a second inlet/outlet vertical MOS transistor located at the outlet or the inlet of the first current path are adjacent to each another in a plan view of semiconductor layer 40, (2) among the N vertical MOS transistors, in a second current path defined by the specifications, the second inlet/outlet vertical MOS transistor located at the inlet or the outlet of the second current path and a third inlet/outlet vertical MOS transistor located at the outlet or the inlet of the second current path are adjacent to each other in a plan view of semiconductor layer 40, and (3) the current path defined by the first inlet/outlet vertical MOS transistor and the third inlet/outlet vertical MOS transistor does not correspond to any of the current paths defined by the specifications and the first inlet/outlet vertical MOS transistor and the third inlet/outlet vertical MOS transistor are adjacent to each other in a plan view of semiconductor layer 40, the gate pad of the third inlet/outlet vertical MOS transistor is preferably located nearer to the boundary line between the first inlet/outlet vertical MOS transistor and the third vertical MOS transistor than to the boundary line between the second inlet/outlet vertical MOS transistor and the third vertical MOS transistor.

Figure 18:
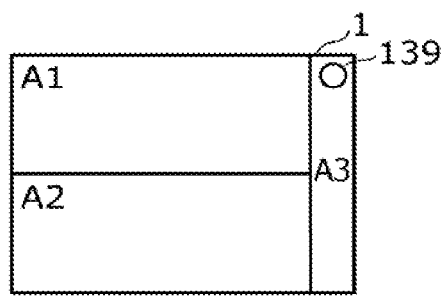
FIG. 18 is a plan view of the semiconductor device according to Embodiment 1.

FIG. 18 is a plan view of semiconductor device 1 where N is three and the gate pad of the third inlet/outlet vertical MOS transistor is disposed in the above-described preferred location.

As illustrated in FIG. 18, gate pad 139 of the third inlet/outlet vertical MOS transistor, which is the third vertical MOS transistor, is located nearer to the boundary line between the first inlet/outlet vertical MOS transistor and the third vertical MOS transistor than to the boundary line between the second inlet/outlet vertical MOS transistor and the third vertical MOS transistor in a plan view of semiconductor layer 40.

Disposing gate pad 139 of the third inlet/outlet vertical MOS transistor in this location makes it possible to maximize the region for disposing the source pad of the third inlet/outlet vertical MOS transistor in third region A3 on the second current path in a plan view of semiconductor layer 40, which in turn makes it possible to inhibit the resistance value of the second current path.

Here, if the maximum specified current of the third inlet/outlet vertical MOS transistor is smaller than the maximum specified current of the first inlet/outlet vertical MOS transistor and smaller than the maximum specified current of the second inlet/outlet vertical MOS transistor, the gate pad of the second inlet/outlet vertical MOS transistor is preferably not disposed near the boundary between the second inlet/outlet vertical MOS transistor and the third inlet/outlet vertical MOS transistor.

Figure 19:
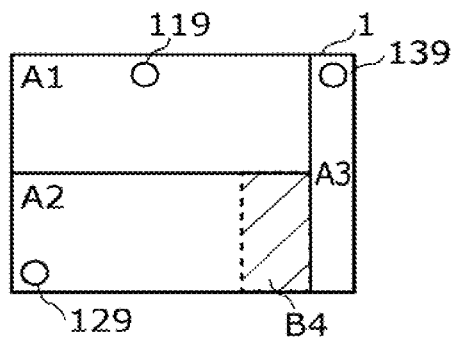
FIG. 19 is a plan view of the semiconductor device according to Embodiment 1.

FIG. 19 is a plan view of semiconductor device 1 illustrated in FIG. 18, showing a region in which disposing gate pad 129 of the second inlet/outlet vertical MOS transistor is not preferable when the maximum specified current of the third inlet/outlet vertical MOS transistor is smaller than the maximum specified current of the first inlet/outlet vertical MOS transistor and smaller than the maximum specified current of the second inlet/outlet vertical MOS transistor.

In FIG. 19, region B4 is the region in which disposing gate pad 129 of the second inlet/outlet vertical MOS transistor is not preferable.

Note that when the width of the second inlet/outlet vertical MOS transistor in a direction orthogonal to the boundary line between the first inlet/outlet vertical MOS transistor and the second inlet/outlet vertical MOS transistor is larger than twice the diameter of gate pad 129 of the second inlet/outlet vertical MOS transistor in a plan view of semiconductor layer 40, gate pad 129 of the second inlet/outlet vertical MOS transistor is additionally preferably not disposed near the boundary between the first inlet/outlet vertical MOS transistor and the second inlet/outlet vertical MOS transistor.

By not disposing gate pad 129 of the second inlet/outlet vertical MOS transistor in the above-described location, gate pad 129 can be inhibited from interfering with the current that flows in first current path, which makes it possible to inhibit the resistance value of the first current path.

Figure 20:
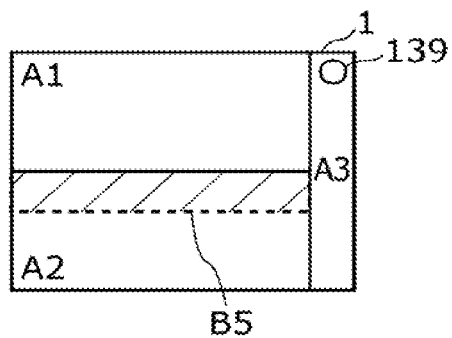
FIG. 20 is a plan view of the semiconductor device according to Embodiment 1.
Figure 21A:
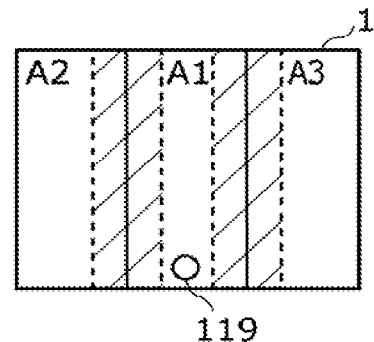
FIG. 21A is a plan view of the semiconductor device according to Embodiment 1.
Figure 21B:
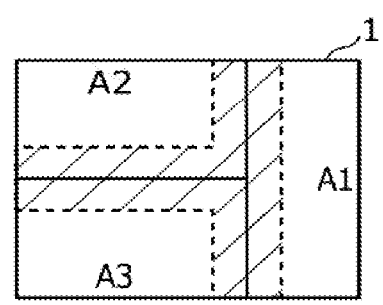
FIG. 21B is a plan view of the semiconductor device according to Embodiment 1.
Figure 21C:
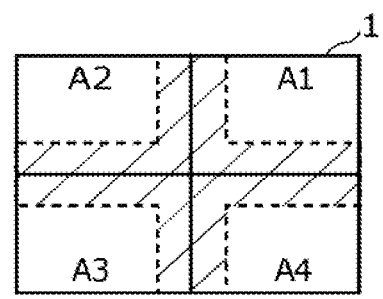
FIG. 21C is a plan view of the semiconductor device according to Embodiment 1.
Figure 21D:
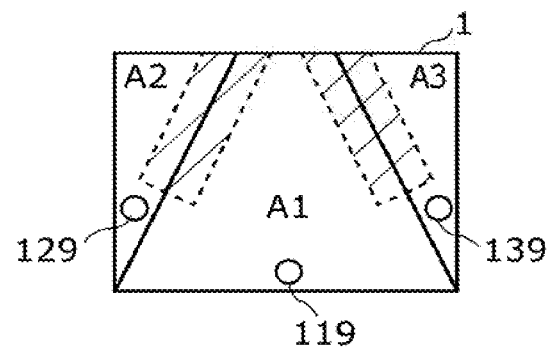
FIG. 21D is a plan view of the semiconductor device according to Embodiment 1.
Figure 21E:
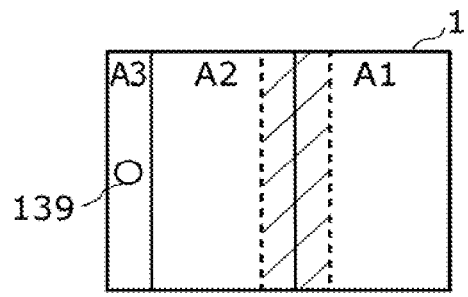
FIG. 21E is a plan view of the semiconductor device according to Embodiment 1.
Figure 21F:
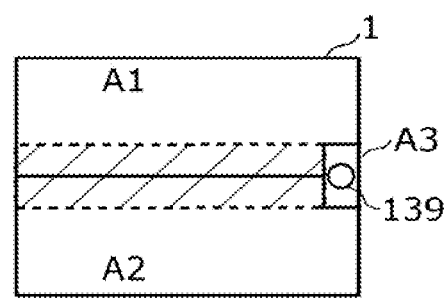
FIG. 21F is a plan view of the semiconductor device according to Embodiment 1.
Figure 21G:
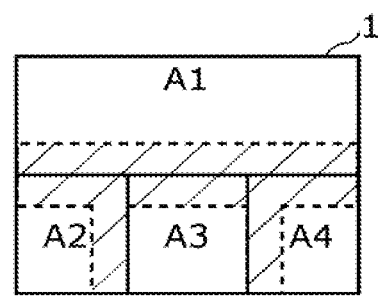
FIG. 21G is a plan view of the semiconductor device according to Embodiment 1.
Figure 21H:
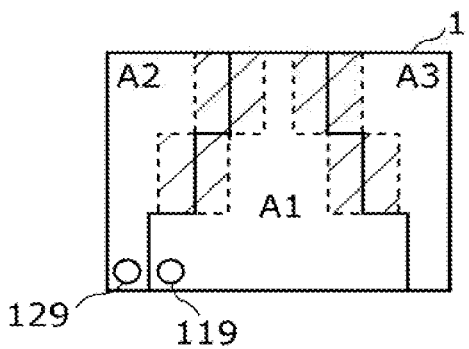
FIG. 21H is a plan view of the semiconductor device according to Embodiment 1.

FIG. 20 is a plan view of semiconductor device 1 illustrated in FIG. 18, showing a region in which disposing gate pad 129 of the second inlet/outlet vertical MOS transistor is not preferable when the width of the second inlet/outlet vertical MOS transistor in a direction orthogonal to the boundary line between the first inlet/outlet vertical MOS transistor and the second inlet/outlet vertical MOS transistor is larger than twice the diameter of gate pad 129 of the second inlet/outlet vertical MOS transistor in a plan view of semiconductor layer 40.

In FIG. 20, region B5 is the region in which disposing gate pad 129 of the second inlet/outlet vertical MOS transistor is not preferable.

Hereinafter, specific examples of regions, of semiconductor devices 1 of various geometries, in which disposing gate pads is not preferable will be given with reference to the drawings.

FIG. 21A, FIG. 21B, FIG. 21C, FIG. 21D, FIG. 21E, FIG. 21F, FIG. 21G, and FIG. 21H are plan views of semiconductor device 1.

In FIG. 21A, FIG. 21B, FIG. 21C, FIG. 21D, FIG. 21E, FIG. 21F, FIG. 21G, and FIG. 21H, regions in which disposing gate pads is not preferable are illustrated as hatched regions.

1-5. Examples of Configurations Including Pads Connected to Common Drain Region Semiconductor device 1 may further include, on the upper surface of semiconductor layer 40, a drain pad connected to the common drain region of the N vertical MOS transistors.

Figure 22A:
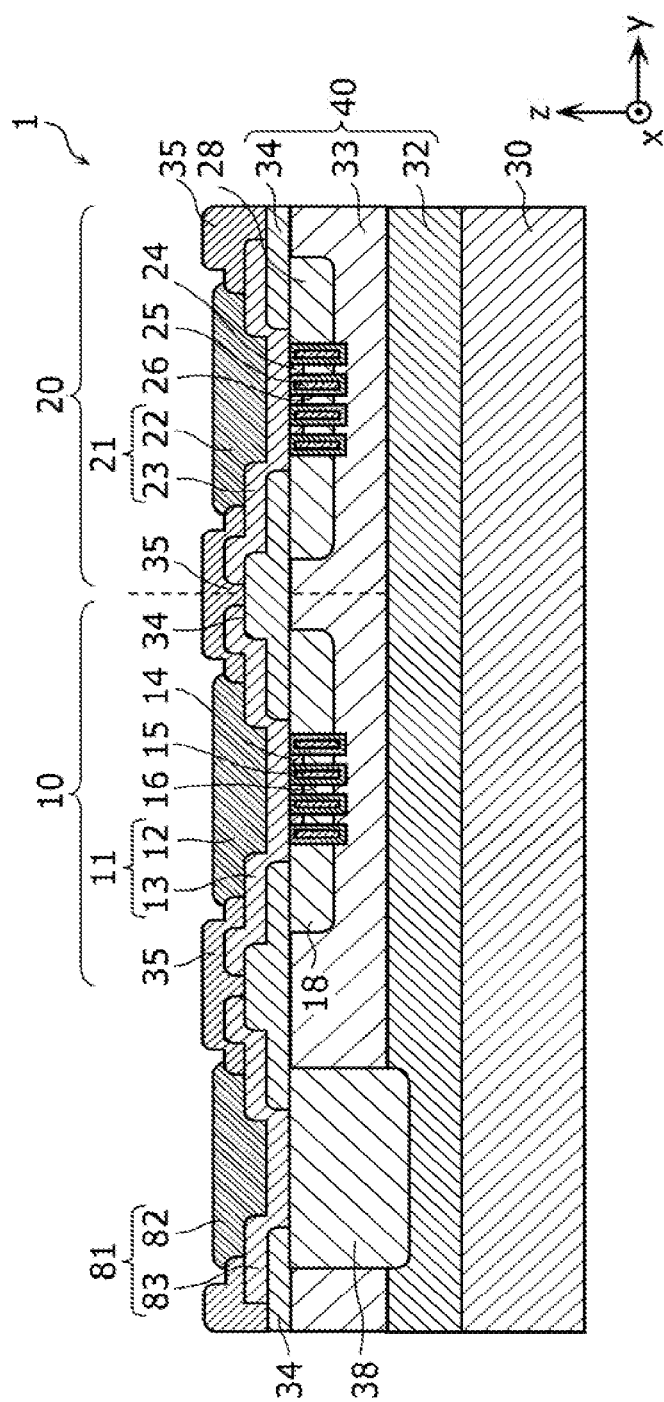
FIG. 22A is a cross-sectional view illustrating one example of the structure of the semiconductor device according to Embodiment 1.
Figure 22B:
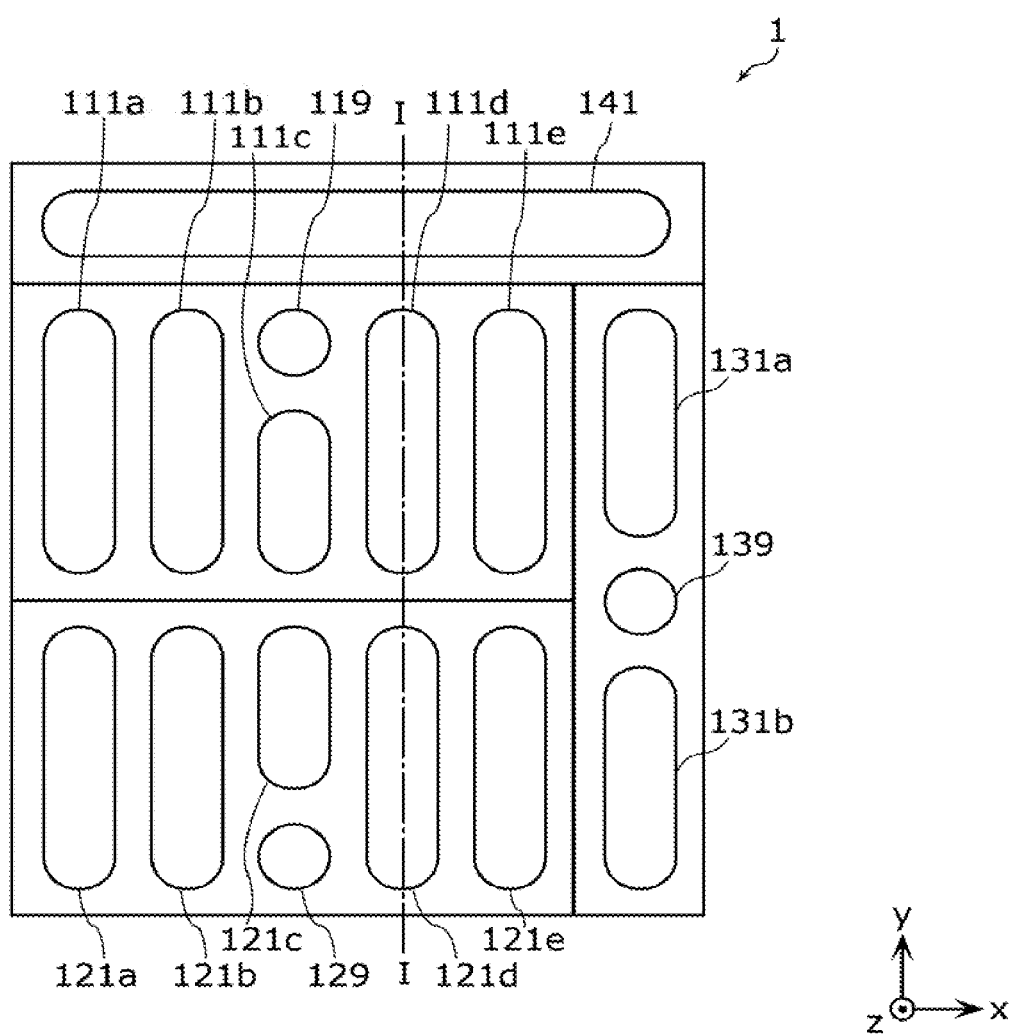
FIG. 22B is a plan view illustrating one example of the structure of the semiconductor device according to Embodiment 1.

FIG. 22A is a cross-sectional view illustrating one example of the structure of semiconductor device 1 further including a drain pad. FIG. 22B is a plan view illustrating one example of the structure of semiconductor device 1 further including a drain pad. The cross-sectional view illustrated in FIG. 22A is taken at I-I in FIG. 22B.

As illustrated in FIG. 22B, semiconductor device 1 may further include drain pad 141.

Semiconductor device 1 that further includes drain pad 141 includes high-concentration impurity layer 38 and drain electrode 81, as illustrated in FIG. 22A.

Drain electrode 81 includes portions 82 and 83, and portion 82 is connected to high-concentration impurity layer 38 (to be described later) via portion 83.

Just like portion 12 of first source electrode 11, portion 82 of drain electrode 81 is a layer that is bonded to solder during reflow in the face-down mounting process. In one non-limiting example, portion 82 may comprise a metal material including one or more of nickel, titanium, tungsten, and palladium. The surface of portion 82 may be plated with, for instance, gold.

Portion 83 of drain electrode 81 is a layer connecting portion 82 and high-concentration impurity layer 38. In one non-limiting example, portion 83 may comprise a metal material including one or more of aluminum, copper, gold, and silver.

Drain pad 141 refers to the region where drain electrode 81 is partially exposed on the upper surface of semiconductor device 1, and is also referred to as a terminal.

High-concentration impurity layer 38 is formed in contact with semiconductor substrate 32, low-concentration impurity layer 33, and portion 83 within semiconductor layer 40, and contains impurities of the first conductivity type at a concentration higher than the concentration of impurities of the first conductivity type contained in semiconductor substrate 32.

Therefore, high-concentration impurity layer 38 electrically connects drain electrode 81 to semiconductor substrate 32 and low-concentration impurity layer 33, which function as the common drain region for the N vertical MOS transistors.

Although heretofore the description has been based on vertical MOS transistors, the present disclosure is not necessarily limited to vertical MOS transistors. Using vertical transistors in place of the vertical MOS transistors is also effective. Vertical transistors include, in addition to vertical MOS transistors, vertical bipolar transistors (BJTs) and vertical insulated gate bipolar transistors (IGBTs). A detailed description of the basic structure and function of BJTs and IGBTs will be omitted as they are well known to those skilled in the art, but their similarity with MOS transistors can be understood as follows. If the vertical transistor is a vertical BJT, in the above description, the term "source" may be replaced with "emitter", the term "drain" may be replaced with "collector", and the term "body" may be replaced with "base". Additionally, the term "gate electrode" may be replaced with "base electrode". If the vertical transistor is a vertical IGBT, in the above description, the term "source" may be replaced with "emitter", and the term "drain" may be replaced with "collector". Note that "vertical" refers to a structure in which a channel is formed in the vertical direction of the semiconductor device and current flows in the vertical direction in the channel.

When semiconductor device 1 includes vertical transistors, semiconductor device 1 may include, instead of a drain pad, a common terminal that is connected to metal layer 30 formed in contact with the lower surface of semiconductor layer 40 (i.e., a common electrode common to the N vertical transistors) and is drawn to the upper surface side of semiconductor layer 40. On the upper surface side of semiconductor layer 40, the N vertical transistors themselves are provided with a control pad (corresponding to the gate pad in the vertical MOS transistor example) that connects to a control electrode (corresponding to the gate electrode in the vertical MOS transistor example) which controls the conduction of the vertical transistor, and one or more external connection pads (corresponding to the source pads in the vertical MOS transistor example) that connect to an external connection electrode (corresponding to the source electrode in the vertical MOS transistor example) through which the N vertical transistors receive current from outside or output current outside. In semiconductor device 1 including N vertical transistors, the common terminal may be used as an external input terminal through which current flows into the N vertical transistors from the outside, and each of the one or more external connection pads of each of the N vertical transistors may be used as an external output terminal through which current flows out from the N vertical transistors to the outside. Of the main surfaces of semiconductor layer 40, one main surface on which the N vertical transistors are formed and the other main surface facing away from the one main surface, the "lower surface" of semiconductor layer 40 refers to the other main surface.

Figure 23:
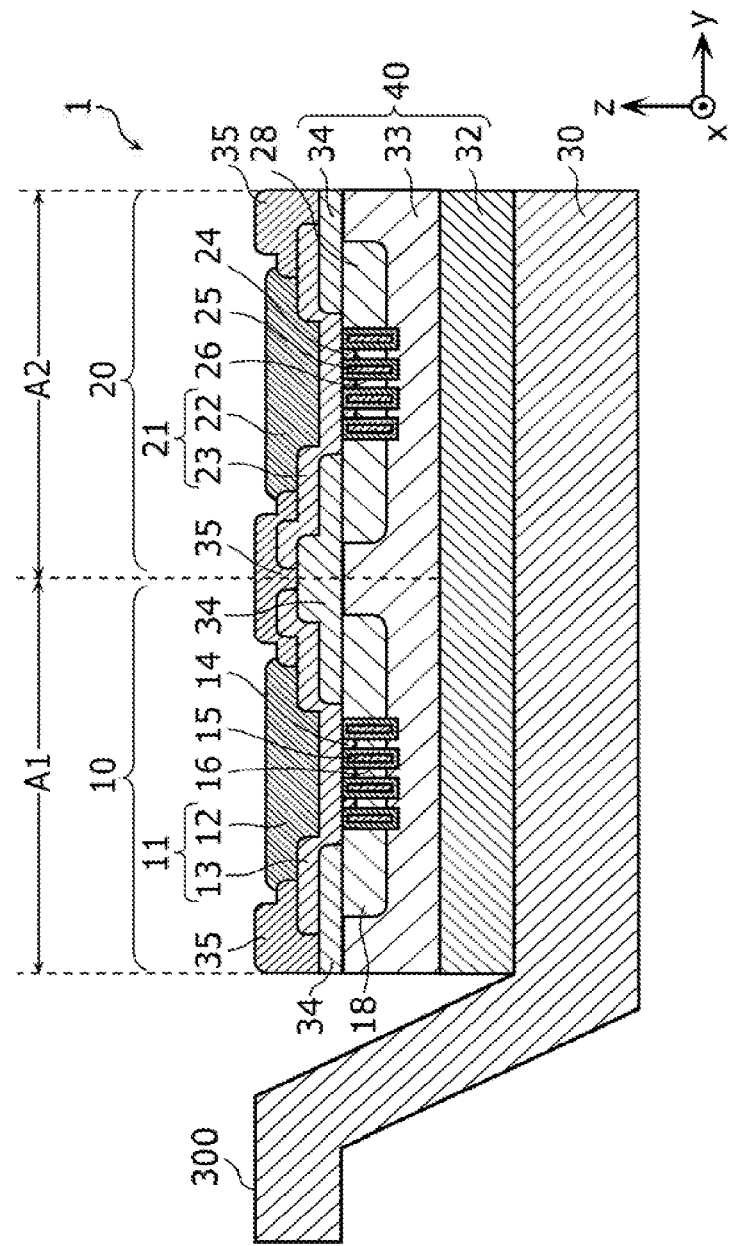
FIG. 23 is a cross-sectional view illustrating one example of the structure of the semiconductor device according to Embodiment 1.

FIG. 23 is a cross-sectional view of one example of the structure of semiconductor device 1 including vertical transistors and further including a common terminal.

As illustrated in FIG. 23, when semiconductor device 1 includes vertical transistors, semiconductor device 1 may further include common terminal 300.

Embodiment 2

Hereinafter, the battery protection system according to Embodiment 2 will be described.

2-1. Battery Protection System Configuration

Figure 24:
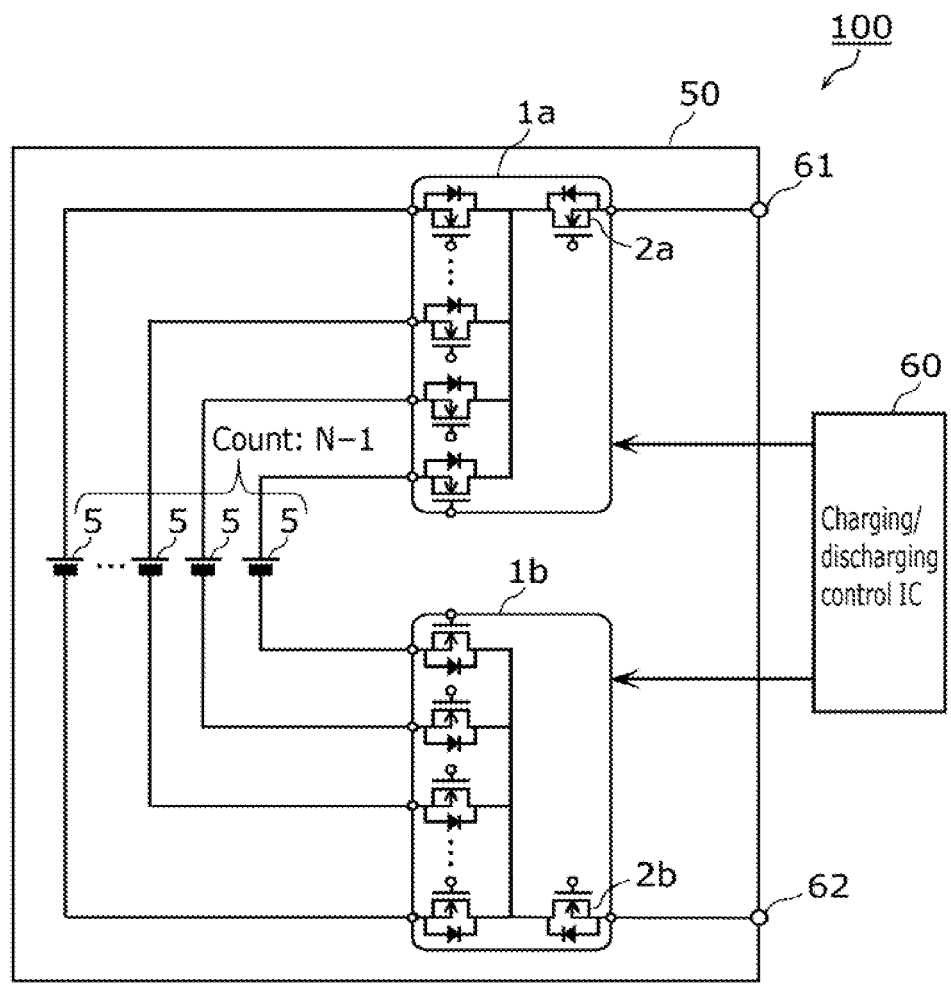
FIG. 24 is a circuit diagram illustrating one example of the configuration of a battery protection system according to Embodiment 2.

FIG. 24 is a circuit diagram illustrating one example of the configuration of battery protection system 100 according to Embodiment 2.

As illustrated in FIG. 24, battery protection system 100 includes battery protection circuit 50 and charging/discharging control IC 60.

Battery protection circuit 50 includes first semiconductor device 1a, second semiconductor device 1b, N−1 battery cells 5, first terminal 61, and second terminal 62.

Charging/discharging control IC 60 controls the charging/discharging of the N−1 battery cells 5 by controlling first semiconductor device 1a and second semiconductor device 1b.

First semiconductor device 1a is semiconductor device 1 described in detail in Embodiment 1, and includes N vertical MOS transistors. The conducting state (ON state) and the non-conducting state (OFF state) of each vertical MOS transistor are controlled by charging/discharging control IC 60.

In FIG. 24 and subsequent figures, arrows extending from the control IC to the semiconductor devices indicate that the signals controlling the semiconductor devices originate from the control IC. In reality, the control IC is electrically connected to the gate pads of the vertical MOS transistors in the semiconductor devices to control the conducting state of each vertical MOS transistor, but arrows are used in FIG. 24 and subsequent figures to avoid overcomplicating the illustrations.

Second semiconductor device 1b is semiconductor device 1 described in detail in Embodiment 1, and includes N vertical MOS transistors. The conducting state and the non-conducting state of each vertical MOS transistor are controlled by charging/discharging control IC 60.

First terminal 61 is connected to the one or more source pads of the single terminal-connected vertical MOS transistor 2a among the N vertical MOS transistors included in first semiconductor device 1a.

Second terminal 62 is connected to the one or more source pads of the single terminal-connected vertical MOS transistor 2b among the N vertical MOS transistors included in second semiconductor device 1b.

Each positive electrode of the N−1 battery cells 5 is connected to the one or more source pads of a different one of the N−1 vertical MOS transistors excluding terminal-connected vertical MOS transistor 2a among the N vertical MOS transistors included in first semiconductor device 1a.

Each negative electrode of the N−1 battery cells 5 is connected to the one or more source pads of a different one of the N−1 vertical MOS transistors excluding terminal-connected vertical MOS transistor 2b among the N vertical MOS transistors included in second semiconductor device 1b.

2-2. Battery Protection System Operations

Hereinafter, operations performed by battery protection system 100 configured as described above will be described.

Figure 25A:
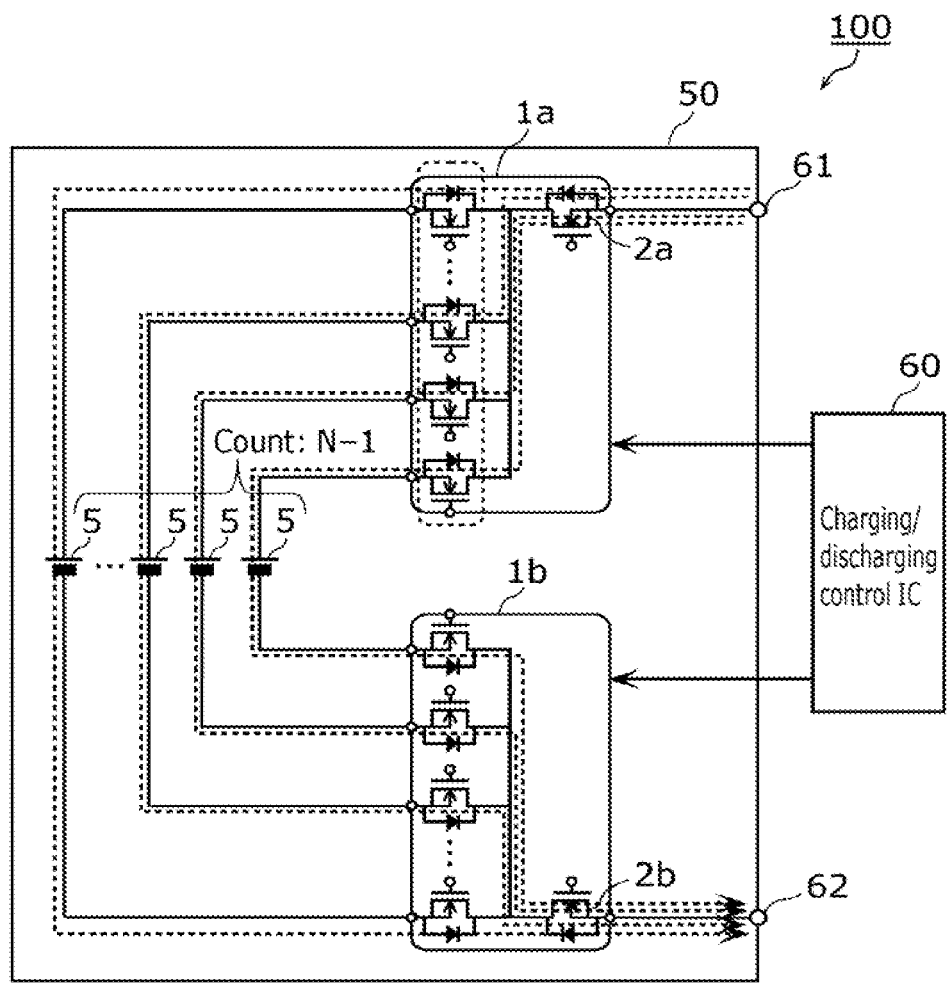
FIG. 25A is a schematic diagram illustrating the battery protection system according to Embodiment 2 charging battery cells.

FIG. 25A is a schematic diagram illustrating battery protection system 100 charging the N−1 battery cells 5. In FIG. 25A, the dashed arrows represent the respective charge paths of the N−1 battery cells 5.

When charging, charging/discharging control IC 60 charges the N−1 battery cells 5 simultaneously and in parallel by placing the N−1 vertical MOS transistors of first semiconductor device 1a (the vertical MOS transistors surrounded by a dashed line in FIG. 25A) excluding terminal-connected vertical MOS transistor 2a in a conducting state and placing terminal-connected vertical MOS transistor 2b of second semiconductor device 1b in a conducting state.

Although not illustrated in FIG. 25A, charging/discharging control IC 60 may selectively charge only one of the N−1 battery cells 5 or a plurality but not all N−1 battery cells 5 simultaneously and in parallel.

When charging/discharging control IC 60 is charging and detects an abnormality related to charging, charging/discharging control IC 60 stops the charging of the N−1 battery cells 5 by switching terminal-connected vertical MOS transistor 2b of second semiconductor device 1b from a conducting state to a non-conducting state.

This protects the N−1 battery cells 5 from the adverse effects of an abnormality related to charging.

Moreover, when charging/discharging control IC 60 is charging and detects an abnormality related to charging, among the N−1 vertical MOS transistors of first semiconductor device 1a (the vertical MOS transistors surrounded by a dashed line in FIG. 25A) excluding terminal-connected vertical MOS transistor 2a, charging/discharging control IC 60 switches the vertical MOS transistor that is connected to battery cell 5 related to the detected abnormality from a conducting state to a non-conducting state to stop the charging of said battery cell 5.

This protects said battery cell 5 from the adverse effects of an abnormality related to charging.

Figure 25B:
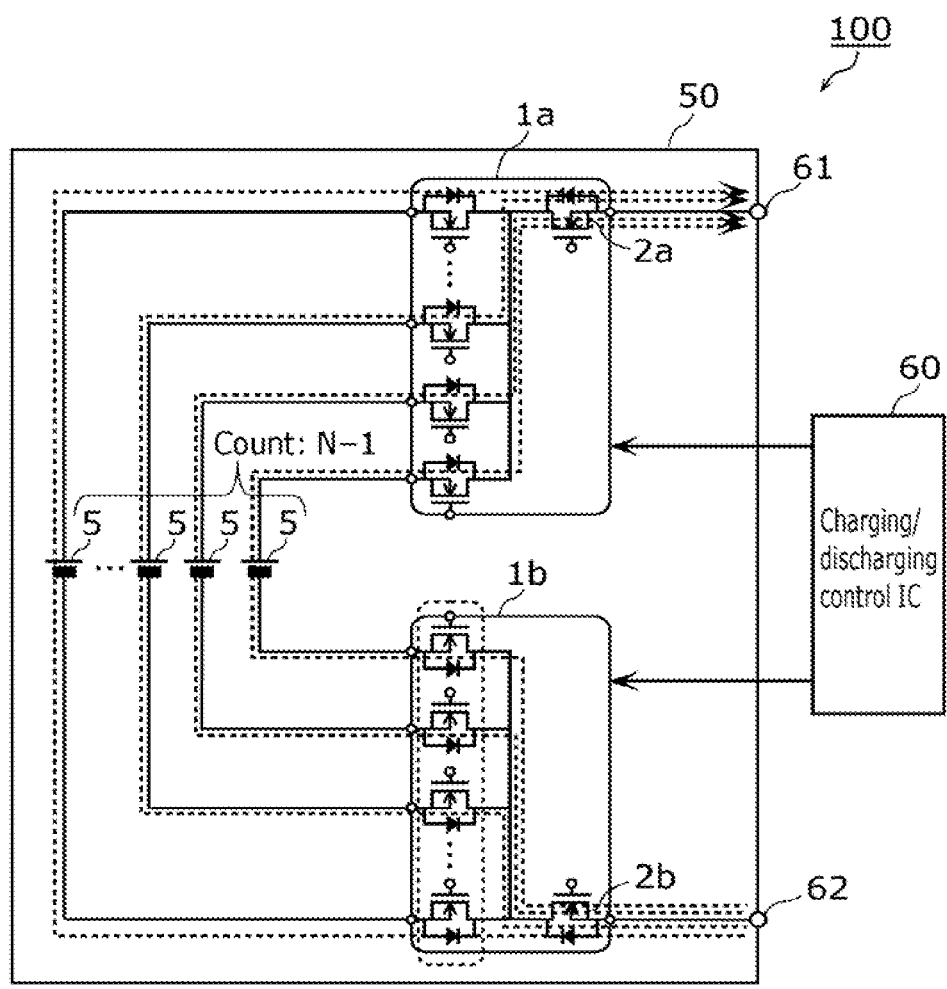
FIG. 25B is a schematic diagram illustrating the battery protection system according to Embodiment 2 discharging battery cells.

FIG. 25B is a schematic diagram illustrating battery protection system 100 discharging the N−1 battery cells 5. In FIG. 25B, the dashed arrows represent the respective discharge paths of the N−1 battery cells 5.

When discharging, charging/discharging control IC 60 discharges the N−1 battery cells 5 simultaneously and in parallel by placing the N−1 vertical MOS transistors of second semiconductor device 1b (the vertical MOS transistors surrounded by a dashed line in FIG. 25B) excluding terminal-connected vertical MOS transistor 2b in a conducting state and placing terminal-connected vertical MOS transistor 2a of first semiconductor device 1a in a conducting state.

Although not illustrated in FIG. 25B, charging/discharging control IC 60 may selectively discharge only one of the N−1 battery cells 5 or a plurality but not all N−1 battery cells 5 simultaneously and in parallel.

When charging/discharging control IC 60 is discharging and detects an abnormality related to discharging, charging/discharging control IC 60 stops the discharging of the N−1 battery cells 5 by switching terminal-connected vertical MOS transistor 2a of first semiconductor device 1a from a conducting state to a non-conducting state.

This protects the N−1 battery cells 5 from the adverse effects of an abnormality related to discharging.

Moreover, when charging/discharging control IC 60 is discharging and detects an abnormality related to discharging, among the N−1 vertical MOS transistors of second semiconductor device 1b (the vertical MOS transistors surrounded by a dashed line in FIG. 25B) excluding terminal-connected vertical MOS transistor 2b, charging/discharging control IC 60 switches the vertical MOS transistor that is connected to battery cell 5 related to the detected abnormality from a conducting state to a non-conducting state to stop the discharging of said battery cell 5.

This protects said battery cell 5 from the adverse effects of an abnormality related to discharging.

Next, semiconductor device 1a according to Embodiment 2 will be discussed. In the product specifications for semiconductor device 1a, among the N vertical MOS transistors, terminal-connected vertical MOS transistor 2a is one inlet/outlet vertical MOS transistor, and the N−1 vertical MOS transistors excluding terminal-connected vertical MOS transistor 2a are the other inlet/outlet vertical MOS transistors, and thus N−1 current paths are defined between the one inlet/outlet vertical MOS transistor and each of the other inlet/outlet vertical MOS transistors. Terminal-connected vertical MOS transistor 2a is either the one inlet/outlet vertical MOS transistor or the other inlet/outlet vertical MOS transistor in each and every defined N−1 current path, i.e., is common to all of the defined N−1 current paths. In Embodiment 2, since the specified N−1 current paths are electrically equivalent, the maximum specified currents (denoted as Ia [A]) of the N−1 vertical MOS transistors excluding terminal-connected vertical MOS transistor 2a are equal. Furthermore, the maximum specified current (denoted as In [A]) of terminal-connected vertical MOS transistor 2a is equal to the sum of the maximum specified currents Ia of each of the N−1 vertical MOS transistors excluding terminal-connected vertical MOS transistor 2a (In=Ia×(N−1)). Accordingly, semiconductor device 1a is the first specific semiconductor device in which terminal-connected vertical MOS transistor 2a is the specific vertical MOS transistor.

The product specifications of semiconductor device 1a state the conduction resistance (on-resistance) of each of the defined N−1 current paths when the maximum specified current In flows through terminal-connected vertical MOS transistor 2a and the maximum specified current Ia flows through each of the N−1 vertical transistors excluding terminal-connected vertical MOS transistor 2a. Since the N−1 current paths are electrically equivalent, each conduction resistance (on-resistance; denoted as Ran [Ω]) is equal. Accordingly, the product specifications may state only one conduction resistance to avoid repetition. The current value used to evaluate conduction resistance (on-resistance) is described in the product specifications for each of the N vertical MOS transistors. The current value used to evaluate conduction resistance (on-resistance) is 50% of the maximum rated current specified for each of the N vertical MOS transistors or a current value less than or equal to said maximum rated current. When evaluating conduction resistance, the current value specified in the product specifications as the current value to be passed through each of the N vertical MOS transistors may be taken as the maximum specified current for each of the N vertical MOS transistors. The maximum rated current for each of the N vertical MOS transistors stated in the product specifications may be taken as the maximum specified current for each of the N vertical MOS transistors.

In order to make the N−1 current paths electrically equivalent, the surface areas (denoted as Sa) of all of the N−1 vertical MOS transistors excluding terminal-connected vertical MOS transistor 2a are preferably equal, and the surface area (denoted as Sn) of terminal-connected vertical MOS transistor 2a is preferably the largest surface area among the N vertical MOS transistors (Sn>Sa). This is because the maximum specified currents of all of the N−1 vertical MOS transistors excluding terminal-connected vertical MOS transistor 2a are equal, and furthermore the maximum specified current of terminal-connected vertical MOS transistor 2a is the largest. More specifically, the relationship Sa:Sn=Ia$^2$:In$^2$ preferably holds true, and the relationship Sa:Sn=1:(N−1)$^2$ preferably holds true. The individual conduction resistances Ra (Ra=Ran×Sn/(Sa+Sn)) of the N−1 vertical MOS transistors excluding terminal-connected vertical MOS transistor 2a when maximum specified current Ia flows, and the individual conduction resistance Rn (Rn=Ran×Sa/(Sa+Sn)) of terminal-connected vertical MOS transistor 2a when maximum specified current In=(Ia×(N−1)) flows preferably satisfy the relationship Ia$^2$:In$^2$=1/Ra:1/Rn. Satisfying this relationship can inhibit localized heat generation in semiconductor device 1a.

In Embodiment 2, although battery protection system 100 is described as including first semiconductor device 1a on the positive electrode side of the N−1 battery cells 5 and second semiconductor device 1b on the negative electrode side, the battery protection system according to Embodiment 2 may include only first semiconductor device 1a on the positive electrode side of the N−1 battery cells 5, and may include only second semiconductor device 1b on the negative electrode side of the N−1 battery cells 5.

Figure 26:
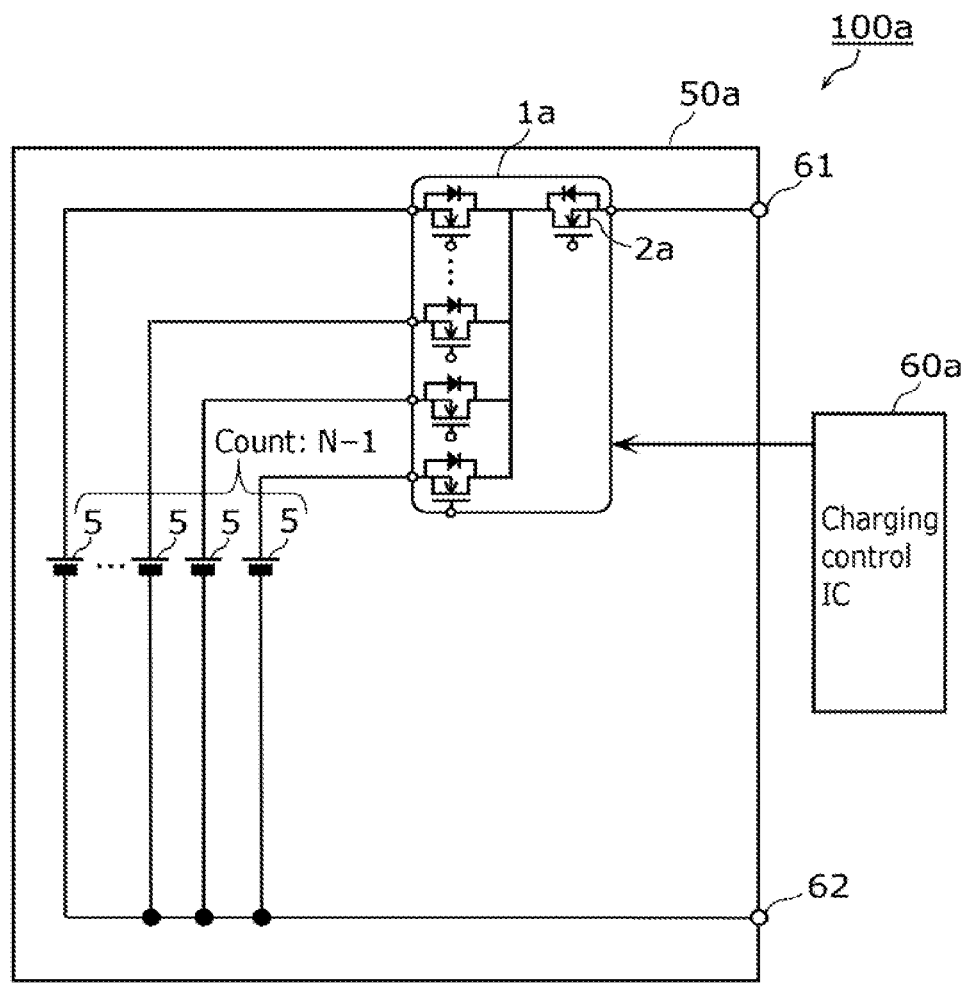
FIG. 26 is a circuit diagram illustrating one example of the configuration of the battery protection system according to Embodiment 2.

FIG. 26 is a circuit diagram illustrating one example of the configuration of battery protection system 100a according to Embodiment 2 including first semiconductor device 1a on the positive electrode side of the N−1 battery cells 5.

As illustrated in FIG. 26, battery protection system 100a differs from battery protection system 100 in that battery protection circuit 50 has been changed to battery protection circuit 50a and charging/discharging control IC 60 has been changed to charging control IC 60a.

Battery protection circuit 50a differs from battery protection circuit 50 in that second semiconductor device 1b has been removed, and what second terminal 62 is connected to has been changed from the one or more source pads of terminal-connected vertical MOS transistor 2b to the negative electrodes of the N−1 battery cells 5.

Charging control IC 60a controls the charging of the N−1 battery cells 5 by controlling first semiconductor device 1a.

When charging, charging control IC 60a charges the N−1 battery cells 5 simultaneously and in parallel by placing the N−1 vertical MOS transistors of first semiconductor device 1a excluding terminal-connected vertical MOS transistor 2a in a conducting state.

Although not illustrated in FIG. 26, charging control IC 60a may selectively charge only one of the N−1 battery cells 5 or a plurality but not all N−1 battery cells 5 simultaneously and in parallel.

Moreover, when charging control IC 60a is charging and detects an abnormality related to charging, among the N−1 vertical MOS transistors of first semiconductor device 1a excluding terminal-connected vertical MOS transistor 2a, charging control IC 60a switches the vertical MOS transistor that is connected to battery cell 5 related to the detected abnormality from a conducting state to a non-conducting state to stop the charging of said battery cell 5.

This protects said battery cell 5 from the adverse effects of an abnormality related to charging.

Figure 27:
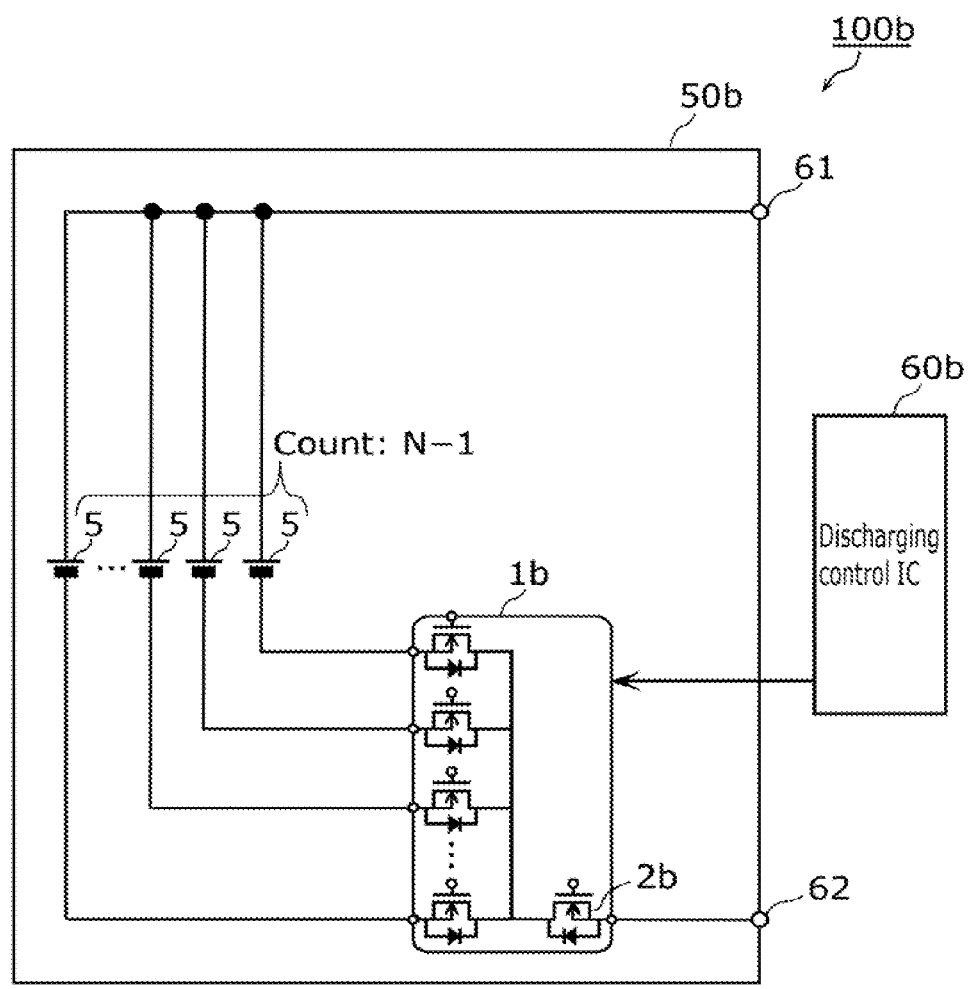
FIG. 27 is a circuit diagram illustrating one example of the configuration of the battery protection system according to Embodiment 2.

FIG. 27 is a circuit diagram illustrating one example of the configuration of battery protection system 100b according to Embodiment 2 including second semiconductor device 1b on the negative electrode side of the N−1 battery cells 5.

As illustrated in FIG. 27, battery protection system 100b differs from battery protection system 100 in that battery protection circuit 50 has been changed to battery protection circuit 50b and charging/discharging control IC 60 has been changed to discharging control IC 60b.

Battery protection circuit 50b differs from battery protection circuit 50 in that first semiconductor device 1a has been removed, and what first terminal 61 is connected to has been changed from the one or more source pads of terminal-connected vertical MOS transistor 2a to the positive electrodes of the N−1 battery cells 5.

Discharging control IC 60b controls the discharging of the N−1 battery cells 5 by controlling second semiconductor device 1b.

When discharging, discharging control IC 60b discharges the N−1 battery cells 5 simultaneously and in parallel by placing the N−1 vertical MOS transistors of second semiconductor device 1b excluding terminal-connected vertical MOS transistor 2b in a conducting state.

Although not illustrated in FIG. 27, discharging control IC 60b may selectively discharge only one of the N−1 battery cells 5 or a plurality but not all N−1 battery cells 5 simultaneously and in parallel.

Moreover, when discharging control IC 60b is discharging and detects an abnormality related to discharging, among the N−1 vertical MOS transistors of second semiconductor device 1b excluding terminal-connected vertical MOS transistor 2b, discharging control IC 60b switches the vertical MOS transistor that is connected to battery cell 5 related to the detected abnormality from a conducting state to a non-conducting state to stop the charging of said battery cell 5.

This protects said battery cell 5 from the adverse effects of an abnormality related to discharging.

Embodiment 3

Hereinafter, the battery protection system according to Embodiment 3 will be described.

3-1. Battery Protection System Configuration

Figure 28:
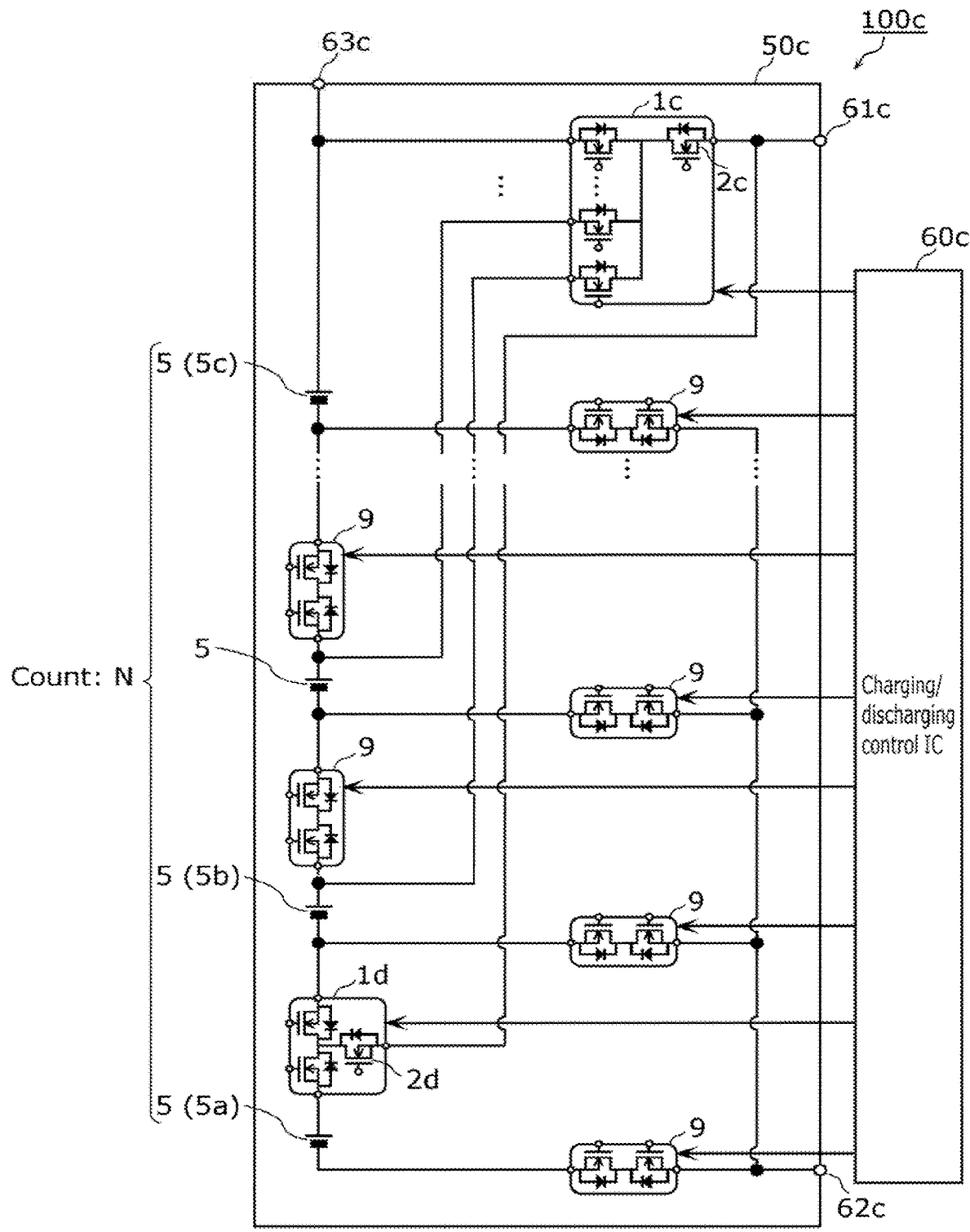
FIG. 28 is a circuit diagram illustrating one example of the configuration of a battery protection system according to Embodiment 3.

FIG. 28 is a circuit diagram illustrating one example of the configuration of battery protection system 100c according to Embodiment 3.

As illustrated in FIG. 28, battery protection system 100c includes battery protection circuit 50c and charging/discharging control IC 60c.

Battery protection circuit 50c includes first semiconductor device 1c, second semiconductor device 1d, N battery cells 5, 2N−2 semiconductor switching devices 9, first terminal 61c, second terminal 62c, and third terminal 63c.

Charging/discharging control IC 60c controls the charging/discharging of the N battery cells 5 by controlling first semiconductor device 1c, second semiconductor device 1d, and the 2N−2 semiconductor switching devices 9.

First semiconductor device 1c is semiconductor device 1 described in detail in Embodiment 1, and includes N vertical MOS transistors. The conducting state and the non-conducting state of each vertical MOS transistor are controlled by charging/discharging control IC 60c.

Second semiconductor device 1d is semiconductor device 1 described in detail in Embodiment 1, and includes three vertical MOS transistors. The conducting state and the non-conducting state of each vertical MOS transistor are controlled by charging/discharging control IC 60c.

Each of the 2N−2 semiconductor switching devices 9 includes two vertical MOS transistors that share a drain region with each other. The conducting state and the non-conducting state of each vertical MOS transistor are controlled by charging/discharging control IC 60*c*.

In each of the 2N−2 semiconductor switching devices 9, when one vertical MOS transistor is placed in a conducting state, the current path from the source electrode of the other vertical MOS transistor to the source electrode of the one vertical MOS transistor enters a conducting state, and when the other vertical MOS transistor is placed in a conducting state, the current path from the source electrode of the one vertical MOS transistor to the source electrode of the other vertical MOS transistor enters a conducting state.

N battery cells are connected in series. In Embodiment 3, among the N battery cells connected in series, the N−1 battery cells 5 excluding battery cell 5*a* located at the negative electrode end are connected in series through semiconductor switching devices 9, and battery cell 5*a* and battery cell 5*b* located next to battery cell 5*a* in the series connection are connected in series through second semiconductor device 1*d*.

First terminal 61*c* is connected to the one or more source pads of the single terminal-connected vertical MOS transistor 2*c* among the N vertical MOS transistors included in first semiconductor device 1*c*, and to the one or more source pads of the single terminal-connected vertical MOS transistor 2*d* among the three vertical MOS transistors included in second semiconductor device 1*d*.

Second terminal 62*c* is connected to the negative electrodes of the N battery cells 5. In Embodiment 3, the negative electrode of each battery cell 5 is connected to second terminal 62*c* via semiconductor switching device 9.

Third terminal 63*c* is connected to the positive electrode of battery cell 5*c* located at the positive electrode end of the N battery cells 5 connected in series.

Among the N battery cells 5, each positive electrode of the N−1 battery cells 5 excluding battery cell 5*a* is connected to the one or more source pads of a different one of the N−1 vertical MOS transistors excluding terminal-connected vertical MOS transistor 2*c* among the N vertical MOS transistors included in first semiconductor device 1*c*.

The positive electrode of battery cell 5*a* is connected to the one or more source pads of one of the two vertical MOS transistors excluding terminal-connected vertical MOS transistor 2*d* among the three vertical MOS transistors included in second semiconductor device 1*d*, and the negative electrode of battery cell 5*b* is connected to the one or more source pads of the other of the two vertical MOS transistors.

3-2. Battery Protection System Operations

Hereinafter, operations performed by battery protection system 100*c* configured as described above will be described.

Figure 29A:
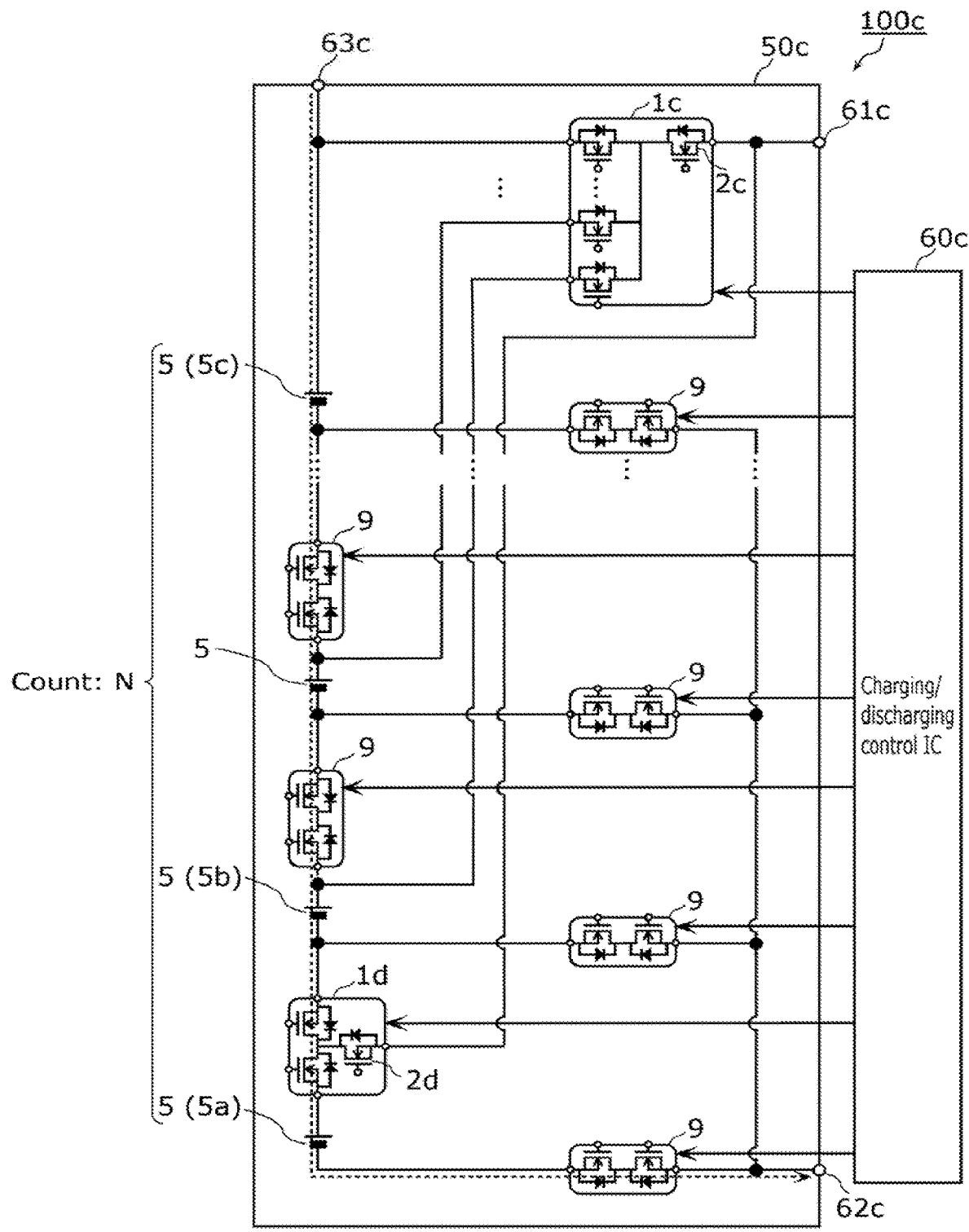
FIG. 29A is a schematic diagram illustrating the battery protection system according to Embodiment 3 charging N battery cells in series.

FIG. 29A is a schematic diagram illustrating battery protection system 100*c* charging the N battery cells 5 in series. In FIG. 29A, the dashed arrow represents the charge path of the N battery cells 5.

When serial charging, charging/discharging control IC 60*c* charges the N battery cells 5 simultaneously and in series by placing the following in a conducting state: in the N−2 semiconductor switching devices 9 disposed between the N−1 battery cells 5 excluding battery cell 5*a* among the N battery cells 5, the vertical MOS transistors on the sides connected to the positive electrodes of battery cells 5; in second semiconductor device 1*d*, the vertical MOS transistor on the side connected to the positive electrode of battery cell 5*a*; and in semiconductor switching device 9 disposed between battery cell 5*a* and second terminal 62*c*, the vertical MOS transistor on the side connected to the second terminal 62*c* side.

When charging/discharging control IC 60*c* is serial charging and detects an abnormality related to charging, for example, charging/discharging control IC 60*c* stops the charging of the N battery cells by switching the vertical MOS transistor on the side connected to the positive electrode of battery cell 5*a* in second semiconductor device 1*d* from a conducting state to a non-conducting state.

This protects the N battery cells 5 from the adverse effects of an abnormality related to charging. When serial charging is stopped by switching, from a conducting state to a non-conducting state, the vertical MOS transistor on the side connected to second terminal 62*c* in semiconductor switching device 9 to which the negative electrode of battery cell 5*a* is connected, the voltage on the positive electrode side of battery cell 5*a* can continue to be supplied out from terminal-connected vertical MOS transistor 2*d* of second semiconductor device 1*d* through first terminal 61*c*.

Figure 29B:
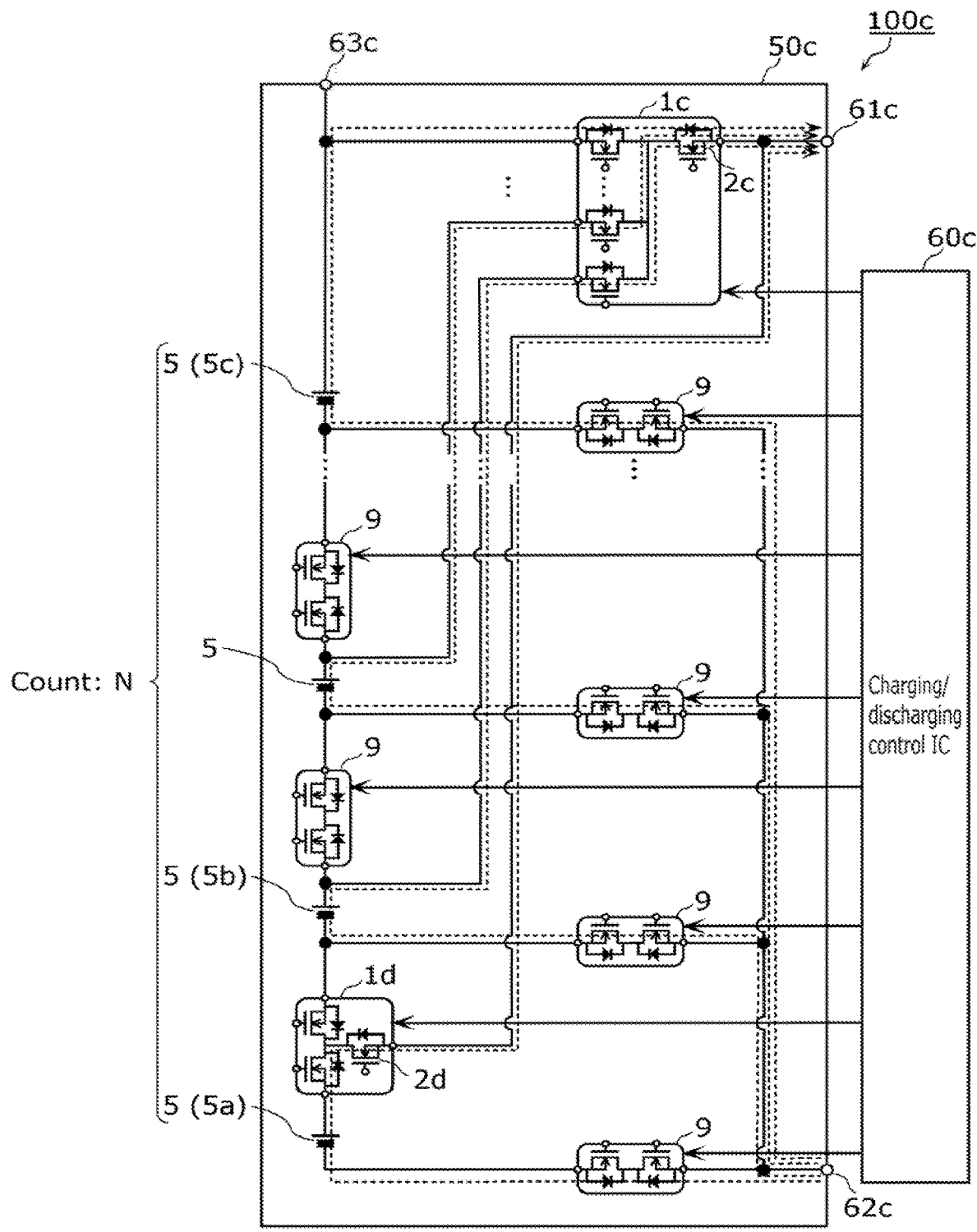
FIG. 29B is a schematic diagram illustrating the battery protection system according to Embodiment 3 discharging N battery cells.

FIG. 29B is a schematic diagram illustrating battery protection system 100*c* discharging the N battery cells 5. In FIG. 29B, the dashed arrows represent the respective discharge paths of the N battery cells 5.

When discharging, charging/discharging control IC 60*c* discharges the N battery cells 5 simultaneously and in parallel by placing the following in a conducting state: in the N semiconductor switching devices 9 disposed between the respective negative electrodes of the N battery cells 5 and second terminal 62*c*, the vertical MOS transistors on the sides connected to the negative electrodes of battery cells 5; terminal-connected vertical MOS transistor 2*d* of second semiconductor device 1*d*; terminal-connected vertical MOS transistor 2*c* of first semiconductor device 1*c*.

Although not illustrated in FIG. 29B, charging/discharging control IC 60*c* may selectively discharge only one of the N battery cells 5 or a plurality but not all N battery cells 5 simultaneously and in parallel.

When charging/discharging control IC 60*c* is discharging and detects an abnormality related to discharging, for example, in semiconductor switching device 9 to which the negative electrode of battery cell 5 related to the detected abnormality is connected among the N semiconductor switching devices 9 disposed between the respective negative electrodes of the N battery cells 5 and second terminal 62*c*, charging/discharging control IC 60*c* switches the vertical MOS transistor on the side connected to the negative electrode of said battery cell 5 from a conducting state to a non-conducting state to stop the charging of said battery cell 5.

This protects said battery cell 5 from the adverse effects of an abnormality related to discharging.

Figure 29C:
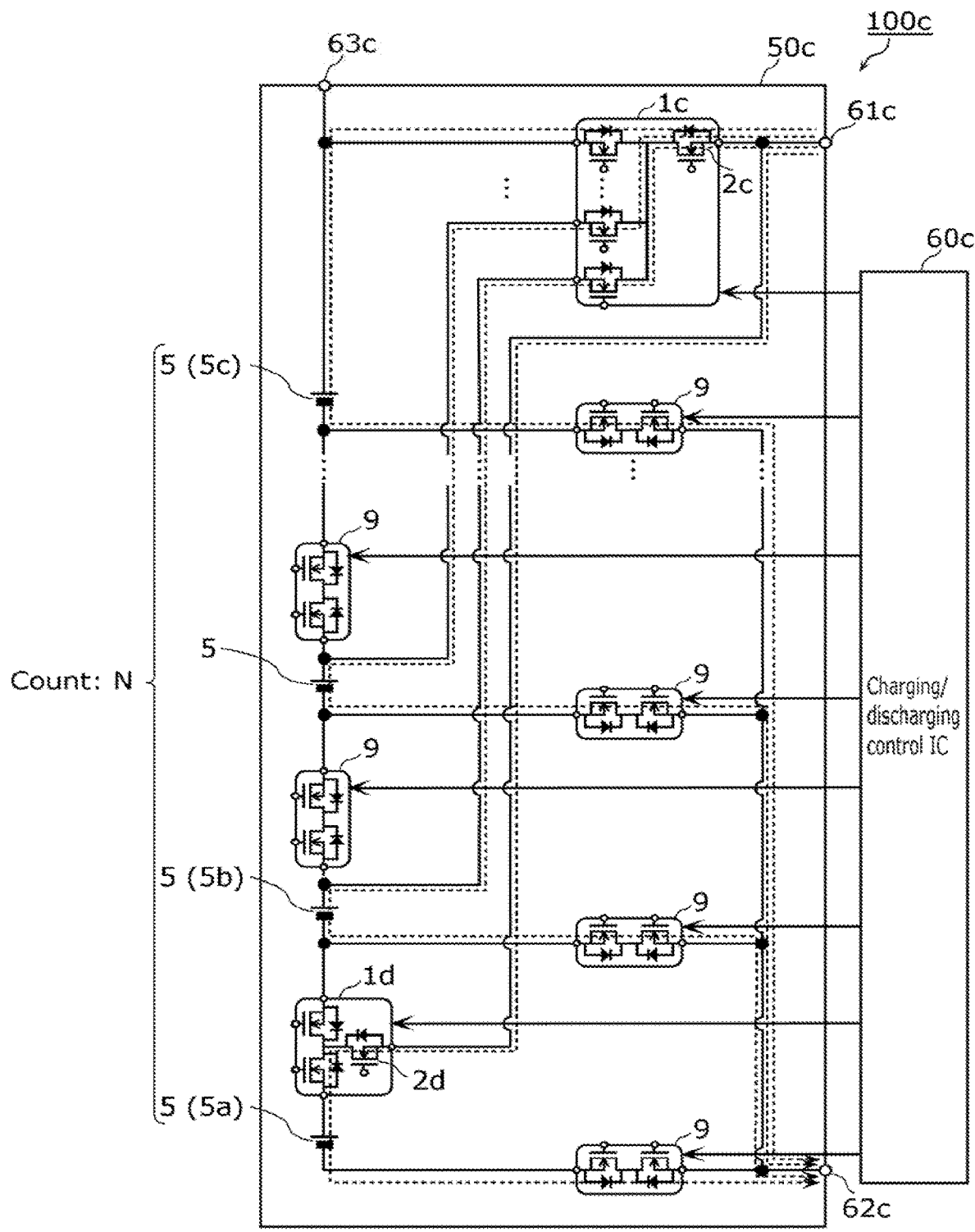
FIG. 29C is a schematic diagram illustrating the battery protection system according to Embodiment 3 charging N battery cells in parallel.

FIG. 29C is a schematic diagram illustrating battery protection system 100*c* charging the N battery cells 5 in parallel. In FIG. 29C, the dashed arrows represent the respective charge paths of the N battery cells 5.

When parallel charging, charging/discharging control IC 60*c* charges the N battery cells 5 simultaneously and in parallel by placing the following in a conducting state: in the N semiconductor switching devices 9 disposed between the respective negative electrodes of the N battery cells 5 and second terminal 62*c*, the vertical MOS transistors on the sides connected to second terminal 62*c*; in second semiconductor device 1*d*, the vertical MOS transistor connected to the positive electrode of battery cell 5*a*; and in first semiconductor device 1*c*, the N−1 vertical MOS transistors excluding terminal-connected vertical MOS transistor 2*c*.

Although not illustrated in FIG. 29C, charging/discharging control IC 60c may selectively charge only one of the N battery cells 5 or a plurality but not all N battery cells 5 simultaneously and in parallel.

When charging/discharging control IC 60c is parallel charging and detects an abnormality related to charging, for example, in semiconductor switching device 9 to which the negative electrode of battery cell 5 related to the detected abnormality is connected among the N semiconductor switching devices 9 disposed between the respective negative electrodes of the N battery cells 5 and second terminal 62c, charging/discharging control IC 60c switches the vertical MOS transistor on the side connected to second terminal 62c from a conducting state to a non-conducting state to stop the charging of said battery cell 5.

This protects said battery cell 5 from the adverse effects of an abnormality related to charging.

Next, second semiconductor device 1d according to Embodiment 3 will be discussed. In the product specifications for second semiconductor device 1d, three current paths are defined by each possible pair of the three vertical MOS transistors serving as one and the other inlet/outlet vertical MOS transistors. In Embodiment 3, since the current path with the vertical MOS transistor connected to the negative electrode of battery cell 5b and the vertical MOS transistor connected to the positive electrode of battery cell 5a serving as one and the other inlet/outlet vertical MOS transistors is used in serial charging as illustrated in FIG. 29A, it carries a large current. However, there is no need to carry a large current in either of the two current paths whose one or the other inlet/outlet vertical MOS transistor is terminal-connected vertical MOS transistor 2d. Accordingly, the maximum specified currents (denoted as Ia [A]) of the vertical MOS transistor connected to the negative electrode of battery cell 5b and the vertical MOS transistor connected to the positive electrode of battery cell 5a are equal and greater than the maximum specified current (denoted as It [A]) of terminal-connected vertical MOS transistor 2d (Ia>It).

The product specifications for second semiconductor device 1d state the respective conduction resistances (on-resistances) in the three defined current paths. The product specifications for second semiconductor device 1d also state the conduction resistance (on-resistance; denoted as Raa [Ω]) when Ia flows for the current path whose one and the other inlet/outlet vertical MOS transistors are the vertical MOS transistor connected to the negative electrode of battery cell 5b and the vertical MOS transistor connected to the positive electrode of battery cell 5a. The product specifications for second semiconductor device 1d further state the conduction resistance (on-resistance; denoted as Rat[Ω]) when It flows for the current path whose one and the other inlet/outlet vertical MOS transistors are the vertical MOS transistor connected to the negative electrode of battery cell 5b and terminal-connected vertical MOS transistor 2d. The product specifications for second semiconductor device 1d similarly state the conduction resistance (on-resistance; Rat [Ω]) when It flows for the current path whose one and the other inlet/outlet vertical MOS transistors are the vertical MOS transistor connected to the positive electrode of battery cell 5a and terminal-connected vertical MOS transistor 2d. Since the two current paths whose one or the other inlet/outlet vertical MOS transistor is terminal-connected vertical MOS transistor 2d are electrically equivalent, the product specifications may state only one conduction resistance to avoid repetition. The current value used to evaluate conduction resistance (on-resistance) is described in the product specifications for each of the three vertical MOS transistors. The current value used to evaluate conduction resistance (on-resistance) is 50% of the maximum rated current specified for each of the three vertical MOS transistors or a current value less than or equal to said maximum rated current. When evaluating conduction resistance, the current value specified in the product specifications as the current value to be passed through each of the three vertical MOS transistors may be taken as the maximum specified current for each of the three vertical MOS transistors. The maximum rated current for each of the three vertical MOS transistors stated in the product specifications may be taken as the maximum specified current for each of the three vertical MOS transistors.

The vertical MOS transistor connected to the negative electrode of battery cell 5b and the vertical MOS transistor connected to the positive electrode of battery cell 5a, which will carry a large current, preferably have the same surface area (denoted as Sa), and the surface area (denoted as St) of terminal-connected vertical MOS transistor 2d, which does not need to carry a large current, is preferably the smallest among the three vertical MOS transistors (St<Sa). Furthermore, the relationship $Sa:St=Ia^2:It^2$ preferably holds true. The individual conduction resistances Ra (Ra=Raa/2) of the vertical MOS transistor connected to the negative electrode of battery cell 5b and the vertical MOS transistor connected to the positive electrode of battery cell 5a when maximum specified current Ia flows, and the individual conduction resistance Rt (Rt=Rat×Sa/(Sa+Sn)) of terminal-connected vertical MOS transistor 2d when maximum specified current It flows preferably satisfy the relationship $Ia^2:It^2=1/Ra:1/Rt$. Satisfying this relationship can inhibit localized heat generation in second semiconductor device 1d.

3-3. Battery Protection Circuit Specific Examples

Hereinafter, specific examples of battery protection circuit 50c will be given with reference to the drawings, comparing it with conventional examples.

Figure 30A:
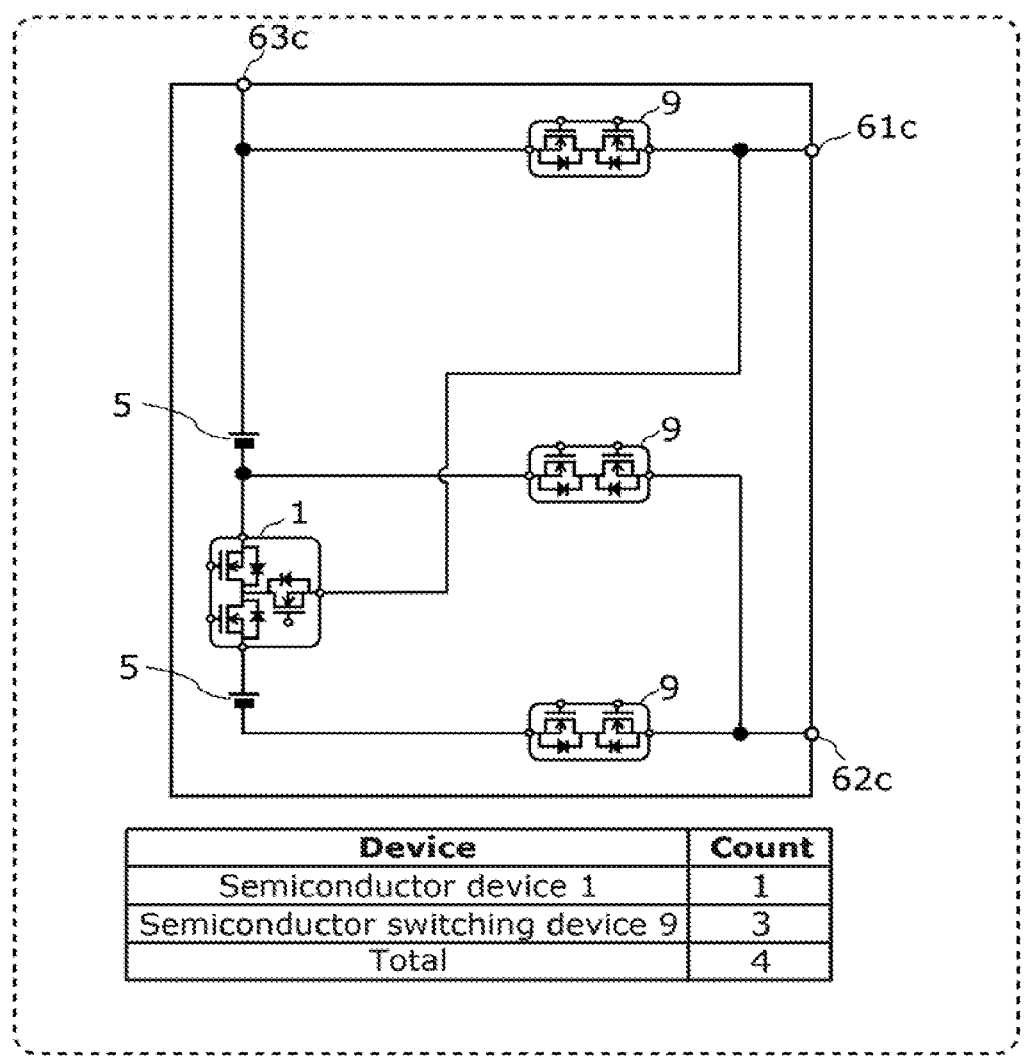
FIG. 30A is a circuit diagram illustrating a specific example of a battery protection circuit according to Embodiment 3.
Figure 31A:
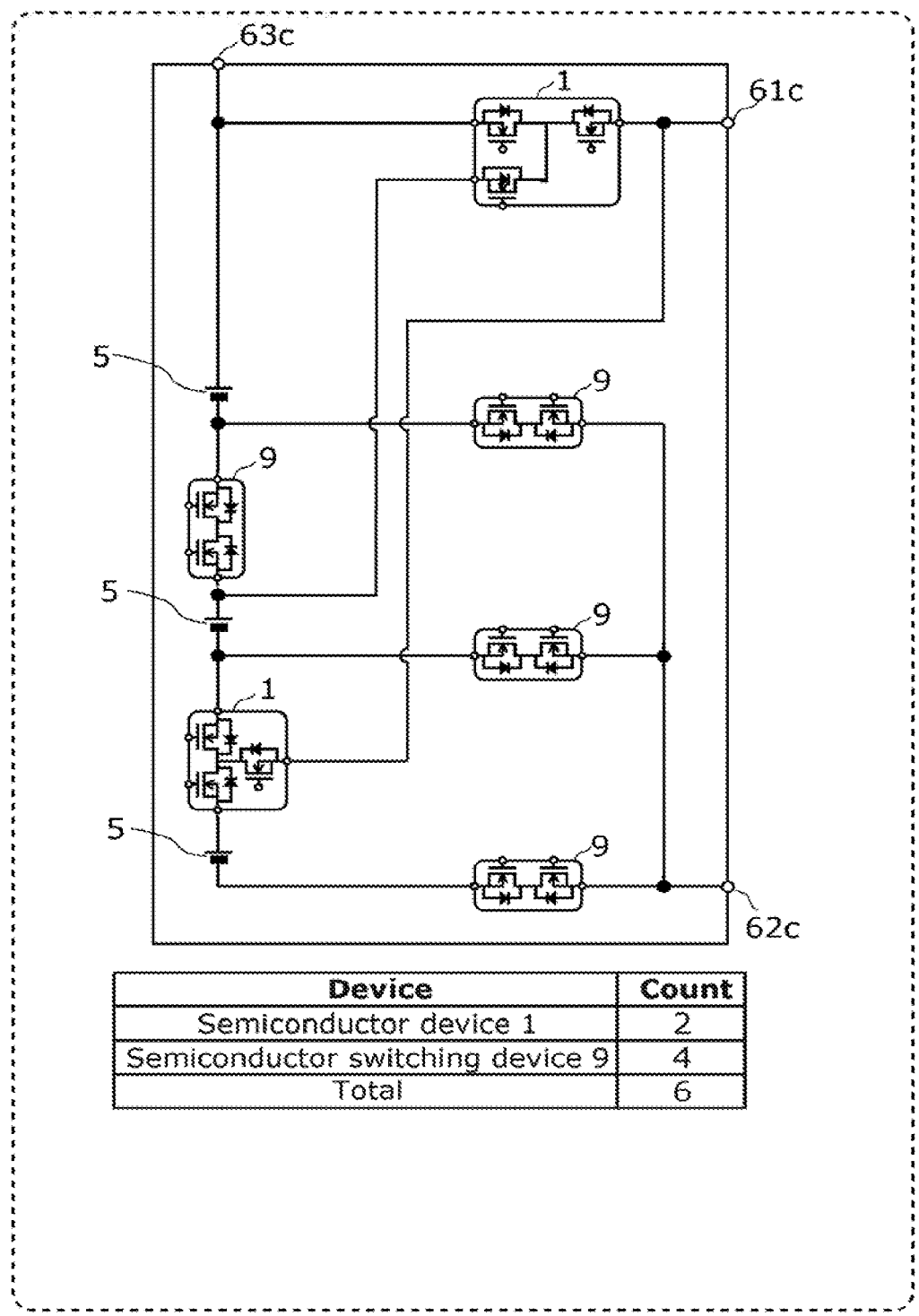
FIG. 31A is a circuit diagram illustrating a specific example of the battery protection circuit according to Embodiment 3.
Figure 32A:
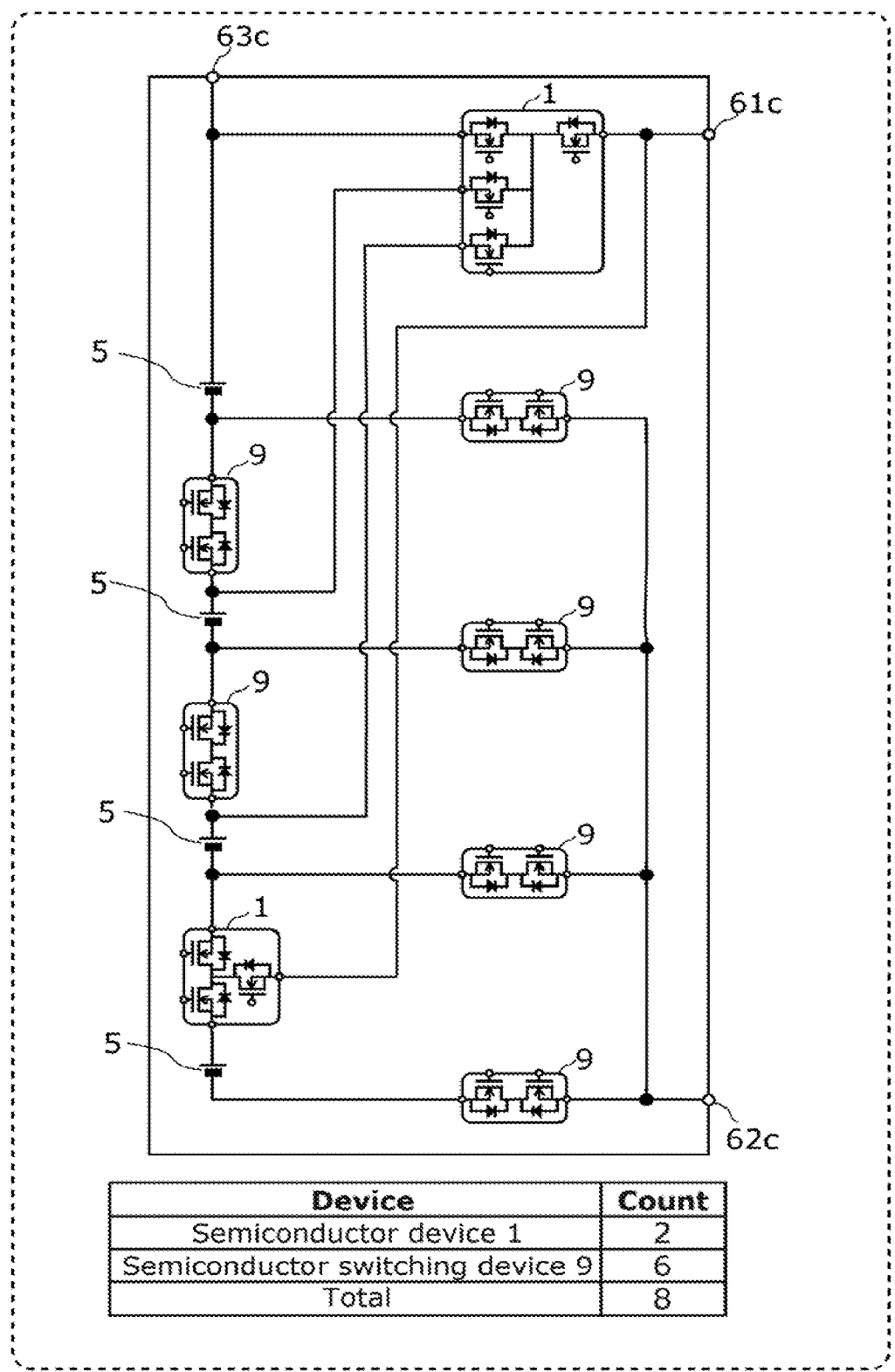
FIG. 32A is a circuit diagram illustrating a specific example of the battery protection circuit according to Embodiment 3.

FIG. 30A, FIG. 31A, and FIG. 32A are circuit diagrams illustrating specific examples of battery protection circuits according to Embodiment 3, which utilize semiconductor device 1.

Figure 30B:
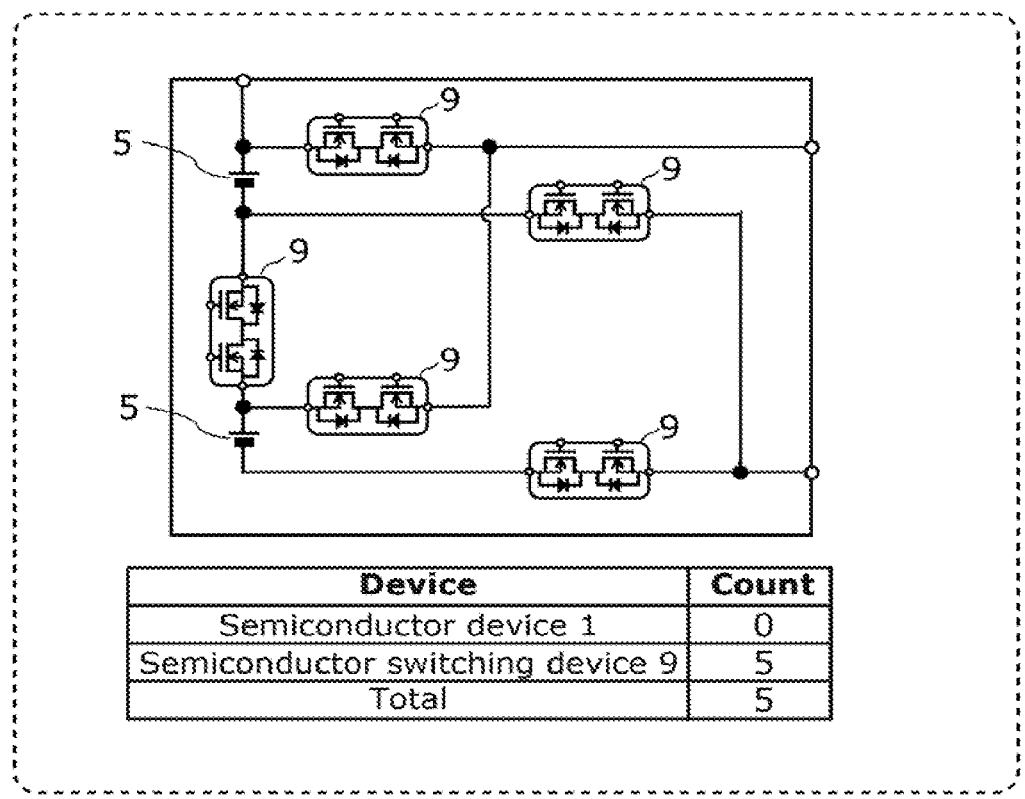
FIG. 30B is a circuit diagram illustrating a specific example of the battery protection circuit according to a conventional example.
Figure 31B:
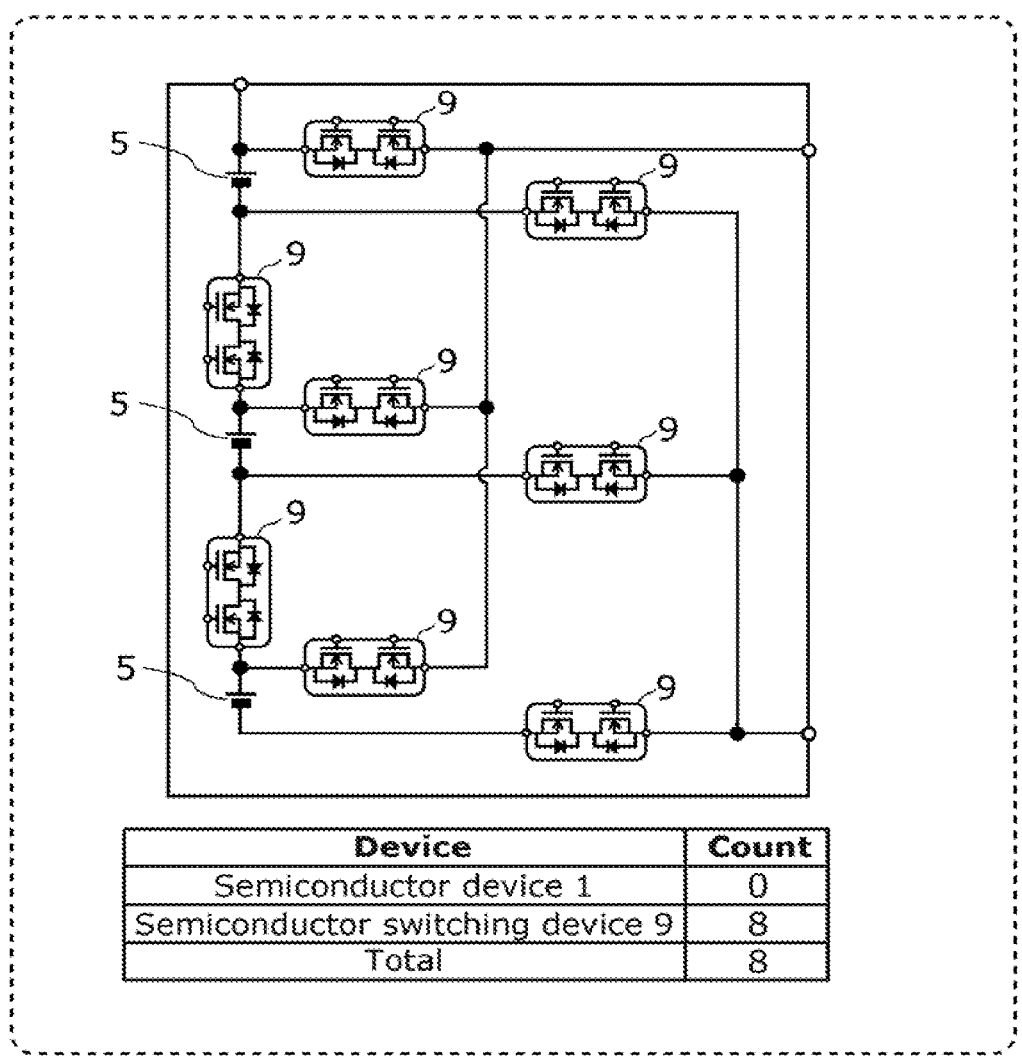
FIG. 31B is a circuit diagram illustrating a specific example of the battery protection circuit according to a conventional example.
Figure 32B:
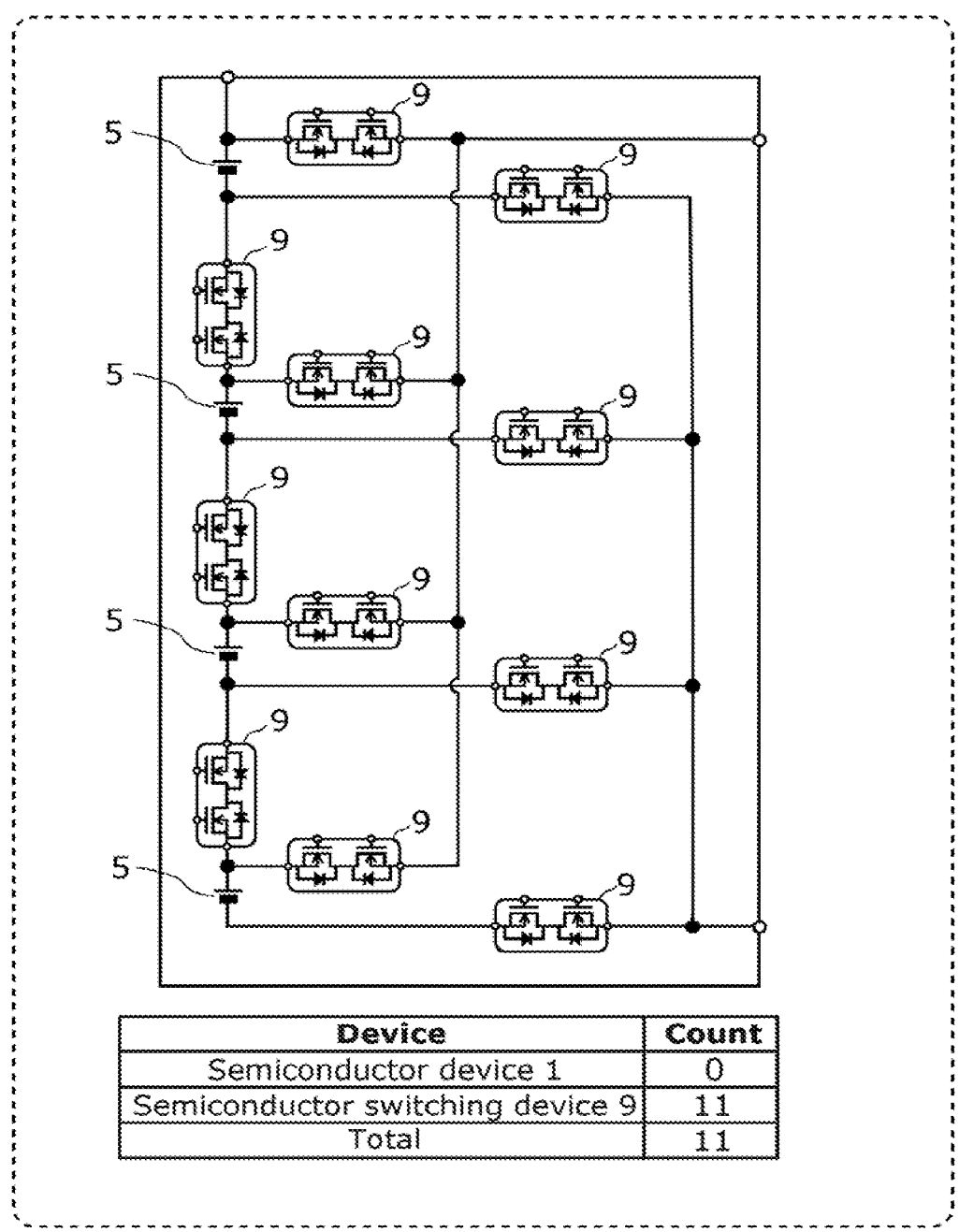
FIG. 32B is a circuit diagram illustrating a specific example of the battery protection circuit according to a conventional example.

FIG. 30B, FIG. 31B, and FIG. 32B are circuit diagrams illustrating specific examples of battery protection circuits according to conventional examples, which do not utilize semiconductor device 1, i.e., are circuits of only semiconductor switching devices 9.

FIG. 30A is a circuit diagram illustrating a first disclosed example which is one example of a battery protection circuit according to Embodiment 3 that can achieve serial charging and parallel discharging of two battery cells 5, and FIG. 30B is a circuit diagram illustrating a first conventional example which is one example of a battery protection circuit according to a conventional example that can achieve a similar function.

As can be seen by comparing FIG. 30A and FIG. 30B, the first disclosed example can achieve a similar function with fewer components than the first conventional example.

FIG. 31A is a circuit diagram illustrating a second disclosed example which is one example of a battery protection circuit according to Embodiment 3 that can achieve serial charging and parallel discharging of three battery cells 5, and FIG. 31B is a circuit diagram illustrating a second conventional example which is one example of a battery protection circuit according to a conventional example that can achieve a similar function.

As can be seen by comparing FIG. 31A and FIG. 31B, the second disclosed example can achieve a similar function with fewer components than the second conventional example.

FIG. 32A is a circuit diagram illustrating a third disclosed example which is one example of a battery protection circuit according to Embodiment 3 that can achieve serial charging and parallel discharging of four battery cells 5, and FIG. 32B is a circuit diagram illustrating a third conventional example which is one example of a battery protection circuit according to a conventional example that can achieve a similar function.

As can be seen by comparing FIG. 32A and FIG. 32B, the third disclosed example can achieve a similar function with fewer components than the third conventional example.

Hereinafter, typical operations in the second disclosed example will be described with reference to the drawings.

Figure 33A:
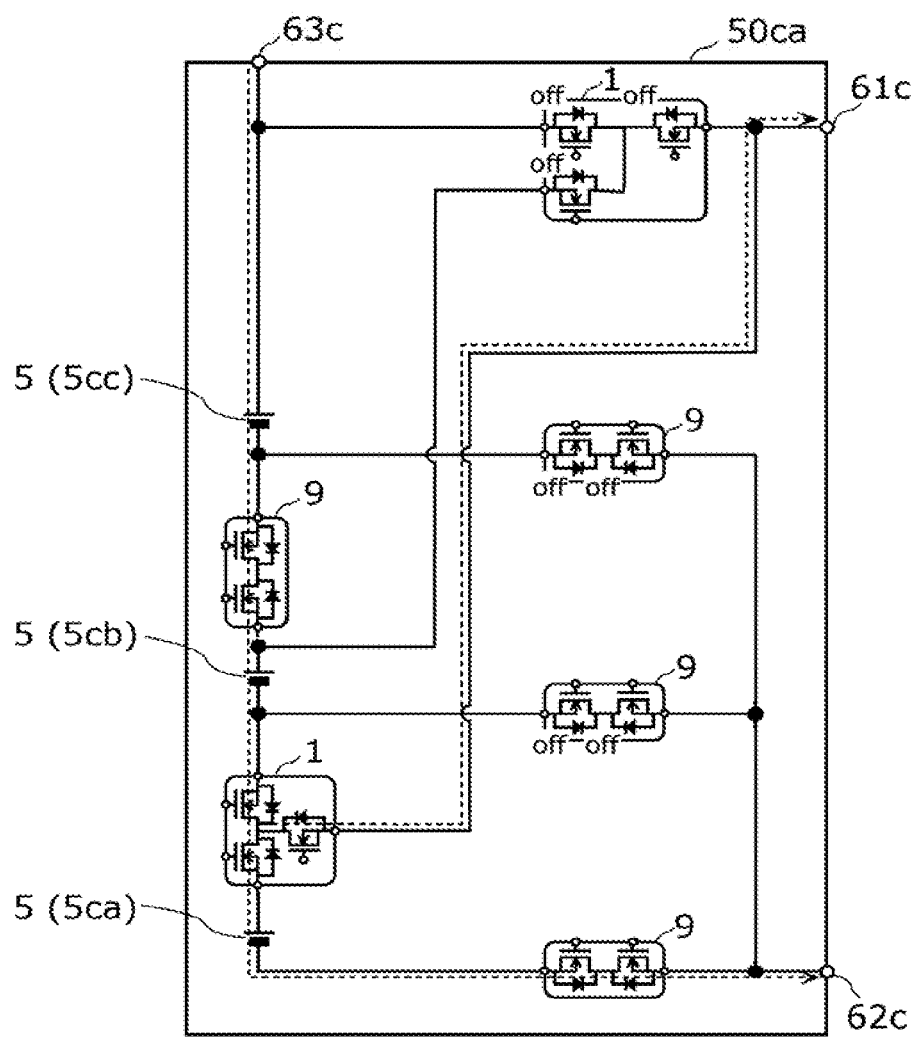
FIG. 33A is a schematic diagram illustrating the battery protection system according to Embodiment 3 charging three battery cells in series.

FIG. 33A is a schematic diagram illustrating battery protection circuit 50ca according to the second disclosed example charging three battery cells 5 in series.

As illustrated in FIG. 33A, battery protection circuit 50ca can supply out the voltage on the positive electrode side of battery cell 5ca from first terminal 61c while charging battery cell 5cc, battery cell 5cb, and battery cell 5ca in series, as a result of 15 V being applied to third terminal 63c and second terminal 62c being grounded.

Figure 33B:
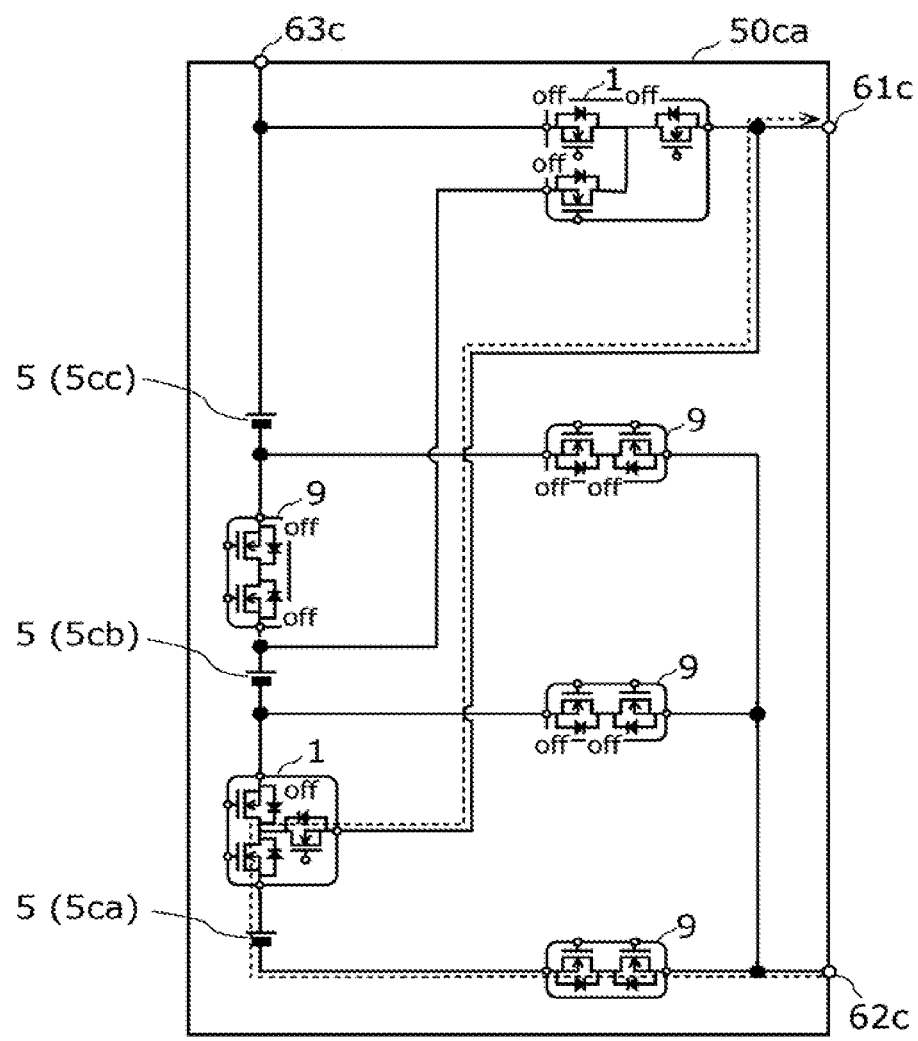
FIG. 33B is a schematic diagram illustrating the battery protection system according to Embodiment 3 stopping the serial charging of three battery cells and starting to supply out the voltage of the positive electrode of one battery cell.

FIG. 33B is a schematic diagram illustrating battery protection circuit 50ca stopping the serial charging of the three battery cells 5 and starting to supply out the voltage on the positive electrode side of battery cell 5ca from first terminal 61c.

Figure 33C:
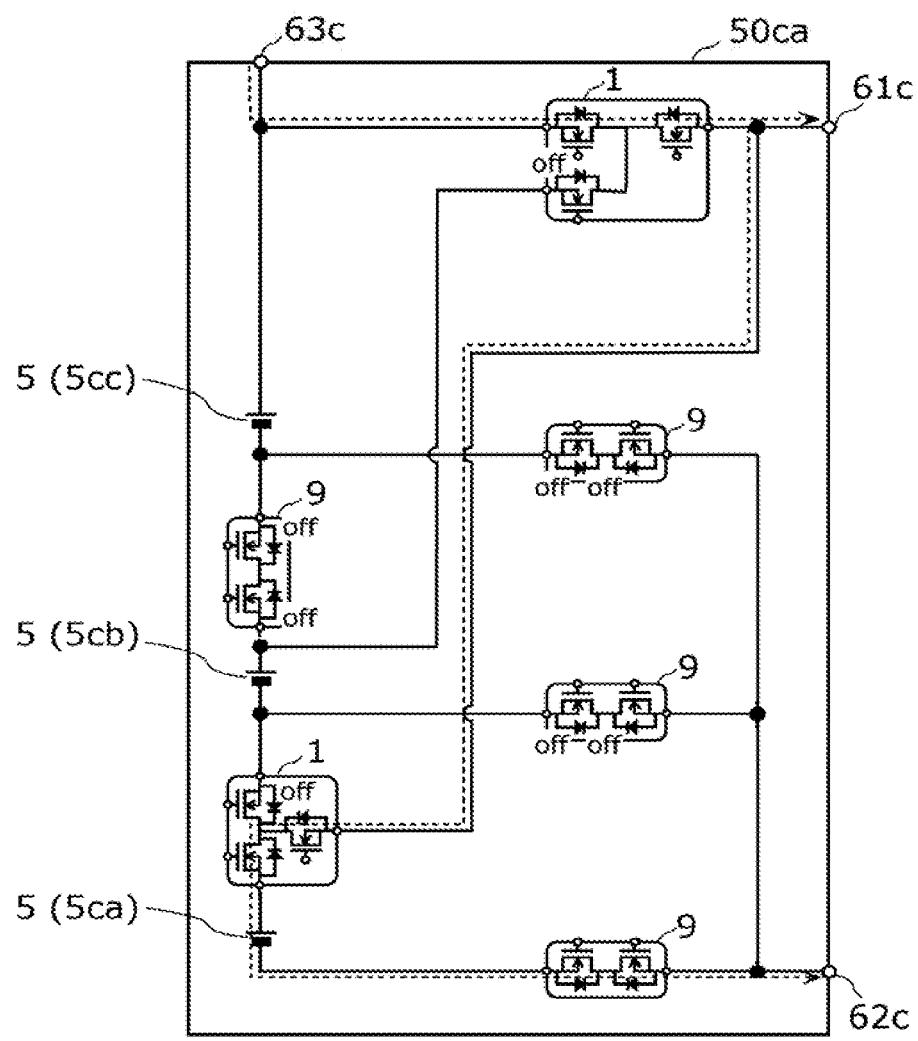
FIG. 33C is a schematic diagram illustrating the battery protection system according to Embodiment 3 charging a single battery cell.

FIG. 33C is a schematic diagram illustrating battery protection circuit 50ca charging battery cell 5ca.

As illustrated in FIG. 33C, battery protection circuit 50ca can supply out the voltage on the positive electrode side of battery cell 5ca from first terminal 61c while charging battery cell 5ca, as a result of 5 V being applied to third terminal 63c and second terminal 62c being grounded.

Figure 33D:
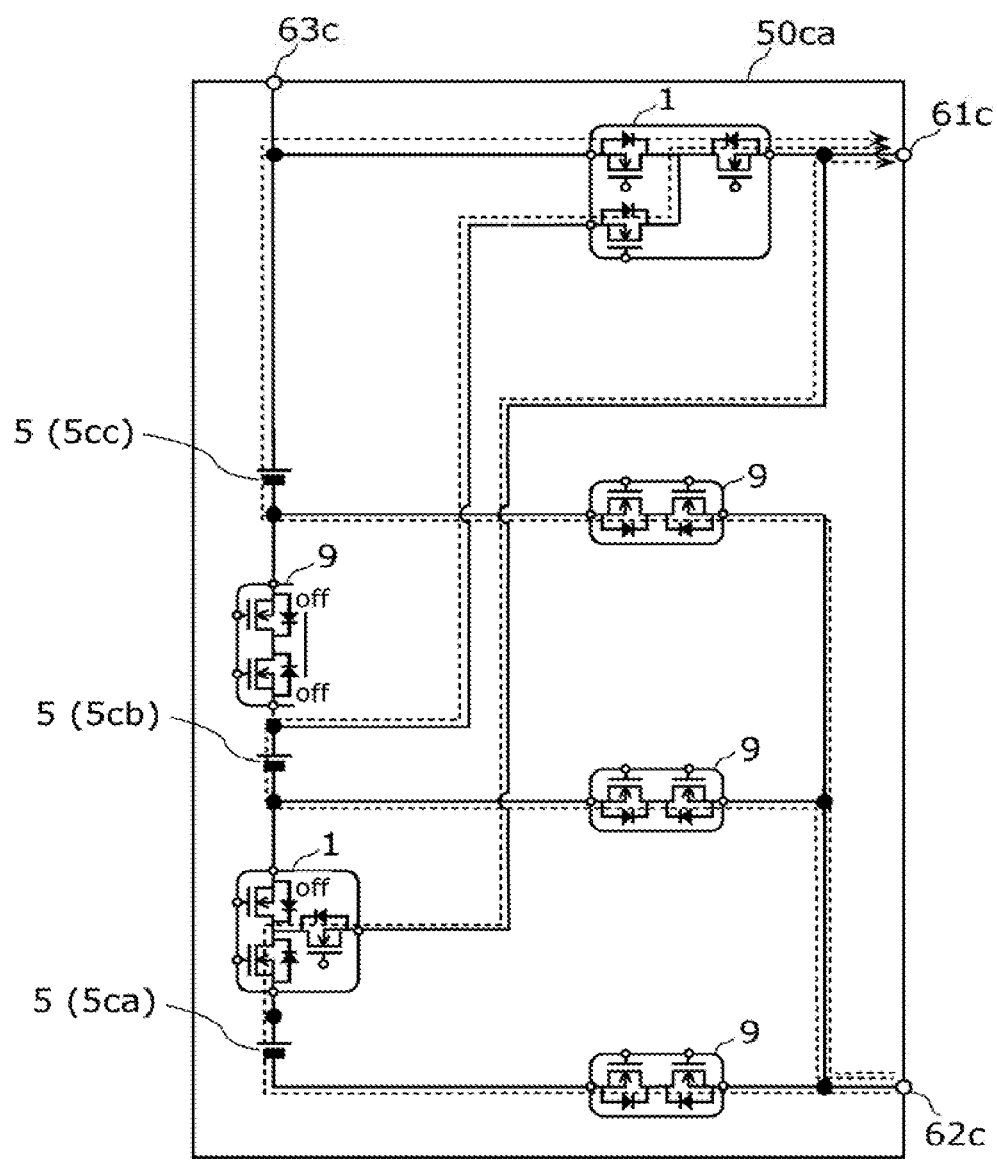
FIG. 33D is a schematic diagram illustrating the battery protection system according to Embodiment 3 discharging three battery cells in parallel.

FIG. 33D is a schematic diagram illustrating battery protection circuit 50ca discharging three battery cells 5 in parallel.

Embodiment 4

Hereinafter, the battery protection system according to Embodiment 4 will be described.

4-1. Battery Protection System Configuration

Figure 34:
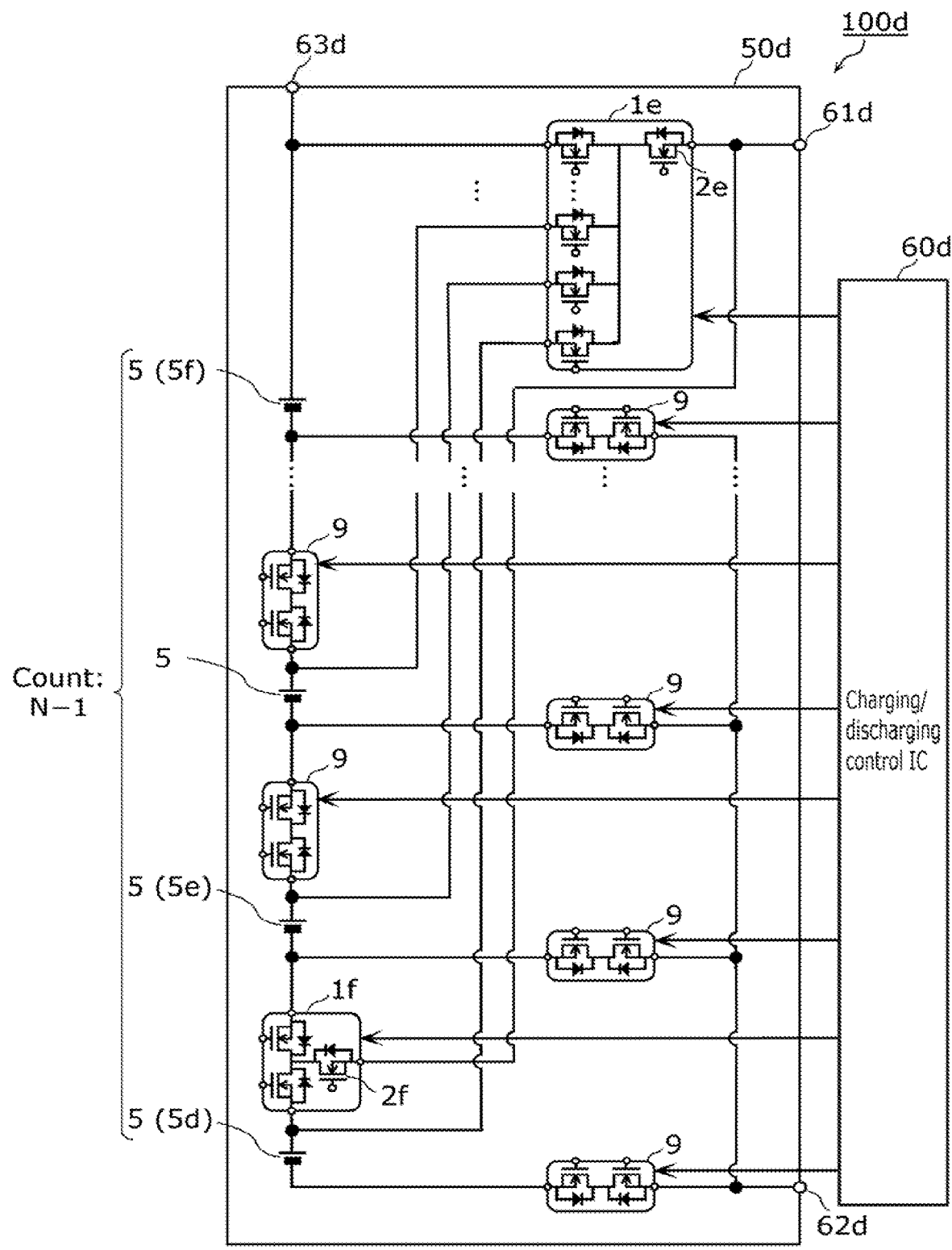
FIG. 34 is a circuit diagram illustrating one example of the configuration of a battery protection system according to Embodiment 4.

FIG. 34 is a circuit diagram illustrating one example of the configuration of battery protection system 100d according to Embodiment 4.

As illustrated in FIG. 34, battery protection system 100d includes battery protection circuit 50d and charging/discharging control IC 60d.

Battery protection circuit 50d includes first semiconductor device 1e, second semiconductor device 1f, N−1 battery cells 5, 2N−4 semiconductor switching devices 9, first terminal 61d, second terminal 62d, and third terminal 63d.

Charging/discharging control IC 60d controls the charging/discharging of the N−1 battery cells 5 by controlling first semiconductor device 1e, second semiconductor device 1f, and the 2N−4 semiconductor switching devices 9.

First semiconductor device 1e is semiconductor device 1 described in detail in Embodiment 1, and includes N vertical MOS transistors. The conducting state and the non-conducting state of each vertical MOS transistor are controlled by charging/discharging control IC 60d.

Second semiconductor device 1f is semiconductor device 1 described in detail in Embodiment 1, and includes three vertical MOS transistors. The conducting state and the non-conducting state of each vertical MOS transistor are controlled by charging/discharging control IC 60d.

The 2N−4 semiconductor switching devices 9 are controlled by charging/discharging control IC 60d.

The N−1 battery cells are connected in series. In Embodiment 4, among the N−1 battery cells connected in series, the N−2 battery cells 5 excluding battery cell 5d located at the negative electrode end are connected in series through semiconductor switching devices 9, and battery cell 5d and battery cell 5e located next to battery cell 5d in the series connection are connected in series through second semiconductor device 1f.

First terminal 61d is connected to the one or more source pads of the single terminal-connected vertical MOS transistor 2e among the N vertical MOS transistors included in first semiconductor device 1e, and to the one or more source pads of the single terminal-connected vertical MOS transistor 2f among the three vertical MOS transistors included in second semiconductor device 1f.

Second terminal 62d is connected to the negative electrodes of the N−1 battery cells 5. In Embodiment 4, the negative electrode of each battery cell 5 is connected to second terminal 62d via semiconductor switching device 9.

Third terminal 63d is connected to battery cell 5f located at the positive electrode end of the N−1 battery cells 5 connected in series.

Each positive electrode of the N−1 battery cells 5 is connected to the one or more source pads of a different one of the N−1 vertical MOS transistors excluding terminal-connected vertical MOS transistor 2e among the N vertical MOS transistors included in first semiconductor device 1e.

The positive electrode of battery cell 5d is connected to the one or more source pads of one of the two vertical MOS transistors excluding terminal-connected vertical MOS transistor 2f among the three vertical MOS transistors included in second semiconductor device 1f; and the negative electrode of battery cell 5e is connected to the one or more source pads of the other of the two vertical MOS transistors.

4-2. Battery Protection System Operations

Hereinafter, operations performed by battery protection system 100d configured as described above will be described.

Figure 35A:
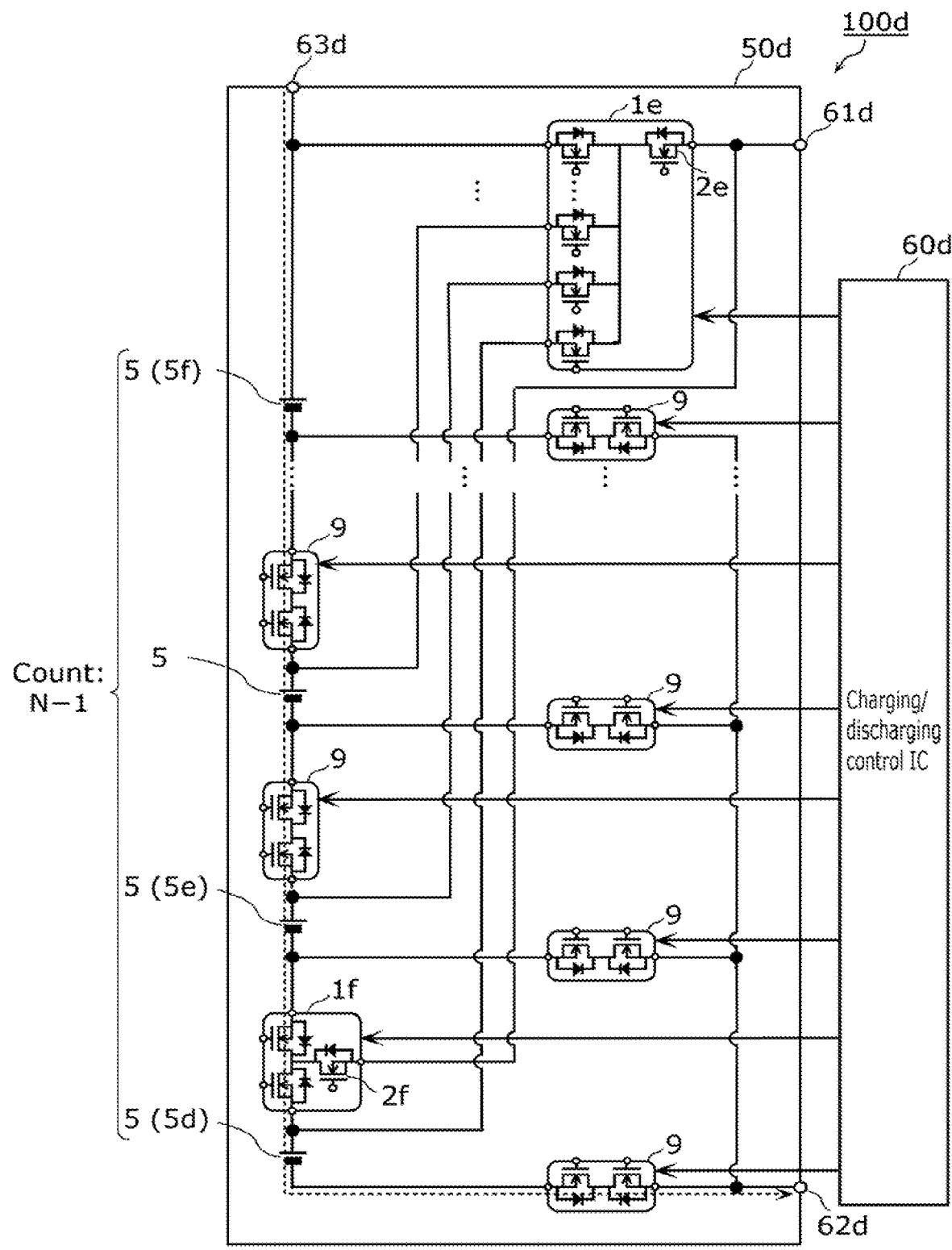
FIG. 35A is a schematic diagram illustrating the battery protection system according to Embodiment 4 charging N−1 battery cells in series.

FIG. 35A is a schematic diagram illustrating battery protection system 100d charging the N−1 battery cells 5 in series. In FIG. 35A, the dashed arrow represents the charge path of the N−1 battery cells 5.

When serial charging, charging/discharging control IC 60d charges the N−1 battery cells 5 simultaneously and in series by placing the following in a conducting state: in the N−3 semiconductor switching devices 9 disposed between the N−2 battery cells 5 excluding battery cell 5d among the N−1 battery cells 5, the vertical MOS transistors on the sides connected to the positive electrodes of battery cells 5; in second semiconductor device 1f, the vertical MOS transistor on the side connected to the positive electrode of battery cell 5d; and in semiconductor switching device 9 disposed between battery cell 5d and second terminal 62d, the vertical MOS transistor on the side connected to the second terminal 62d side.

When charging/discharging control IC 60d is serial charging and detects an abnormality related to charging, for example, charging/discharging control IC 60d stops the charging of the N−1 battery cells by switching the vertical MOS transistor on the side connected to the positive electrode of battery cell 5d in second semiconductor device 1f from a conducting state to a non-conducting state.

This protects the N−1 battery cells 5 from the adverse effects of an abnormality related to charging.

Figure 35B:
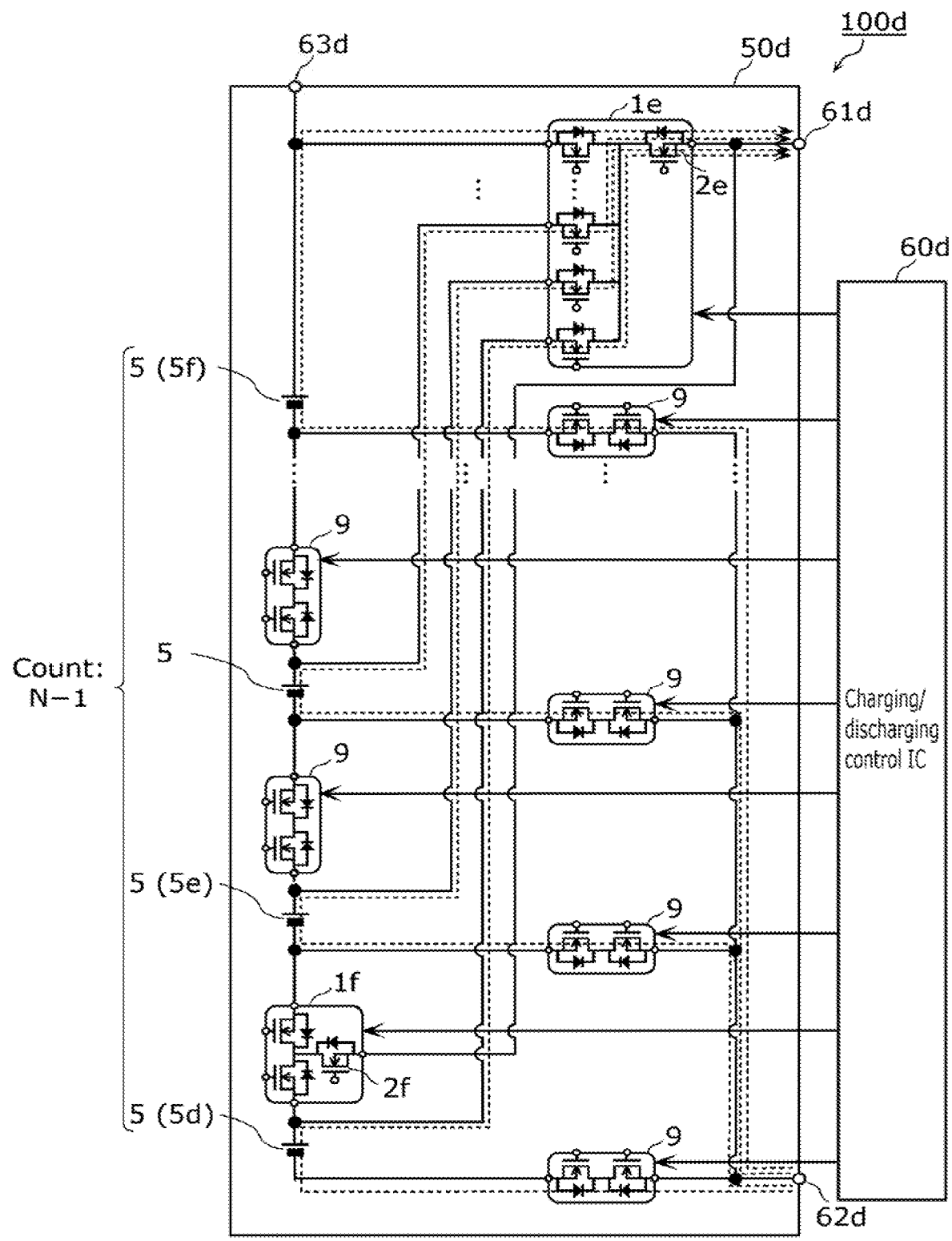
FIG. 35B is a schematic diagram illustrating the battery protection system according to Embodiment 4 discharging N−1 battery cells.

FIG. 35B is a schematic diagram illustrating battery protection system 100d discharging the N−1 battery cells 5. In FIG. 35B, the dashed arrows represent the respective discharge paths of the N−1 battery cells 5.

When discharging, charging/discharging control IC 60d discharges the N−1 battery cells 5 simultaneously and in parallel by placing the following in a conducting state: in the N−1 semiconductor switching devices 9 disposed between the respective negative electrodes of the N−1 battery cells 5 and second terminal 62d, the vertical MOS transistors on the sides connected to the negative electrodes of battery cells 5; and terminal-connected vertical MOS transistor 2e of first semiconductor device 1e.

Although not illustrated in FIG. 35B, charging/discharging control IC 60d may selectively discharge only one of the N−1 battery cells 5 or a plurality but not all N−1 battery cells 5 simultaneously and in parallel.

When charging/discharging control IC 60d is discharging and detects an abnormality related to discharging, for example, in semiconductor switching device 9 to which the negative electrode of battery cell 5 related to the detected abnormality is connected among the N−1 semiconductor switching devices 9 disposed between the respective negative electrodes of the N−1 battery cells 5 and second terminal 62d, charging/discharging control IC 60d switches the vertical MOS transistor on the side connected to the negative electrode of said battery cell 5 from a conducting state to a non-conducting state to stop the charging of said battery cell 5.

This protects said battery cell 5 from the adverse effects of an abnormality related to discharging.

Figure 35C:
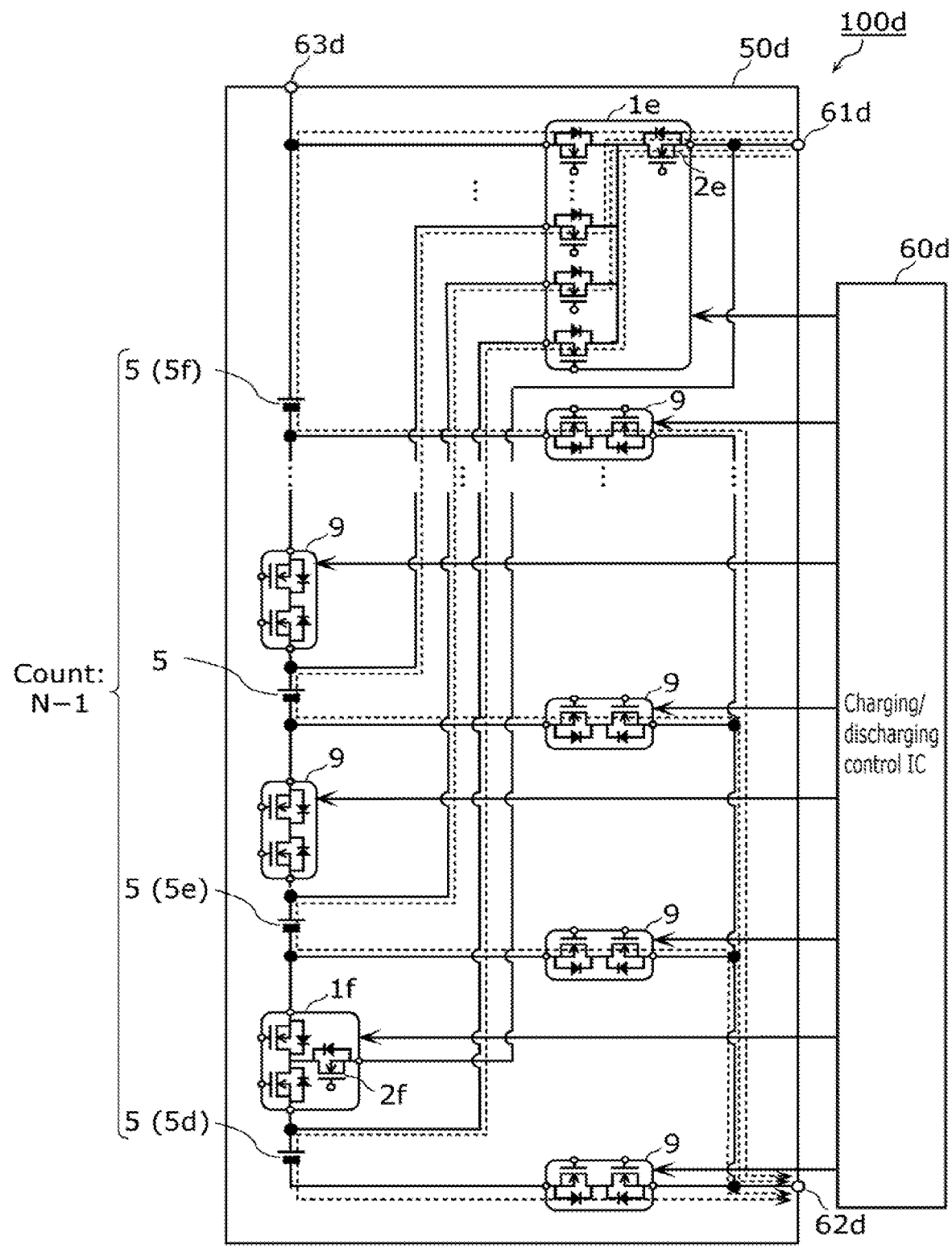
FIG. 35C is a schematic diagram illustrating the battery protection system according to Embodiment 4 charging N−1 battery cells in parallel.

FIG. 35C is a schematic diagram illustrating battery protection system 100d charging the N−1 battery cells 5 in parallel. In FIG. 35C, the dashed arrows represent the respective charge paths of the N−1 battery cells 5.

When parallel charging, charging/discharging control IC 60d charges the N−1 battery cells 5 simultaneously and in parallel by placing the following in a conducting state: in the N−1 semiconductor switching devices 9 disposed between the respective negative electrodes of the N−1 battery cells 5 and second terminal 62d, the vertical MOS transistors on the sides connected to second terminal 62d; and in first semiconductor device 1e, the N−1 vertical MOS transistors excluding terminal-connected vertical MOS transistor 2e.

Although not illustrated in FIG. 35C, charging/discharging control IC 60d may selectively charge only one of the N−1 battery cells 5 or a plurality but not all N−1 battery cells 5 simultaneously and in parallel.

When charging/discharging control IC 60d is parallel charging and detects an abnormality related to charging, for example, in semiconductor switching device 9 to which the negative electrode of battery cell 5 related to the detected abnormality is connected among the N−1 semiconductor switching devices 9 disposed between the respective negative electrodes of the N−1 battery cells 5 and second terminal 62d, charging/discharging control IC 60d switches the vertical MOS transistor on the side connected to second terminal 62d from a conducting state to a non-conducting state to stop the charging of said battery cell 5.

This protects said battery cell 5 from the adverse effects of an abnormality related to charging.

4-3. Battery Protection Circuit Specific Examples

Hereinafter, specific examples of battery protection circuit 50d will be given with reference to the drawings, comparing it with conventional examples.

Figure 36:
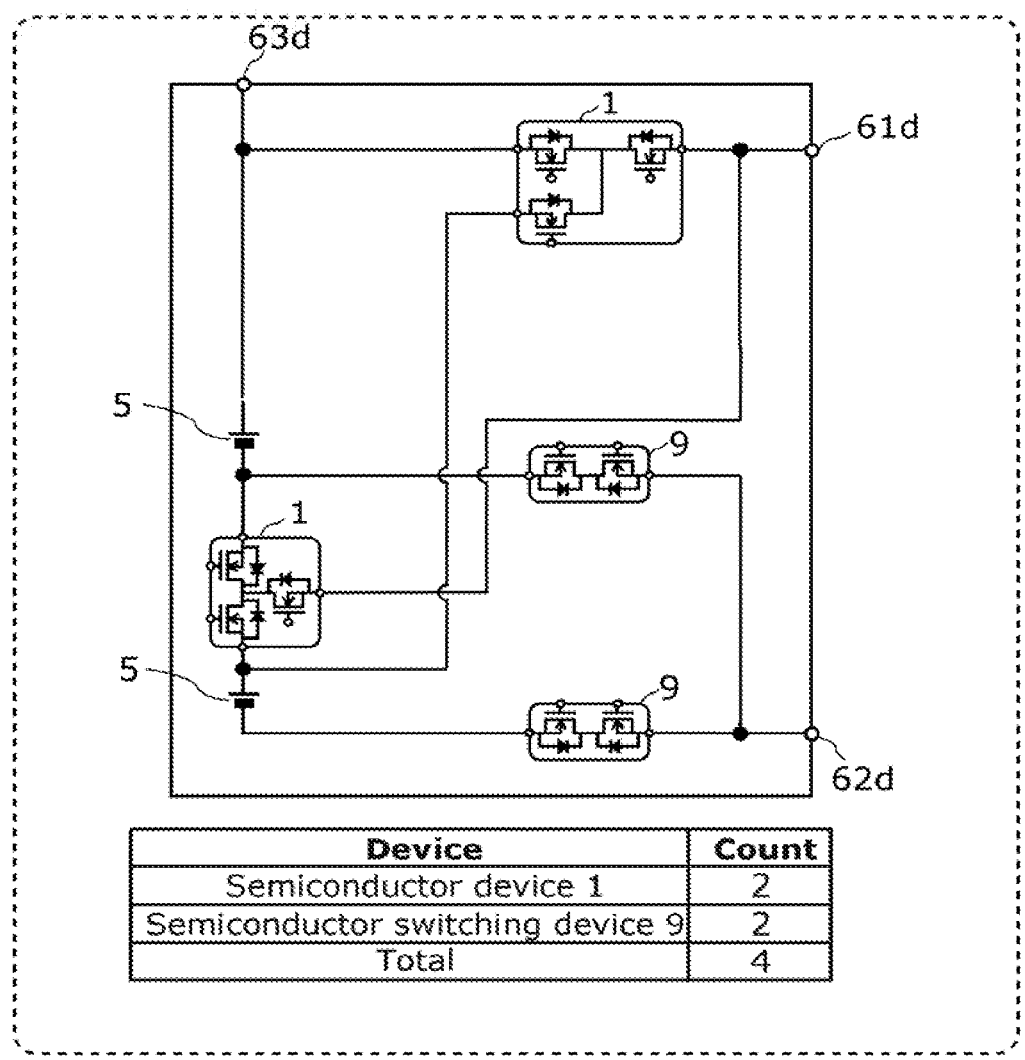
FIG. 36 is a circuit diagram illustrating a specific example of a battery protection circuit according to Embodiment 4.
Figure 39:
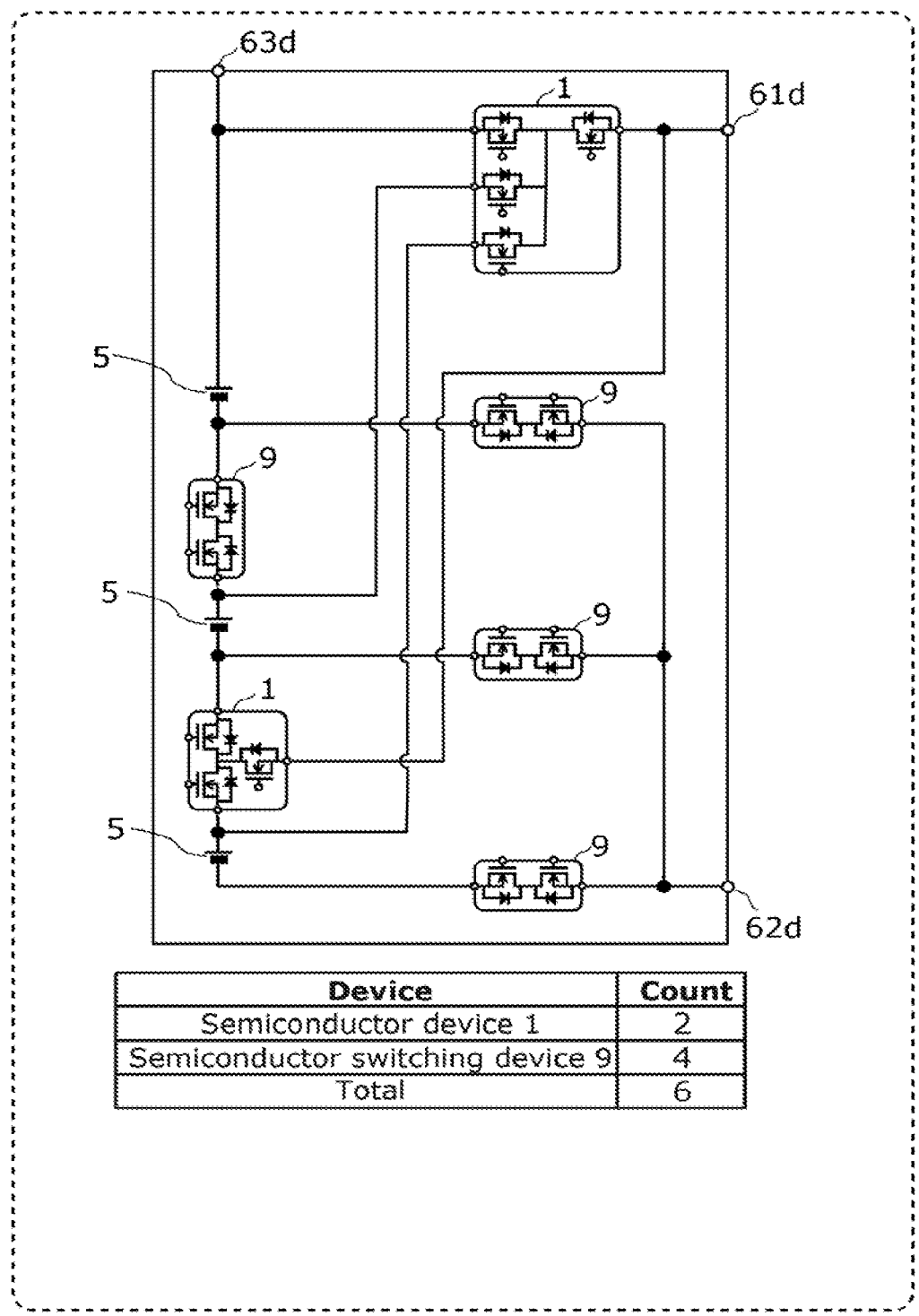
FIG. 39 is a circuit diagram illustrating a specific example of the battery protection circuit according to Embodiment 4.
Figure 40:
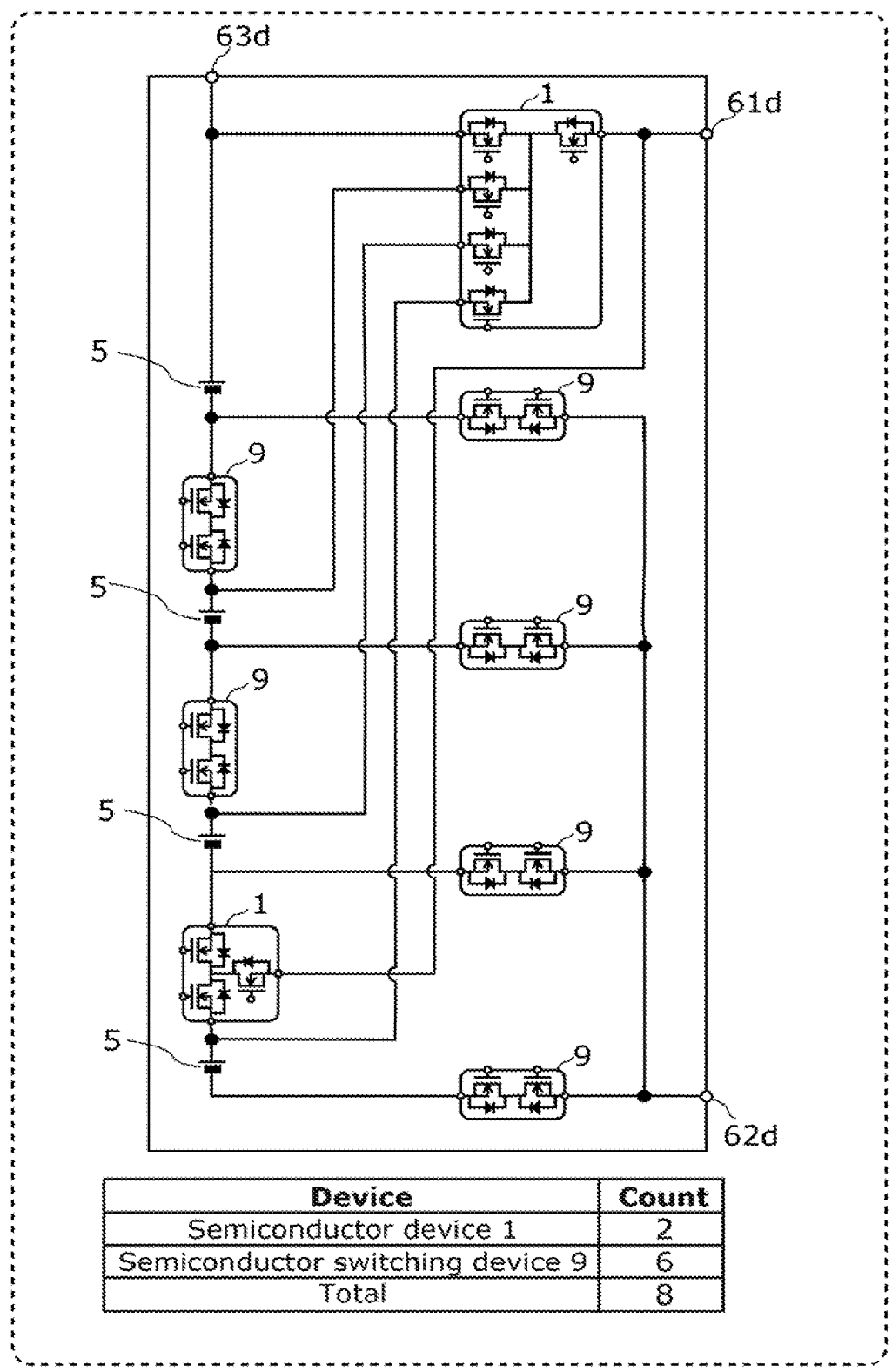
FIG. 40 is a circuit diagram illustrating a specific example of the battery protection circuit according to Embodiment 4.

FIG. 36, FIG. 39, and FIG. 40 are circuit diagrams illustrating specific examples of battery protection circuits according to Embodiment 4, which utilize semiconductor device 1.

FIG. 36 is a circuit diagram illustrating a fourth disclosed example which is one example of a battery protection circuit according to Embodiment 4 that can achieve serial charging and parallel discharging of two battery cells 5. The first conventional example illustrated in FIG. 30B is an example of a battery protection circuit that has a similar function and does not utilize semiconductor device 1.

As can be seen by comparing FIG. 36 and FIG. 30B, the fourth disclosed example can achieve a similar function with fewer components than the first conventional example.

Figure 37A:
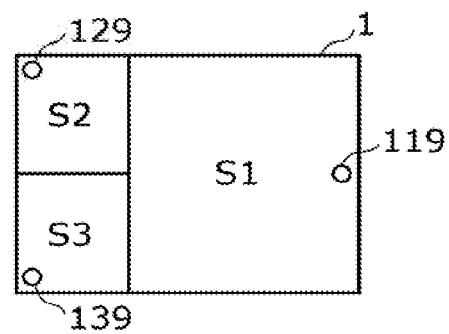
FIG. 37A is one example of a plan view of the semiconductor device according to Embodiment 4.
Figure 37B:
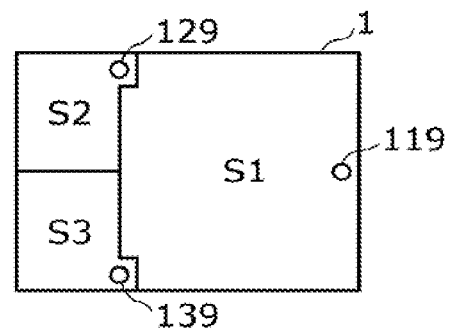
FIG. 37B is one example of a plan view of the semiconductor device according to Embodiment 4.

FIG. 37A and FIG. 37B are each one example of a plan view of first semiconductor device 1 according to the fourth disclosed example.

As illustrated in FIG. 37A and FIG. 37B, in first semiconductor device 1, the relationship between surface area S1 of the terminal-connected vertical MOS transistor and surface areas S2 and S3 of the other two vertical MOS transistors preferably satisfies S1:S2:S3=4:1:1.

Figure 38A:
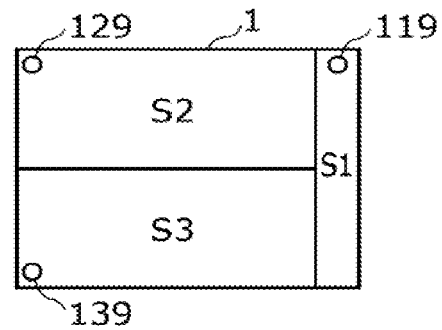
FIG. 38A is one example of a plan view of the semiconductor device according to Embodiment 4.
Figure 38B:
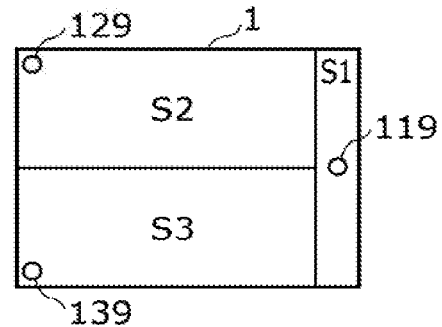
FIG. 38B is one example of a plan view of the semiconductor device according to Embodiment 4.

FIG. 38A and FIG. 38B are each one example of a plan view of second semiconductor device 1 according to the fourth disclosed example.

As illustrated in FIG. 38A and FIG. 38B, in second semiconductor device 1, surface area S1 of the terminal-connected vertical MOS transistor is preferably smaller than surface areas S2 and S3 of the other two vertical MOS transistors, and surface areas S2 and S3 of the other two vertical MOS transistors are preferably equal.

FIG. 39 is a circuit diagram illustrating a fifth disclosed example which is one example of a battery protection circuit according to Embodiment 4 that can achieve serial charging and parallel discharging of three battery cells 5. The second conventional example illustrated in FIG. 31B is an example of a battery protection circuit that has a similar function and does not utilize semiconductor device 1.

As can be seen by comparing FIG. 39 and FIG. 31B, the fifth disclosed example can achieve a similar function with fewer components than the second conventional example.

FIG. 40 is a circuit diagram illustrating a sixth disclosed example which is one example of a battery protection circuit according to Embodiment 4 that can achieve serial charging and parallel discharging of four battery cells 5. The third conventional example illustrated in FIG. 32B is an example of a battery protection circuit that has a similar function and does not utilize semiconductor device 1.

As can be seen by comparing FIG. 40 and FIG. 32B, the sixth disclosed example can achieve a similar function with fewer components than the third conventional example.

Hereinafter, typical operations in the fifth disclosed example will be described with reference to the drawings.

Figure 41A:
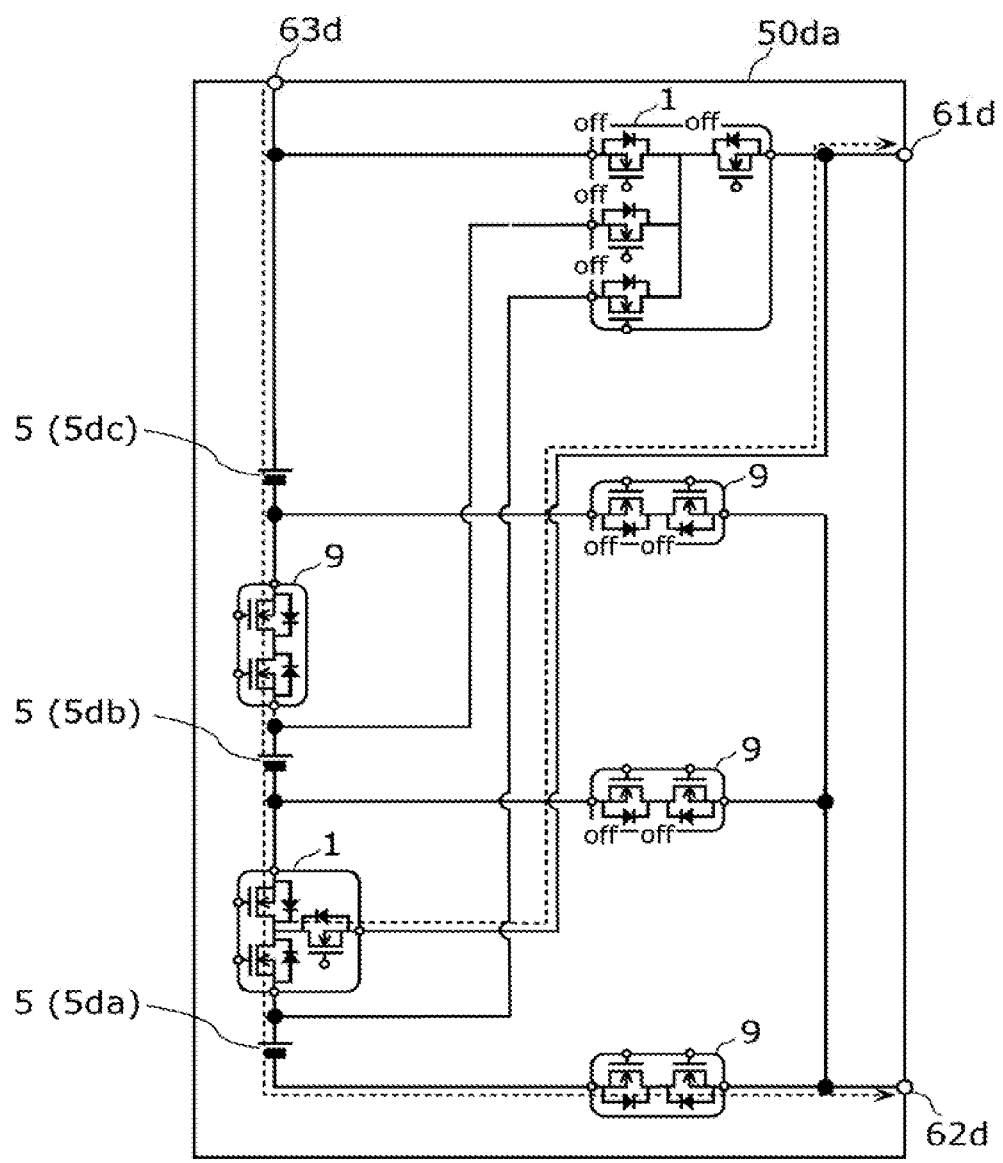
FIG. 41A is a schematic diagram illustrating the battery protection system according to Embodiment 4 charging three battery cells in series.

FIG. 41A is a schematic diagram illustrating battery protection circuit 50da according to the fifth disclosed example charging three battery cells 5 in series.

As illustrated in FIG. 41A, battery protection circuit 50da can supply out the voltage on the positive electrode side of battery cell 5da from first terminal 61d while charging battery cell 5dc, battery cell 5db, and battery cell 5da in series, as a result of 15 V being applied to third terminal 63d and second terminal 62d being grounded.

Figure 41B:
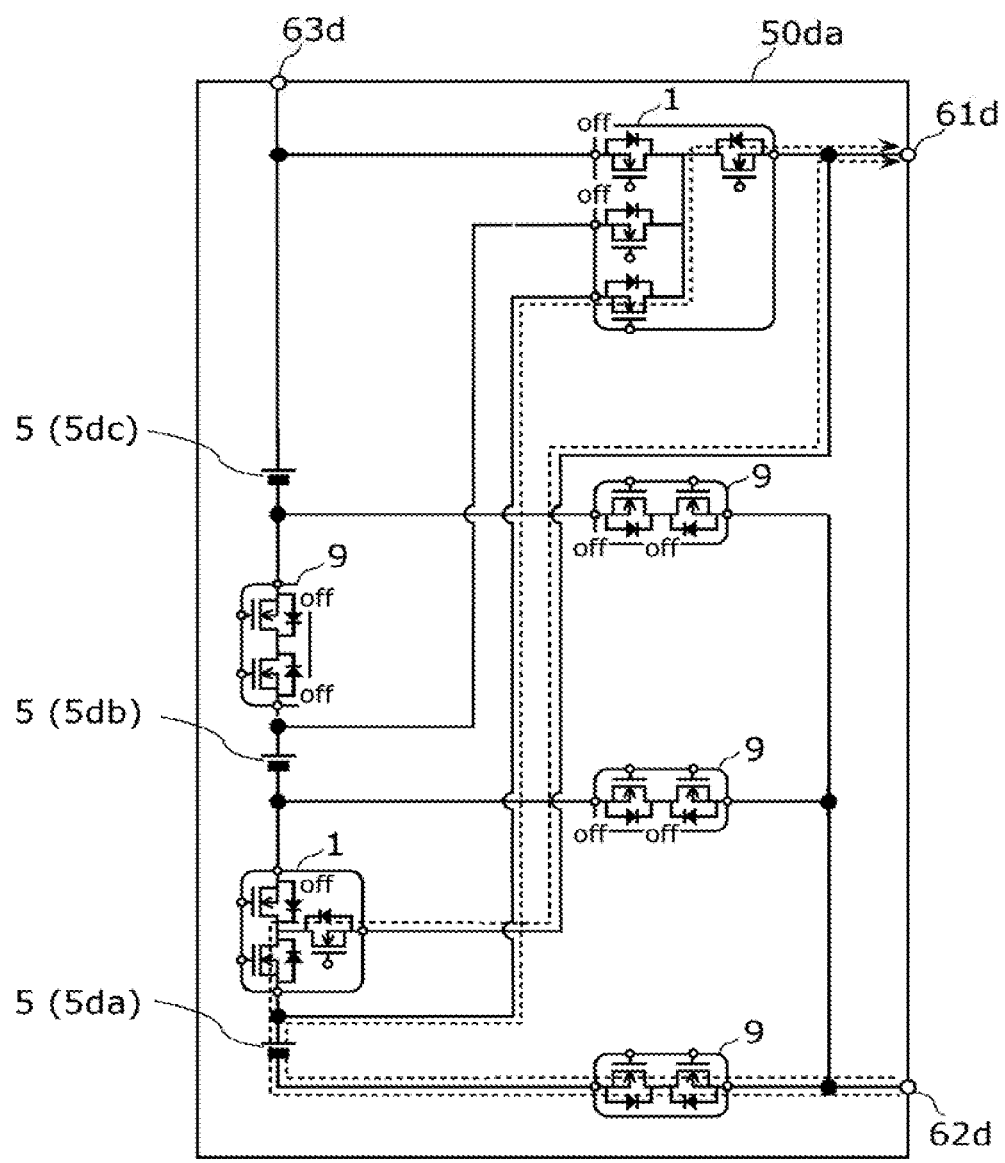
FIG. 41B is a schematic diagram illustrating the battery protection system according to Embodiment 4 stopping the serial charging of three battery cells and starting to supply out the voltage of the positive electrode of one battery cell.

FIG. 41B is a schematic diagram illustrating battery protection circuit 50da stopping the serial charging of the three battery cells 5 and starting to supply out the voltage on the positive electrode side of battery cell 5da from first terminal 61d.

Figure 41C:
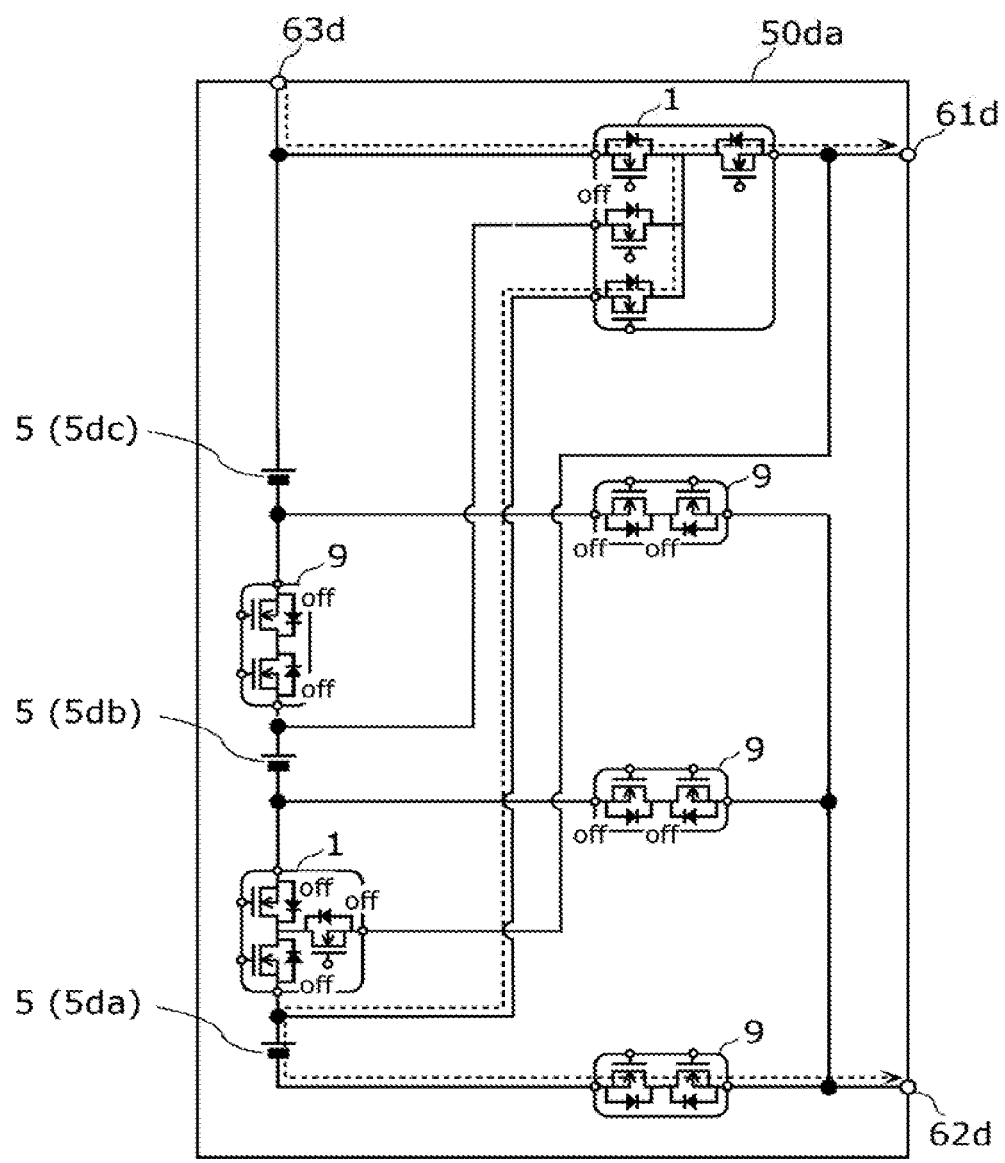
FIG. 41C is a schematic diagram illustrating the battery protection system according to Embodiment 4 charging a single battery cell.

FIG. 41C is a schematic diagram illustrating battery protection circuit 50da charging battery cell 5da.

As illustrated in FIG. 41C, battery protection circuit 50da can supply out the voltage on the positive electrode side of battery cell 5da from first terminal 61d while charging battery cell 5da, as a result of 5 V being applied to third terminal 63d and second terminal 62d being grounded.

Figure 41D:
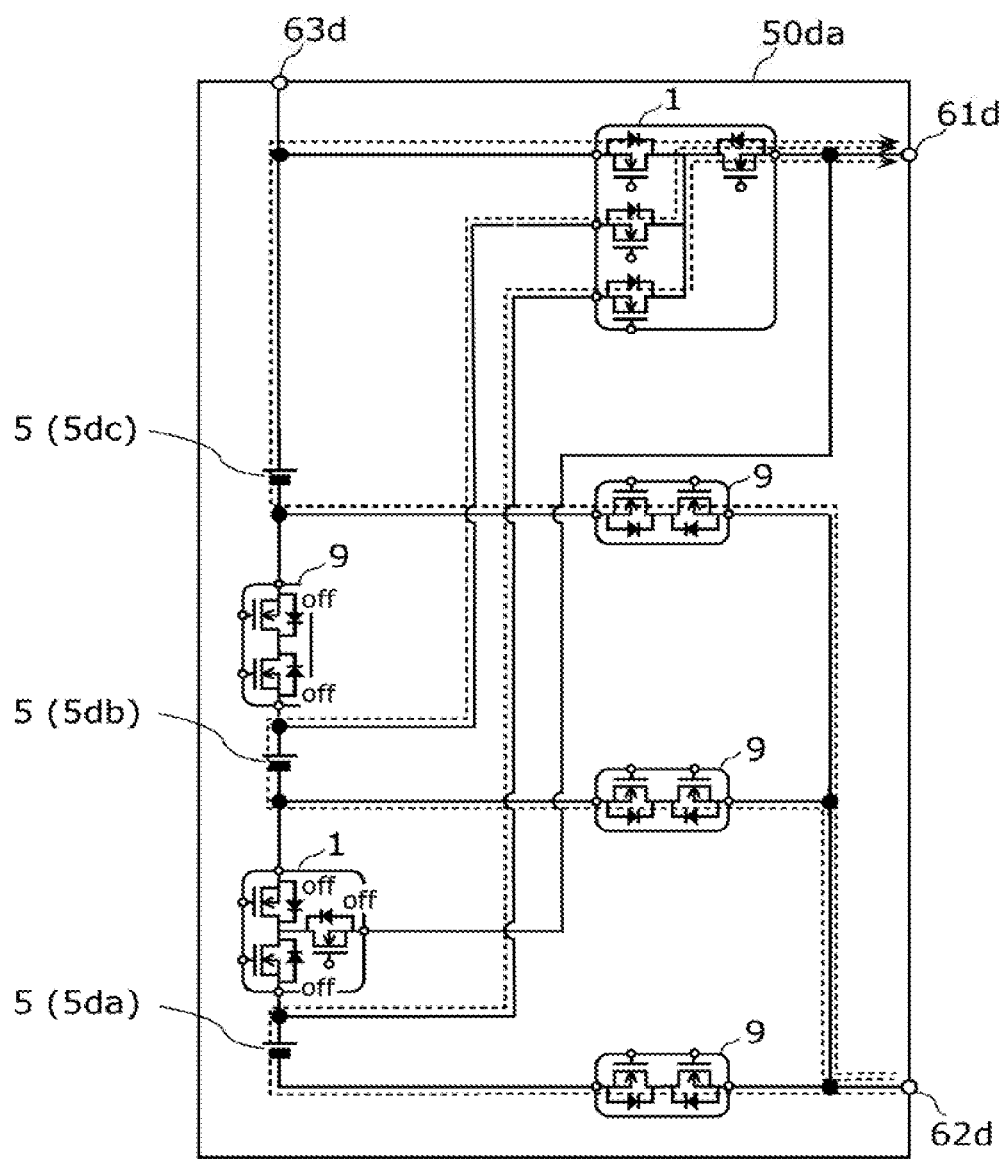
FIG. 41D is a schematic diagram illustrating the battery protection system according to Embodiment 4 charging three battery cells in parallel.

FIG. 41D is a schematic diagram illustrating battery protection circuit 50da discharging three battery cells 5 in parallel.

Embodiment 5

Hereinafter, the battery protection system according to Embodiment 5 will be described.

Figure 42:
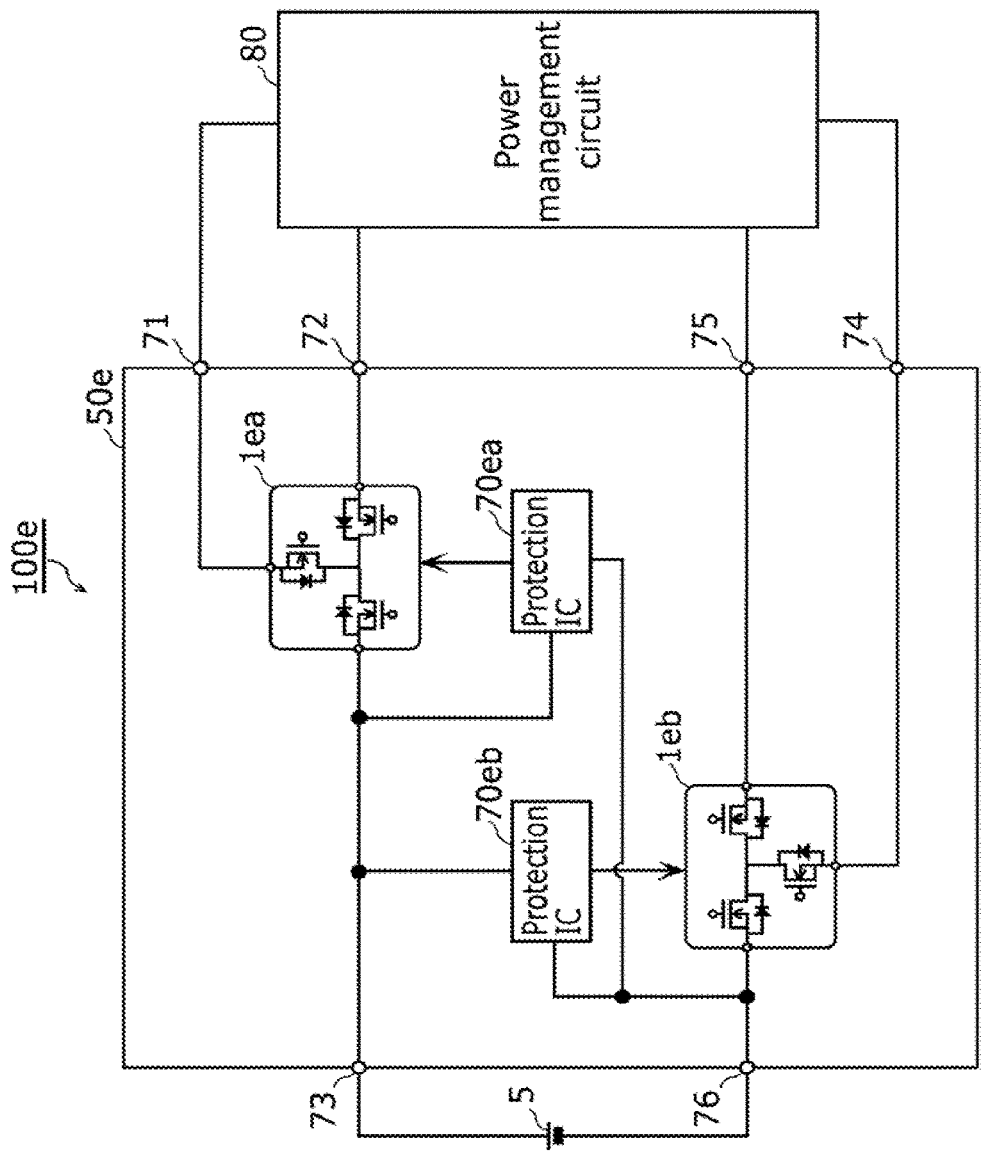
FIG. 42 is a schematic diagram illustrating one example of the configuration of a battery protection system according to Embodiment 5.

FIG. 42 is a circuit diagram illustrating one example of the configuration of battery protection system 100e according to Embodiment 5.

As illustrated in FIG. 42, battery protection system 100e includes battery protection circuit 50e, battery cell 5, and power management circuit 80. Power management circuit 80 includes an IC including a function of supplying power to the functional circuits of a main device (not illustrated in the drawings) connected to the above components. The functional circuits of the main device are, for example, Bluetooth (registered trademark) circuits, Wi-Fi (registered trademark) circuits, LiDAR circuits, and other functional circuits.

Battery protection circuit 50e includes first semiconductor device 1ea, second semiconductor device 1eb, protection IC 70ea, protection IC 70eb, first terminal 71, second terminal 72, third terminal 73, fourth terminal 74, fifth terminal 75, and sixth terminal 76.

Protection IC 70ea controls the charging/discharging of battery cell 5 by controlling first semiconductor device 1ea based on the voltage of battery cell 5.

Protection IC 70eb controls the charging/discharging of battery cell 5 by controlling second semiconductor device 1eb based on the voltage of battery cell 5.

First semiconductor device 1ea is, among semiconductor devices 1 described in detail in Embodiment 1, second specific semiconductor device 1 of the type that includes a specific vertical MOS transistor. First semiconductor device 1ea includes three vertical MOS transistors, one of which is a specific vertical MOS transistor. The conducting state and the non-conducting state of each vertical MOS transistor are controlled by protection IC 70ea. Only the specific vertical MOS transistor may be controlled to be in a conducting state or a non-conducting state by an IC, in power management circuit 80, which accepts the output voltage of the specific vertical MOS transistor.

Second semiconductor device 1eb is, among semiconductor devices 1 described in detail in Embodiment 1, second specific semiconductor device 1 of the type that includes a specific vertical MOS transistor. First semiconductor device 1eb includes three vertical MOS transistors, one of which is a specific vertical MOS transistor. The conducting state and the non-conducting state of each vertical MOS transistor are controlled by protection IC 70eb. Only the specific vertical MOS transistor may be controlled to be in a conducting state or a non-conducting state by an IC, in power management circuit 80, which accepts the output voltage of the specific vertical MOS transistor.

First terminal 71 is connected to the source pad of the specific vertical MOS transistor in first semiconductor device 1ea. Note that a resistor that limits current may be provided between the source pad of the specific vertical MOS transistor in first semiconductor device 1ea and first terminal 71.

Second terminal 72 is connected to the one or more source pads of one of the two vertical MOS transistors excluding the specific vertical MOS transistor among the three vertical MOS transistors included in first semiconductor device 1ea. Note that a resistor that limits current may be provided between the source pad of the specific vertical MOS transistor in first semiconductor device 1ea and second terminal 72.

Third terminal 73 is connected to the one or more source pads of the other of the two vertical MOS transistors excluding the specific vertical MOS transistor among the three vertical MOS transistors included in first semiconductor device 1ea.

Fourth terminal 74 is connected to the source pad of the specific vertical MOS transistor in second semiconductor device 1eb.

Fifth terminal 75 is connected to the one or more source pads of one of the two vertical MOS transistors excluding the specific vertical MOS transistor among the three vertical MOS transistors included in second semiconductor device 1eb.

Sixth terminal 76 is connected to the one or more source pads of the other of the two vertical MOS transistors excluding the specific vertical MOS transistor among the three vertical MOS transistors included in second semiconductor device 1eb.

The positive electrode of battery cell 5 is connected to third terminal 73 and the negative electrode is connected to sixth terminal 76.

Power management circuit 80 is connected to first terminal 71, second terminal 72, fourth terminal 74, and fifth terminal 75. Through second terminal 72 and fifth terminal 75, power management circuit 80 applies charging current to battery cell 5 via battery protection circuit 50e when charging, and receives discharging current from battery cell 5 via battery protection circuit 50e when discharging. Power management circuit 80 also receives enough current through first terminal 71 and fourth terminal 74 to monitor the voltage of battery cell 5.

In Embodiment 5, battery protection system 100e is described as including protection IC 70ea and protection IC 70eb in battery protection circuit 50e, but battery protection system 100e is not necessarily limited to a configuration in which battery protection circuit 50e includes protection IC 70ea and protection IC 70eb.

For example, battery protection system 100e may include protection IC 70ea and protection IC 70eb outside battery protection circuit 50e.

Embodiment 6

Hereinafter, the battery protection system according to Embodiment 6 will be described.

Figure 43:
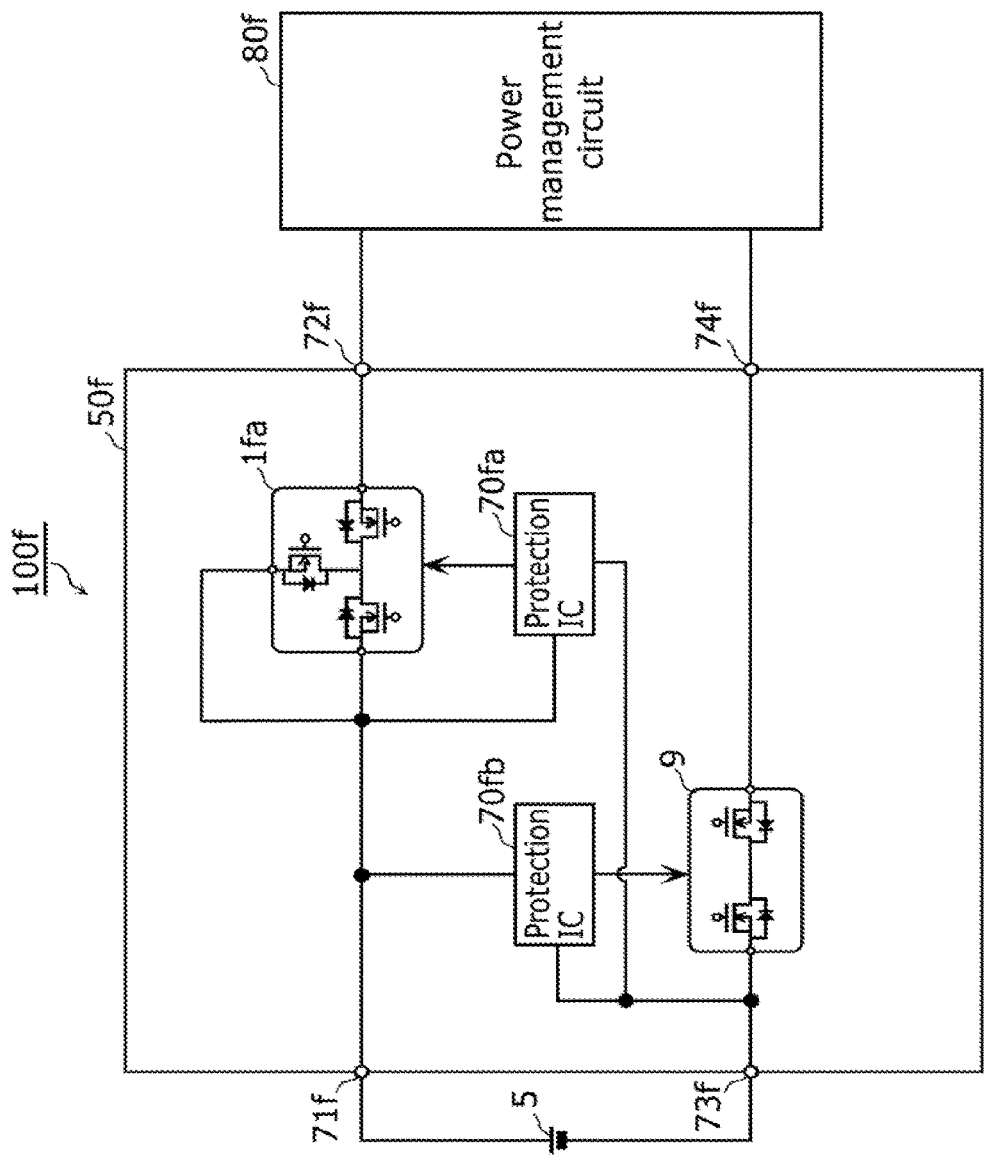
FIG. 43 is a schematic diagram illustrating one example of the configuration of a battery protection system according to Embodiment 6.

FIG. 43 is a circuit diagram illustrating one example of the configuration of battery protection system 100f according to Embodiment 6.

As illustrated in FIG. 43, battery protection system 100f includes battery protection circuit 50f, battery cell 5, and power management circuit 80f. Power management circuit 80f includes an IC including a function of supplying power to the functional circuits of a main device (not illustrated in the drawings) connected to the above components.

The functional circuits of the main device are, for example, Bluetooth (registered trademark) circuits, Wi-Fi (registered trademark) circuits, LiDAR circuits, and other functional circuits.

Battery protection circuit 50f includes first semiconductor device 1fa, semiconductor switching device 9, protection IC 70fa, protection IC 70fb, first terminal 71f, second terminal 72f, third terminal 73f, and fourth terminal 74f.

Protection IC 70fa controls the charging/discharging of battery cell 5 by controlling first semiconductor device 1fa based on the voltage of battery cell 5.

Protection IC 70fb controls the charging/discharging of battery cell 5 by controlling semiconductor switching device 9 based on the voltage of battery cell 5.

First semiconductor device 1fa is, among semiconductor devices 1 described in detail in Embodiment 1, second specific semiconductor device 1 of the type that includes a specific vertical MOS transistor. First semiconductor device 1fa includes three vertical MOS transistors, one of which is a specific vertical MOS transistor. The conducting state and the non-conducting state of each vertical MOS transistor are controlled by protection IC 70fa. The current path through the specific vertical MOS transistor is used to charge battery cell 5 at a smaller current than the normal charging current. The current path through the specific vertical MOS transistor is used to discharge battery cell 5 at a smaller current than the normal discharging current. The smaller current may be adjusted by the conduction resistance of the specific vertical MOS transistor or a resistor included on the source pad side of the specific vertical MOS transistor, or by pulsed control of the voltage applied to the gate pad of the specific vertical MOS transistor.

Protection IC 70fb controls the conducting state and the non-conducting state of each vertical MOS transistor in semiconductor switching device 9.

First terminal 71f is connected to the one or more source pads of one of the two vertical MOS transistors excluding the specific vertical MOS transistor among the three vertical MOS transistors included in first semiconductor device 1fa. Note that a sense resistor or another battery protection circuit may be provided between first terminal 71f and first semiconductor device 1fa.

Second terminal 72f is connected to the one or more source pads of the other of the two vertical MOS transistors excluding the specific vertical MOS transistor among the three vertical MOS transistors included in first semiconductor device 1fa.

Third terminal 73f is connected to the one or more source pads of one of the two vertical MOS transistors included in semiconductor switching device 9.

Fourth terminal 74f is connected to the one or more source pads of the other of the two vertical MOS transistors included in semiconductor switching device 9.

The positive electrode of battery cell 5 is connected to first terminal 71f and the negative electrode is connected to third terminal 73f.

Power management circuit 80f is connected to second terminal 72f and fourth terminal 74f. Through second terminal 72f and fourth terminal 74f, power management circuit 80f applies charging current to battery cell 5 via battery protection circuit 50f when charging, and receives discharging current from battery cell 5 via battery protection circuit 50f when discharging.

In Embodiment 6, battery protection system 100f is described as including protection IC 70fa and protection IC 70fb in battery protection circuit 50f, but battery protection system 100f is not necessarily limited to a configuration in which battery protection circuit 50f includes protection IC 70fa and protection IC 70fb.

For example, battery protection system 100f may include protection IC 70fa and protection IC 70fb outside battery protection circuit 50f.

Embodiment 7

Hereinafter, the battery protection system according to Embodiment 7 will be described.

Figure 44:
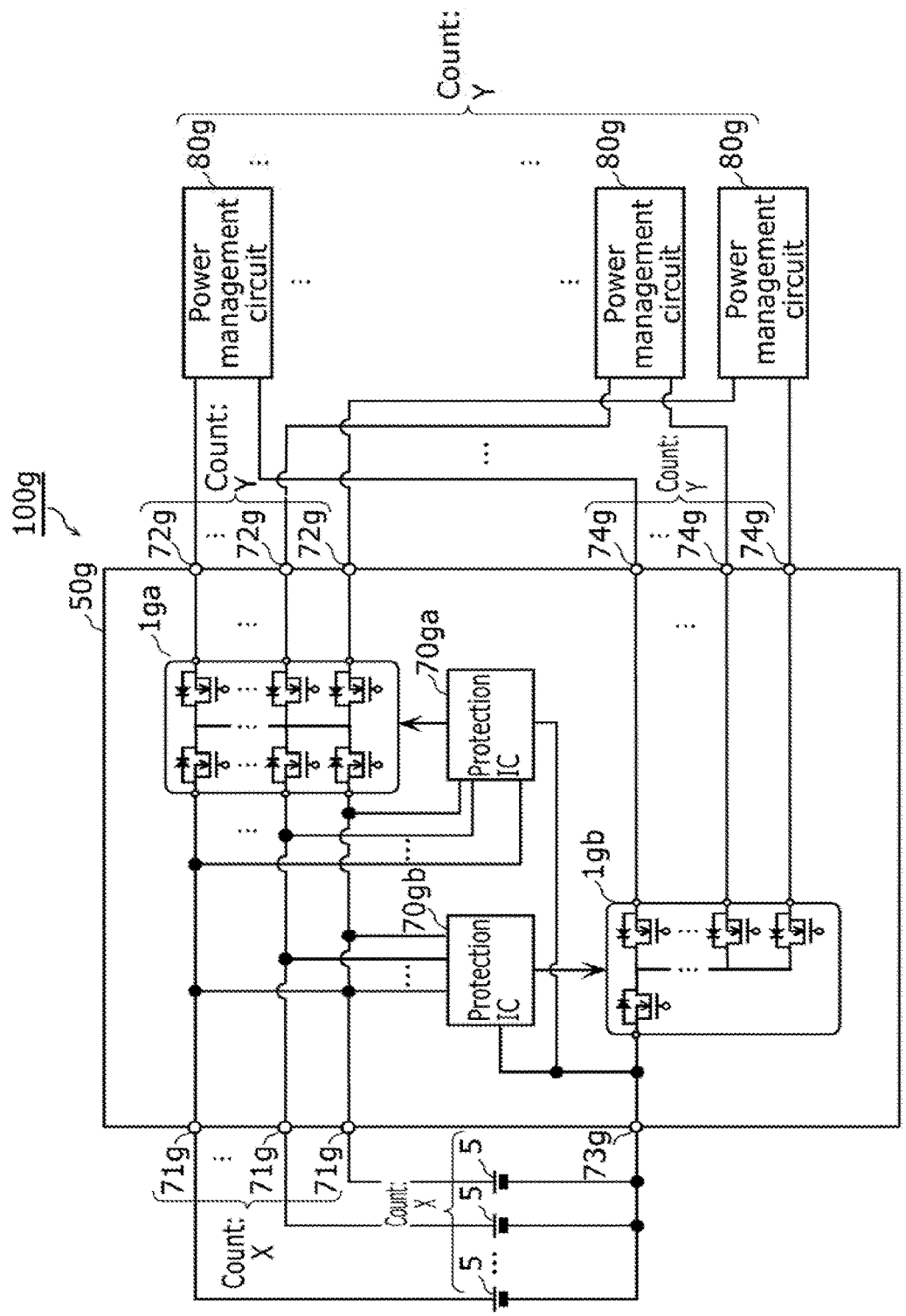
FIG. 44 is a schematic diagram illustrating one example of the configuration of a battery protection system according to Embodiment 7.

FIG. 44 is a circuit diagram illustrating one example of the configuration of battery protection system 100g according to Embodiment 7.

As illustrated in FIG. 44, battery protection system 100g includes battery protection circuit 50g, X (X is an integer greater than or equal to one) battery cells 5 and Y (Y is an integer greater than or equal to two) power management circuits 80g. Power management circuit 80g includes an IC including a function of supplying power to the functional circuits of a main device (not illustrated in the drawings) connected to the above components.

The functional circuits of the main device are, for example, Bluetooth (registered trademark) circuits, Wi-Fi (registered trademark) circuits, LiDAR circuits, and other functional circuits.

Battery protection circuit 50g includes first semiconductor device 1ga, second semiconductor device 1gb, protection IC 70ga, protection IC 70gb, X first terminals 71g, Y second terminals 72g, third terminal 73g, and Y fourth terminals 74g.

Protection IC 70ga controls the charging/discharging of the X battery cells 5 by controlling first semiconductor device 1ga based on the voltages of the X battery cells 5.

Protection IC 70gb controls the charging/discharging of the X battery cells 5 by controlling second semiconductor device 1gb based on the voltages of the X battery cells 5.

First semiconductor device 1ga is semiconductor device 1 described in detail in Embodiment 1, and includes X+Y vertical MOS transistors. The conducting state and the non-conducting state of each vertical MOS transistor are controlled by protection IC 70ga.

Second semiconductor device 1gb is semiconductor device 1 described in detail in Embodiment 1, and includes 1+Y vertical MOS transistors. The conducting state and the non-conducting state of each vertical MOS transistor are controlled by protection IC 70gb.

Each X first terminal 71g is connected to the one or more source pads of a different one of the X vertical MOS transistors among the X+Y vertical MOS transistors included in first semiconductor device 1ga.

Each Y second terminal 72g is connected to the one or more source pads of a different one of the Y vertical MOS transistors excluding the above-described X vertical MOS transistors among the X+Y vertical MOS transistors included in first semiconductor device 1ga.

Third terminal 73g is connected to the one or more source pads of one vertical MOS transistor among the 1+Y vertical MOS transistors included in second semiconductor device 1gb.

Each Y fourth terminal 74g is connected to the one or more source pads of a different one of the Y vertical MOS transistors excluding the above-described one vertical MOS transistor among the 1+Y vertical MOS transistors included in second semiconductor device 1gb.

Each positive electrode of the X battery cells 5 is connected to a different one of the X first terminals 71g, and the negative electrodes of the X battery cells 5 are connected to third terminal 73g.

The Y power management circuits 80g are respectively connected to the Y second terminals 72g and the Y fourth terminals 74g. Through one of the Y second terminals 72g and one of the Y fourth terminals 74g, the Y power management circuits 80g apply charging current to at least one of the X battery cells 5 via battery protection circuit 50g when charging, and receive discharging current from at least one of the X battery cells 5 via battery protection circuit 50g when discharging.

Battery protection system 100g configured as described above can achieve the charging/discharging of the X battery cells 5 utilizing the Y power management circuits 80g.

For example, when the charging current supplied by one power management circuit 80g is 6 A, since a current of (6 A×Y) A will flow through the vertical MOS transistor connected to third terminal 73g among the 1+Y vertical MOS transistors included in semiconductor device 1gb, it is possible to achieve semiconductor device 1gb that avoids localized heat generation and has an optimal size by making the surface area, in a plan view of the semiconductor device, of the vertical MOS transistor connected to third terminal 73g twice the square of (6 A×Y) compared to one vertical MOS transistor connected to fourth terminal 74g among the 1+Y vertical MOS transistors included in semiconductor device 1gb.

When protection IC 70ga or protection IC 70gb detects an abnormality related to the charging or discharging of any of the X battery cells 5, battery protection system 100g configured as described above stops charging or discharging said battery cell 5 by controlling first semiconductor device 1ga or second semiconductor device 1gb.

This protects said battery cell 5 from the adverse effects of an abnormality related to charging or discharging.

In Embodiment 7, battery protection system 100g is described as including protection IC 70ga and protection IC 70gb in battery protection circuit 50g, but battery protection system 100g is not necessarily limited to a configuration in which battery protection circuit 50g includes protection IC 70ga and protection IC 70gb.

For example, battery protection system 100g may include protection IC 70ga and protection IC 70gb outside battery protection circuit 50g.

Embodiment 8

Hereinafter, the power management system according to Embodiment 8 will be described.

Figure 45:
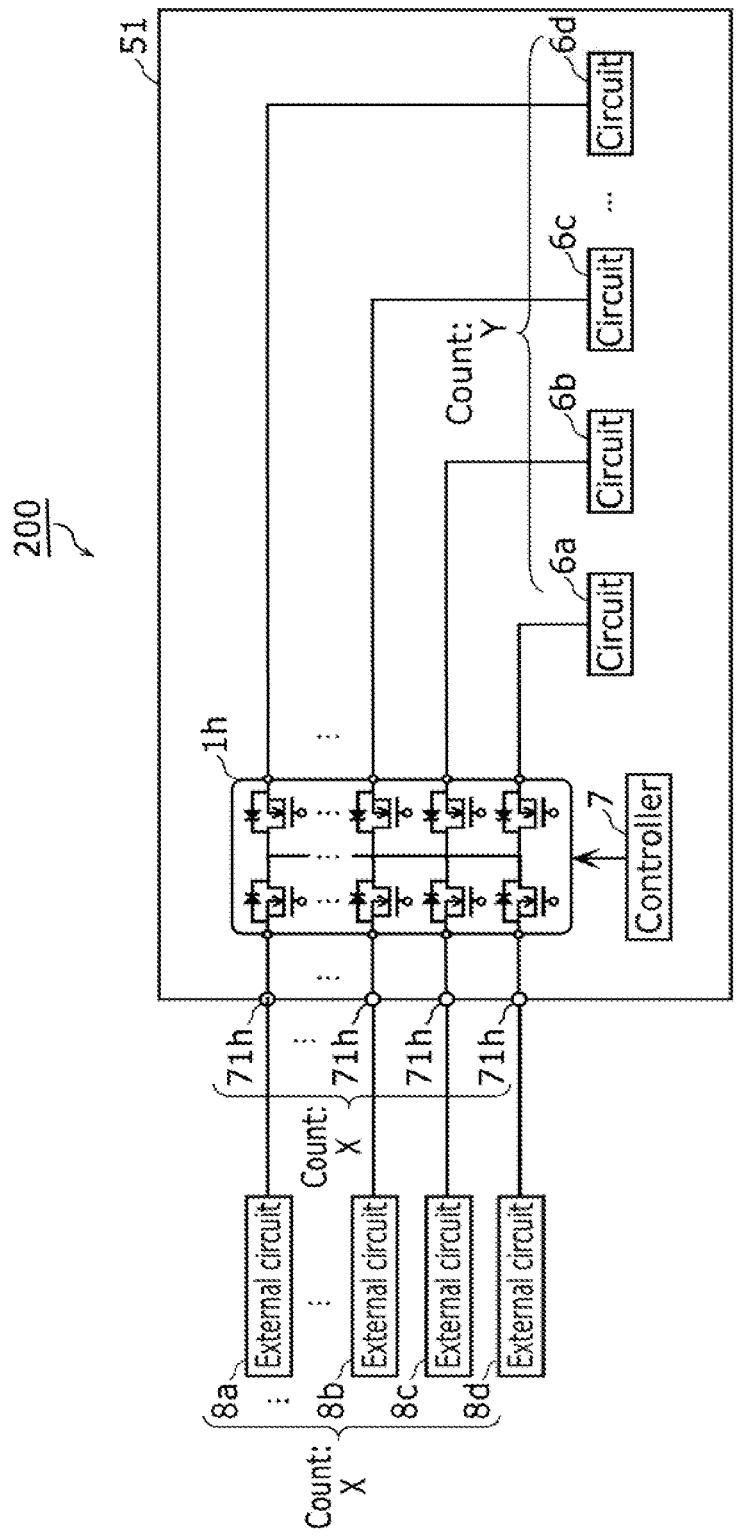
FIG. 45 is a schematic diagram illustrating one example of the configuration of a power management system according to Embodiment 8.

FIG. 45 is a circuit diagram illustrating one example of the configuration of power management system 200 according to Embodiment 8.

As illustrated in FIG. 45, power management system 200 includes power management circuit 51 and X (X is an integer greater than or equal to one) external circuits 8 (corresponding to external circuits 8a through 8d in FIG. 45).

Power management circuit 51 includes first semiconductor device 1h, Y (Y is an integer greater than or equal to two) circuits 6 (corresponding to circuits 6a through 6d in FIG. 45), controller 7, and X terminals 71h.

Controller 7 controls the connection states of the X external circuits 8 and the Y circuits 6 by controlling first semiconductor device 1h.

First semiconductor device 1h is semiconductor device 1 described in detail in Embodiment 1, and includes X+Y vertical MOS transistors. The conducting state and the non-conducting state of each vertical MOS transistor are controlled by controller 7.

Each of the X terminals 71h is connected to the one or more source pads of a different one of the X vertical MOS transistors among the X+Y vertical MOS transistors included in first semiconductor device 1h.

Each of the Y circuits 6 is connected to the one or more source pads of a different one of the Y vertical MOS transistors excluding the above-described X vertical MOS transistors among the X+Y vertical MOS transistors included in first semiconductor device 1h. In Embodiment 8, the one or more source pads of the Y vertical MOS transistors among the X+Y vertical MOS transistors included in first semiconductor device 1h are connected to the respective power supply terminals of the Y circuits 6.

The Y circuits 6 are connected to functional circuits of the main device, such as Bluetooth (registered trademark) circuits, Wi-Fi (registered trademark) circuits, and LiDAR circuits, and to a voltage conversion circuit that converts supplied power into voltage that can recharge a battery cell or a battery cell with a protection function circuit in the main device. Circuits 6 have separate power supplies and are connected together via semiconductor device 1.

The X external circuits 8 are respectively connected to the X terminals 71h. In Embodiment 8, the X external circuits 8 are power-supply source circuits or power-supply destination circuits, and the X terminals 71h are connected to the power supply terminals of the respective X external circuits 8.

Examples of the X external circuits 8 as power-supply source circuits include AC adapters, USB 5 V circuits, wireless chargers and the like, and examples of the X external circuits 8 as power-supply destination circuits include external devices and the like.

Power management system 200 configured as described above can supply power from a power-supply source circuit among the X external circuits 8 to any of the Y circuits 6, and can supply power from any of the Y circuits 6 to a power-supply destination circuit among the X external circuits 8. When external circuit 8 supplies charging current to a battery cell at a chargeable voltage, the charging current is supplied directly to circuit 6 that includes a battery cell with a battery protection function via semiconductor device 1h, thereby achieving highly efficient charging without the power loss that occurs when passing through the voltage conversion circuit. If a charging current is to be supplied by external circuit 8 to a battery cell at a non-chargeable voltage, said voltage is not charged directly to circuit 6 that includes a battery cell with a battery protection function, but supplied to circuit 6 including a function for converting voltage via semiconductor device 1h, and converted to a voltage that can be supplied to the battery cell. After doing so, the charging current is supplied to circuit 6 that includes a battery cell with a battery protection function at a voltage that can be supplied to the battery cell.

In Embodiment 8, power management system 200 is described as including controller 7 in power management circuit 51, but power management system 200 is not necessarily limited to a configuration in which power management circuit 51 includes controller 7.

For example, power management system 200 may include controller 7 outside power management circuit 51.

Embodiment 9

Hereinafter, the power management system according to Embodiment 9 will be described.

Figure 46:
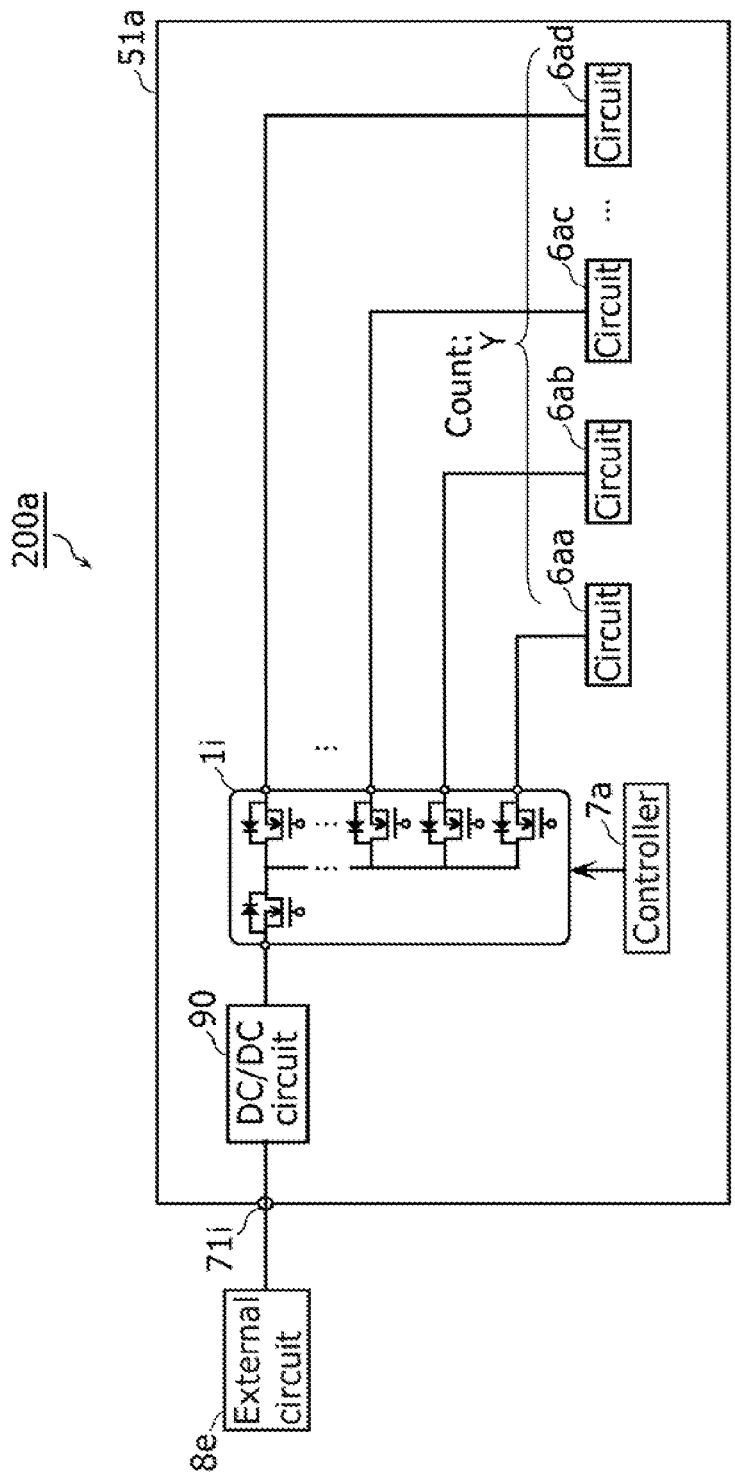
FIG. 46 is a schematic diagram illustrating one example of the configuration of a power management system according to Embodiment 9.

FIG. 46 is a circuit diagram illustrating one example of the configuration of power management system 200a according to Embodiment 9.

As illustrated in FIG. 46, power management system 200a includes power management circuit 51a and power supply circuit 8e.

Power management circuit 51a includes first semiconductor device 1i, Y (Y is an integer greater than or equal to two) circuits 6a (corresponding to circuits 6aa through 6ad in FIG. 46), controller 7a, DC/DC circuit 90, and terminal 71i.

DC/DC circuit 90 converts the output voltage of power supply circuit 8e to a voltage used by the Y circuits 6a.

Controller 7a controls the connection states of DC/DC circuit 90 and the Y circuits 6 by controlling first semiconductor device 1i.

First semiconductor device 1i is semiconductor device 1 described in detail in Embodiment 1, and includes 1+Y vertical MOS transistors. The conducting state and the non-conducting state of each vertical MOS transistor are controlled by controller 7a.

Terminal 71i is connected to one terminal (the voltage input terminal) of DC/DC circuit 90.

The other terminal (the voltage output terminal) of DC/DC circuit 90 is connected to each of the one or more source pads of one vertical MOS transistor among the 1+Y vertical MOS transistors included in first semiconductor device 1i.

Each of the Y circuits 6a is connected to the one or more source pads of a different one of the Y vertical MOS transistors excluding the above-described one vertical MOS transistor among the 1+Y vertical MOS transistors included in first semiconductor device 1i. In Embodiment 9, the one or more source pads of the Y vertical MOS transistors among the 1+Y vertical MOS transistors included in first semiconductor device 1i are connected to the respective power supply terminals of the Y circuits 6a.

The Y circuits 6a are circuits having separate power supplies from other circuits such as Bluetooth (registered trademark) circuits, Wi-Fi (registered trademark) circuits, LiDAR circuits, etc.

Power supply circuit 8e is connected to terminal 71i and outputs voltage to terminal 71i.

Power management system 200a configured as described above can supply the voltage converted by DC/DC circuit 90 only to those Y circuits 6a that need to be supplied with voltage.

This inhibits the consumption of power by the Y circuits 6a.

Additional Comments

Although the semiconductor device, the battery protection circuit, and the power management circuit according to one aspect of the present disclosure have been described above based on Embodiments 1 to 9, the present disclosure is not limited to these embodiments. Various modifications to the embodiments which may be conceived by those skilled in the art, as well as other forms resulting from combinations of one or more elements from different embodiments are also included within the scope of the present disclosure so long as they do not depart from the essence of the present disclosure.

INDUSTRIAL APPLICABILITY

The present disclosure is widely applicable to, for example, semiconductor devices, battery protection circuits, and power management circuits.

The invention claimed is:

1. A semiconductor device of chip-size package type that is face-down mountable, the semiconductor device comprising:

a semiconductor layer; and

N vertical MOS transistors in the semiconductor layer, where N is an integer greater than or equal to three, the N vertical MOS transistors including a first vertical MOS transistor, a second vertical MOS transistor, and a third vertical MOS transistor, wherein each of the N vertical MOS transistors includes, on an upper surface of the semiconductor layer, a gate pad electrically connected to a gate electrode of the vertical MOS transistor and a source pad electrically connected to a source electrode of the vertical MOS transistor, the semiconductor layer includes a semiconductor substrate, the semiconductor substrate functions as a common drain region for the N vertical MOS transistors, in a plan view of the semiconductor layer, the semiconductor device has a rectangular shape including a first outer peripheral side, a second outer peripheral side adjacent to the first outer peripheral side, a third outer peripheral side adjacent to the first outer peripheral side, and a fourth outer peripheral side opposing the first outer peripheral side, in a plan view of the semiconductor layer, the first vertical MOS transistor:

has a polygonal shape including a first side whose entire length faces the first outer peripheral side, a second side whose entire length faces the second outer peripheral side and that is adjacent to the first side, and a third side whose entire length faces the third outer peripheral side and that is adjacent to the first side; and is arranged such that no other vertical MOS transistor among the N vertical MOS transistors is provided between the first outer peripheral side and the first side, between the second outer peripheral side and the second side, or between the third outer peripheral side and the third side, in a plan view of the semiconductor layer, the second vertical MOS transistor:

has a polygonal shape including a fourth side whose entire length faces the second outer peripheral side, and a fifth side whose entire length faces the fourth outer peripheral side and that is adjacent to the fourth side; and is arranged such that no other vertical MOS transistor among the N vertical MOS transistors is provided between the second outer peripheral side and the fourth side or between the fourth outer peripheral side and the fifth side, in a plan view of the semiconductor layer, the third vertical MOS transistor:
  has a polygonal shape including a sixth side whose entire length faces the third outer peripheral side, and a seventh side whose entire length faces the fourth outer peripheral side and that is adjacent to the sixth side; and
  is arranged such that no other vertical MOS transistor among the N vertical MOS transistors is provided between the third outer peripheral side and the sixth side or between the fourth outer peripheral side and the seventh side, for each of the N vertical MOS transistors, a surface area of the vertical MOS transistor in a plan view of the semiconductor layer increases with an increase in a maximum specified current of the vertical MOS transistor, and S1>S2=S3 or S1<S2=S3, where S1 is the surface area of the first vertical MOS transistor in a plan view of the semiconductor layer, S2 is the surface area of the second vertical MOS transistor in a plan view of the semiconductor layer, and S3 is the surface area of the third vertical MOS transistor in a plan view of the semiconductor layer.

2. The semiconductor device according to claim 1, wherein
one of the N vertical MOS transistors is a specific vertical MOS transistor whose maximum specified current is equal to a sum of maximum specified currents of K vertical MOS transistors among the N vertical MOS transistors, where K is an integer greater than or equal to two and less than or equal to N−1.

3. The semiconductor device according to claim 1, wherein
the N vertical MOS transistors include at least one specific vertical MOS transistor the source pad of which consists of a single source pad, and
the gate pad and the single source pad included in each of the at least one specific vertical MOS transistor are circular in a plan view of the semiconductor layer, and among the gate pad and the source pad included in each of the N vertical MOS transistors, there is no gate pad or source pad that is significantly smaller in surface area than either of the gate pad or the single source pad included in each of the at least one specific vertical MOS transistor.

4. The semiconductor device according to claim 1, wherein
the semiconductor device is rectangular in a plan view of the semiconductor layer, and
in each of one or more current paths defined by specifications, a first inlet/outlet vertical MOS transistor, among the N vertical MOS transistors, that is located at an inlet or an outlet of the current path and a second inlet/outlet vertical MOS transistor, among the N vertical MOS transistors, that is located at the outlet or the inlet of the current path are adjacent to each other in a plan view of the semiconductor layer.

5. The semiconductor device according to claim 4, wherein
the semiconductor device has a shape of a non-square rectangle in a plan view of the semiconductor layer, and
in a plan view of the semiconductor layer, in each of the one or more current paths, a boundary line between the first inlet/outlet vertical MOS transistor and the second inlet/outlet vertical MOS transistor is parallel to a longer side of the semiconductor device.

6. The semiconductor device according to claim 4, wherein
in a plan view of the semiconductor layer, in each of the one or more current paths, a boundary line between the first inlet/outlet vertical MOS transistor and the second inlet/outlet vertical MOS transistor is not parallel to any of four sides of the semiconductor device.

7. The semiconductor device according to claim 4, wherein
in a plan view of the semiconductor layer, in each of the one or more current paths, a boundary line between the first inlet/outlet vertical MOS transistor and the second inlet/outlet vertical MOS transistor consists of alternately connected (i) one or more line segments parallel to a first side among four sides of the semiconductor device and (ii) one or more line segments parallel to a second side among the four sides that is orthogonal to the first side.

8. The semiconductor device according to claim 1, wherein
in a first current path defined by specifications, a first inlet/outlet vertical MOS transistor, among the N vertical MOS transistors, that is located at an inlet or an outlet of the first current path and a second inlet/outlet vertical MOS transistor, among the N vertical MOS transistors, that is located at the outlet or the inlet of the first current path are adjacent to each other in a plan view of the semiconductor layer,
in a second current path defined by the specifications, the first inlet/outlet vertical MOS transistor, among the N vertical MOS transistors, that is located at an inlet or an outlet of the second current path and a third inlet/outlet vertical MOS transistor, among the N vertical MOS transistors, that is located at the outlet or the inlet of the second current path are adjacent to each other in a plan view of the semiconductor layer,
in a third current path defined by the specifications, the second inlet/outlet vertical MOS transistor, among the N vertical MOS transistors, that is located at an inlet or an outlet of the third current path and the third inlet/outlet vertical MOS transistor, among the N vertical MOS transistors, that is located at the outlet or the inlet of the third current path are adjacent to each other in a plan view of the semiconductor layer, and
the gate pad of the third inlet/outlet vertical MOS transistor is located on an extension of a boundary line between the first inlet/outlet vertical MOS transistor and the second inlet/outlet vertical MOS transistor.

9. The semiconductor device according to claim 1, wherein
in a first current path defined by specifications, a first inlet/outlet vertical MOS transistor, among the N vertical MOS transistors, that is located at an inlet or an outlet of the first current path and a second inlet/outlet vertical MOS transistor, among the N vertical MOS transistors, that is located at the outlet or the inlet of the first current path are adjacent to each other in a plan view of the semiconductor layer,
in a second current path defined by the specifications, the second inlet/outlet vertical MOS transistor, among the N vertical MOS transistors, that is located at an inlet or an outlet of the second current path and a third inlet/outlet vertical MOS transistor, among the N vertical MOS transistors, that is located at the outlet or the inlet of the second current path are adjacent to each other in a plan view of the semiconductor layer, a current path defined by the first inlet/outlet vertical MOS transistor and the third inlet/outlet vertical MOS transistor does not correspond to any of current paths defined by the specifications, the first inlet/outlet vertical MOS transistor and the third inlet/outlet vertical MOS transistor are adjacent to each other in a plan view of the semiconductor layer, and the gate pad of the third inlet/outlet vertical MOS transistor is located nearer to a boundary line between the first inlet/outlet vertical MOS transistor and the third inlet/outlet vertical MOS transistor than to a boundary line between the second inlet/outlet vertical MOS transistor and the third inlet/outlet vertical MOS transistor.

10. The semiconductor device according to claim 1, further comprising:
a drain pad on an upper surface of the semiconductor layer and electrically connected to the semiconductor substrate.

11. A semiconductor device of chip-size package type that is face-down mountable, the semiconductor device comprising:
a semiconductor layer; and
N vertical MOS transistors in the semiconductor layer, where N is an integer greater than or equal to three, the N vertical MOS transistors including a first vertical MOS transistor, a second vertical MOS transistor, and a third vertical MOS transistor, wherein
each of the N vertical MOS transistors includes, on an upper surface of the semiconductor layer, a gate pad electrically connected to a gate electrode of the vertical MOS transistor and a source pad electrically connected to a source electrode of the vertical MOS transistor,
the semiconductor layer includes a semiconductor substrate,
the semiconductor substrate functions as a common drain region for the N vertical MOS transistors,
in a plan view of the semiconductor layer, the semiconductor device has a rectangular shape including a first outer peripheral side, a second outer peripheral side adjacent to the first outer peripheral side, a third outer peripheral side adjacent to the first outer peripheral side, and a fourth outer peripheral side opposing the first outer peripheral side,
in a plan view of the semiconductor layer, the first vertical MOS transistor:
has a polygonal shape including a first side whose entire length faces the first outer peripheral side, a second side whose entire length faces the second outer peripheral side and that is adjacent to the first side, and a third side whose entire length faces the third outer peripheral side and that is adjacent to the first side; and
is arranged such that no other vertical MOS transistor among the N vertical MOS transistors is provided between the first outer peripheral side and the first side, between the second outer peripheral side and the second side, or between the third outer peripheral side and the third side,
in a plan view of the semiconductor layer, the second vertical MOS transistor:
has a polygonal shape including a fourth side whose entire length faces the second outer peripheral side, and a fifth side whose entire length faces the fourth outer peripheral side and that is adjacent to the fourth side; and is arranged such that no other vertical MOS transistor among the N vertical MOS transistors is provided between the second outer peripheral side and the fourth side or between the fourth outer peripheral side and the fifth side, in a plan view of the semiconductor layer, the third vertical MOS transistor:
has a polygonal shape including a sixth side whose entire length faces the third outer peripheral side, and a seventh side whose entire length faces the fourth outer peripheral side and that is adjacent to the sixth side; and
is arranged such that no other vertical MOS transistor among the N vertical MOS transistors is provided between the third outer peripheral side and the sixth side or between the fourth outer peripheral side and the seventh side, for each of the N vertical MOS transistors, a surface area of the vertical MOS transistor in a plan view of the semiconductor layer increases with an increase in a maximum specified current of the vertical MOS transistor, and $IM1>IM2=IM3$ or $IM1<IM2=IM3$, where IM1 is the maximum specified current of the first vertical MOS transistor, IM2 is the maximum specified current of the second vertical MOS transistor, and IM3 is the maximum specified current of the third vertical MOS transistor.

12. The semiconductor device according to claim 11, wherein $$IM2+IM3=IM1.$$

13. A semiconductor device of chip-size package type that is face-down mountable, the semiconductor device comprising:
a semiconductor layer; and
N vertical transistors in the semiconductor layer, where N is an integer greater than or equal to three, the N vertical transistors including a first vertical transistor, a second vertical transistor, and a third vertical transistor, wherein
each of the N vertical transistors includes, on an upper surface of the semiconductor layer, a control pad electrically connected to a control electrode that controls conduction of the vertical transistor and an external connection pad electrically connected to an external connection electrode through which the vertical transistor receives current from outside or outputs current outside,
the semiconductor layer includes a semiconductor substrate,
the semiconductor substrate includes one main surface on which the N vertical transistors are formed and an other main surface facing away from the one main surface, and the semiconductor device further includes a common electrode common to the N vertical transistors on the other main surface side of the semiconductor substrate,
in a plan view of the semiconductor layer, the semiconductor device has a rectangular shape including a first outer peripheral side, a second outer peripheral side adjacent to the first outer peripheral side, a third outer peripheral side adjacent to the first outer peripheral side, and a fourth outer peripheral side opposing the first outer peripheral side,
in a plan view of the semiconductor layer, the first vertical transistor:

has a polygonal shape including a first side whose entire length faces the first outer peripheral side, a second side whose entire length faces the second outer peripheral side and that is adjacent to the first side, and a third side whose entire length faces the third outer peripheral side and that is adjacent to the first side; and is arranged such that no other vertical transistor among the N vertical transistors is provided between the first outer peripheral side and the first side, between the second outer peripheral side and the second side, or between the third outer peripheral side and the third side, in a plan view of the semiconductor layer, the second vertical transistor:

has a polygonal shape including a fourth side whose entire length faces the second outer peripheral side, and a fifth side whose entire length faces the fourth outer peripheral side and that is adjacent to the fourth side; and is arranged such that no other vertical transistor among the N vertical transistors is provided between the second outer peripheral side and the fourth side or between the fourth outer peripheral side and the fifth side, in a plan view of the semiconductor layer, the third vertical transistor:

has a polygonal shape including a sixth side whose entire length faces the third outer peripheral side, and a seventh side whose entire length faces the fourth outer peripheral side and that is adjacent to the sixth side; and is arranged such that no other vertical transistor among the N vertical transistors is provided between the third outer peripheral side and the sixth side or between the fourth outer peripheral side and the seventh side, for each of the N vertical transistors, a surface area of the vertical transistor in a plan view of the semiconductor layer increases with an increase in a maximum specified current of the vertical transistor, and S1>S2=S3 or S1<S2=S3, where S1 is the surface area of the first vertical transistor in a plan view of the semiconductor layer, S2 is the surface area of the second vertical transistor in a plan view of the semiconductor layer, and S3 is the surface area of the third vertical transistor in a plan view of the semiconductor layer.

14. A semiconductor device of chip-size package type that is face-down mountable, the semiconductor device comprising:

a semiconductor layer; and

N vertical transistors in the semiconductor layer, where N is an integer greater than or equal to three, the N vertical transistors including a first vertical transistor, a second vertical transistor, and a third vertical transistor, wherein each of the N vertical transistors includes, on an upper surface of the semiconductor layer, a control pad electrically connected to a control electrode that controls conduction of the vertical transistor and an external connection pad electrically connected to an external connection electrode through which the vertical transistor receives current from outside or outputs current outside, the semiconductor layer includes a semiconductor substrate, the semiconductor substrate includes one main surface on which the N vertical transistors are formed and an other main surface facing away from the one main surface, and the semiconductor device further includes a common electrode common to the N vertical transistors on the other main surface side of the semiconductor substrate, in a plan view of the semiconductor layer, the semiconductor device has a rectangular shape including a first outer peripheral side, a second outer peripheral side adjacent to the first outer peripheral side, a third outer peripheral side adjacent to the first outer peripheral side, and a fourth outer peripheral side opposing the first outer peripheral side, in a plan view of the semiconductor layer, the first vertical transistor:

has a polygonal shape including a first side whose entire length faces the first outer peripheral side, a second side whose entire length faces the second outer peripheral side and that is adjacent to the first side, and a third side whose entire length faces the third outer peripheral side and that is adjacent to the first side; and is arranged such that no other vertical transistor among the N vertical transistors is provided between the first outer peripheral side and the first side, between the second outer peripheral side and the second side, or between the third outer peripheral side and the third side, in a plan view of the semiconductor layer, the second vertical transistor:

has a polygonal shape including a fourth side whose entire length faces the second outer peripheral side, and a fifth side whose entire length faces the fourth outer peripheral side and that is adjacent to the fourth side; and is arranged such that no other vertical transistor among the N vertical transistors is provided between the second outer peripheral side and the fourth side or between the fourth outer peripheral side and the fifth side, in a plan view of the semiconductor layer, the third vertical transistor:

has a polygonal shape including a sixth side whose entire length faces the third outer peripheral side, and a seventh side whose entire length faces the fourth outer peripheral side and that is adjacent to the sixth side; and is arranged such that no other vertical transistor among the N vertical transistors is provided between the third outer peripheral side and the sixth side or between the fourth outer peripheral side and the seventh side, for each of the N vertical transistors, a surface area of the vertical transistor in a plan view of the semiconductor layer increases with an increase in a maximum specified current of the vertical transistor, and IM1>IM2=IM3 or IM1<IM2=IM3, where IM1 is the maximum specified current of the first vertical transistor, IM2 is the maximum specified current of the second vertical transistor, and IM3 is the maximum specified current of the third vertical transistor.

15. The semiconductor device according to claim 14, wherein $IM2+IM3=IM1$.

* * * * *